(12) United States Patent
Park et al.

(10) Patent No.: US 9,659,940 B2
(45) Date of Patent: May 23, 2017

(54) SEMICONDUCTOR DEVICE AND METHOD OF MANUFACTURING THE SAME

(71) Applicant: Samsung Electronics Co., Ltd., Suwon-si, Gyeonggi-do (KR)

(72) Inventors: Hye-sung Park, Siheung-si (KR); In-seak Hwang, Suwon-si (KR); Bo-un Yoon, Seoul (KR); Byoung-ho Kwon, Hwaseong-si (KR); Jong-hyuk Park, Hwaseong-si (KR); Jae-hee Kim, Yongin-si (KR); Myung-jae Jang, Busan (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/202,874

(22) Filed: Jul. 6, 2016

(65) Prior Publication Data

US 2017/0077103 A1 Mar. 16, 2017

(30) Foreign Application Priority Data

Sep. 10, 2015 (KR) .................. 10-2015-0128565

(51) Int. Cl.
*H01L 21/20* (2006.01)
*H01L 27/108* (2006.01)

(52) U.S. Cl.
CPC .. *H01L 27/10852* (2013.01); *H01L 27/10814* (2013.01); *H01L 27/10897* (2013.01)

(58) Field of Classification Search
None
See application file for complete search history.

(56) References Cited

U.S. PATENT DOCUMENTS

| 5,780,333 | A | 7/1998 | Kim |
| 6,461,941 | B2 | 10/2002 | Kim |
| 7,598,180 | B2 | 10/2009 | Park et al. |
| 9,230,793 | B2 * | 1/2016 | Sung ................ H01L 21/02038 |
| 2002/0045337 | A1 * | 4/2002 | Nam ................ H01L 21/31053 438/631 |

(Continued)

FOREIGN PATENT DOCUMENTS

| KR | 10-2001-0063711 A | 7/2001 |
| KR | 10-2006-0011734 A | 2/2006 |

(Continued)

*Primary Examiner* — Angel Roman
(74) *Attorney, Agent, or Firm* — Myers Bigel, P.A.

(57) ABSTRACT

A method of manufacturing a semiconductor device includes: preparing a wafer in which a first cell area and a second cell area are defined; forming a bottom electrode structure in the first cell area and a dummy structure located in the second cell area; and sequentially forming a dielectric layer and a top electrode on the bottom electrode structure and the dummy structure, wherein the bottom electrode structure includes a plurality of bottom electrodes extending in a first direction in the first cell area and first and second supporters to support the plurality of bottom electrodes, wherein the dummy structure includes a first mold film, a first supporter film, a second mold film, and a second supporter film that are sequentially formed to cover the second cell area, and the second supporter and the second supporter film are at a same level relative to the wafer.

20 Claims, 89 Drawing Sheets

(56) References Cited

U.S. PATENT DOCUMENTS

| | | | |
|---|---|---|---|
| 2009/0263968 A1* | 10/2009 | Komeda | H01L 21/02087 438/669 |
| 2011/0030774 A1* | 2/2011 | Cornfeld | H01L 31/022441 136/256 |
| 2014/0167992 A1 | 6/2014 | Aruga | |
| 2014/0291806 A1 | 10/2014 | Huang et al. | |
| 2015/0028451 A1 | 1/2015 | Watanabe | |

FOREIGN PATENT DOCUMENTS

| | | |
|---|---|---|
| KR | 10-0645459 B1 | 11/2006 |
| KR | 10-0687871 B1 | 2/2007 |
| KR | 10-2007-0071615 A | 7/2007 |
| KR | 10-2008-0044607 A | 5/2008 |
| KR | 10-2009-0076137 A | 7/2009 |
| KR | 10-0955940 B1 | 5/2010 |

* cited by examiner

SEMICONDUCTOR DEVICE AND METHOD OF MANUFACTURING THE SAME

CROSS-REFERENCE TO RELATED APPLICATION

This application claims the benefit of Korean Patent Application No. 10-2015-0128565, filed on Sep. 10, 2015, in the Korean Intellectual Property Office, the disclosure of which is incorporated herein in its entirety by reference.

BACKGROUND

The inventive concept relates to a semiconductor device and a method of manufacturing the semiconductor device, and more particularly, to a semiconductor device including a capacitor and a method of manufacturing the semiconductor device.

As the integration degree of semiconductor devices such as dynamic random access memories (DRAMs) has recently increased, to increase electrostatic capacity, capacitors may be formed so as to have a greater height and with a bottom electrode having a three-dimensional structure. In this case, a technique of preventing falling or tearing of a capacitor, which may occur in an edge area of a wafer, and of improving a process variance at the same time may be desired.

SUMMARY

The inventive concept provides a semiconductor device and a method of manufacturing the semiconductor device, whereby falling or tearing of a capacitor, which may occur in an edge area of a wafer may be prevented or the likelihood of such falling and/or tearing reduced and a process variance may be improved.

According to an aspect of the inventive concept, there is provided a method of manufacturing a semiconductor device, the method including: preparing a wafer in which a chip area having a first cell area and a first peripheral area and an edge area having a second cell area and a second peripheral area are defined; forming a bottom electrode structure in the first cell area and a dummy structure located in the second cell area; and sequentially forming a dielectric layer and a top electrode on the bottom electrode structure and the dummy structure, wherein the bottom electrode structure includes a plurality of bottom electrodes extending in a first direction perpendicular to a top surface of the wafer in the first cell area of the wafer and first and second supporters extending in parallel with the top surface of the wafer to support the plurality of bottom electrodes, wherein the dummy structure includes a first mold film, a first supporter film, a second mold film, and a second supporter film that are sequentially formed to cover the second cell area of the wafer, and the second supporter and the second supporter film are at a same level relative to the wafer. A length of the bottom electrode structure in the first direction may be approximately the same as a length of the dummy structure in the first direction.

The forming of the bottom electrode structure and the dummy structure may include: sequentially forming a first mold layer, a first supporter layer, a second mold layer, and a second supporter layer on the chip area and the edge area; forming a hole pattern in the first cell area by etching the first mold layer, the first supporter layer, the second mold layer, and the second supporter layer; and forming a bottom electrode in the hole pattern.

The forming of the hole pattern in the first cell area may include: forming at least one mask layer on the second supporter layer in the chip area and the edge area; forming a first preliminary pattern layer on the at least one mask layer in the chip area and the edge area; forming a first line pattern extending in a second direction in parallel with the top surface of the wafer by patterning the first preliminary pattern layer in the first and second cell areas; forming a second preliminary pattern layer on the first line pattern in the chip area and the edge area; forming an etching stopper layer covering the first peripheral area, the second cell area, and the second peripheral area; forming a second line pattern extending in a third direction crossing the second direction by patterning the second preliminary pattern layer in the first cell area; and forming a hole pattern mask layer by etching the at least one mask layer in the first cell area by using the first and second line patterns in the first cell area and the etching stopper layer in the first peripheral area, the second cell area, and the second peripheral area as an etching mask The second supporter located in the first cell area and the second supporter film in the second cell area may be formed by etching the second supporter layer using the hole pattern mask layer as an etching mask.

The etching stopper layer may include a first etching stopper layer covering the first peripheral area and a second etching stopper layer covering the second cell area and the second peripheral area.

According to another aspect of the inventive concept, there is provided a method of manufacturing a semiconductor device, the method including: preparing a wafer in which a chip area having a first cell area and a first peripheral area and an edge area having a second cell area and a second peripheral area are defined; sequentially forming a first mold layer, a first supporter layer, a second mold layer, and a second supporter layer on the chip area and the edge area; forming a plurality of bottom electrodes passing through the first mold layer, the first supporter layer, the second mold layer, and the second supporter layer in the first cell area; forming a second supporter in the first cell area and a second supporter film in the second cell area by patterning the second supporter layer; removing the second mold layer from the first cell area, the first peripheral area, and the second peripheral area; forming a first supporter in the first cell area and a first supporter film in the second cell area by patterning the first supporter layer; and removing the first mold layer from the first cell area, the first peripheral area, and the second peripheral area.

The method may further include, between the forming of the plurality of bottom electrodes and the forming of the second supporter and the second supporter film: exposing the second mold layer by removing the second supporter layer from the first and second peripheral areas; forming a third mold layer covering the second mold layer in the first and second peripheral areas; forming a carbon-containing layer and a rework layer sequentially on the second supporter layer in the first and second cell areas and the third mold layer in the first and second peripheral areas; forming an etching stopper layer covering the rework layer in the edge area; and forming a supporter mask pattern on the rework layer in the first cell area, wherein the forming of the second supporter is performed by etching the rework layer, the carbon-containing layer, and the second supporter layer by using the supporter mask pattern and the etching stopper layer as an etching mask. A top surface of the second supporter film relative to the wafer may include a recess portion.

The method may further include, after the forming of the plurality of bottom electrodes: forming a first carbon-containing layer and a first rework layer sequentially on the second supporter layer in the chip area and a second carbon-containing layer and a second rework layer sequentially on the second supporter layer in the edge area; and forming a supporter mask pattern on the first rework layer in the first cell area and the second rework layer in the second cell area, wherein a top surface of the first carbon-containing layer is at a higher level than a top surface of the second carbon-containing layer relative to the wafer, and the forming of the second supporter and the second supporter film is performed by etching the second supporter layer by using the supporter mask pattern as an etching mask.

The forming of the first carbon-containing layer and the second carbon-containing layer may include: forming a carbon-containing layer on the second supporter layer in the chip area and the edge area; and removing a portion of an upper portion of the carbon-containing layer from the edge area. The supporter mask pattern of the first cell area includes a plurality of opening portions, and the supporter mask pattern of the second cell area covers the entire second cell area without an opening.

The forming of the supporter mask pattern may include: forming a supporter mask layer on the first rework layer of the chip area and the second rework layer of the edge area; forming a blank mask layer covering the supporter mask layer in the chip area; forming a cell close mask layer covering each of the blank mask layer of the first cell area and the supporter mask layer of the second cell area; forming a preliminary supporter mask pattern by removing the supporter mask layer of the second peripheral area by using the blank mask layer and the cell close mask layer as an etching mask; and forming the supporter mask pattern by patterning the preliminary supporter mask pattern.

The forming of the supporter mask pattern may include: forming a negative tone development (NTD) resist covering the preliminary supporter mask pattern and the second rework layer in the second peripheral area; exposing a portion of the NTD resist of the first cell area; exposing the entire NTD resist of the edge area; forming an NTD mask pattern by developing the NTD resist; and forming the supporter mask pattern by etching the preliminary supporter mask pattern by using the NTD mask pattern as an etching mask.

The method may further include, before the forming of the supporter mask pattern, forming an etching stopper layer covering the second rework layer in the second cell area.

According to another aspect of the inventive concept a method of manufacturing a semiconductor device comprises forming a first cell area, a second cell area, and a peripheral area in a wafer, the peripheral area separating the first cell area from the second cell area, forming a bottom electrode structure in the first cell area, which comprises forming a bottom electrode and forming a first supporter extending from the bottom electrode towards the peripheral area, and forming a dummy structure in the second cell area, which comprises forming a first mold film and forming a first supporter film on the first mold film.

Forming the bottom electrode structure may comprise forming a second supporter extending from the bottom electrode towards the peripheral area and forming the dummy structure may comprise forming a second mold film on the first supporter film and forming a second supporter film on the second mold film.

The method may further include forming a dielectric layer to cover the bottom electrode structure in its entirety and the second supporter film and forming a top electrode on the dielectric layer in the first cell area.

A height of the bottom electrode structure relative to the wafer and a height of the dummy structure relative to the wafer may be about the same.

Forming the first supporter and forming the first supporter film may comprise forming a first supporter layer in both the first cell area and the second cell area and patterning the first supporter layer in the first cell area to form the first supporter. Forming the second supporter and forming the second supporter film may comprise forming a second supporter layer in both the first cell area and the second cell area and patterning the second supporter layer in the first cell area to form the second supporter.

It is noted that aspects of the inventive concepts described with respect to one embodiment, may be incorporated in a different embodiment although not specifically described relative thereto. That is, all embodiments and/or features of any embodiment can be combined in any way and/or combination. These and other aspects of the inventive concepts are explained in detail in the specification set forth below.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1A:
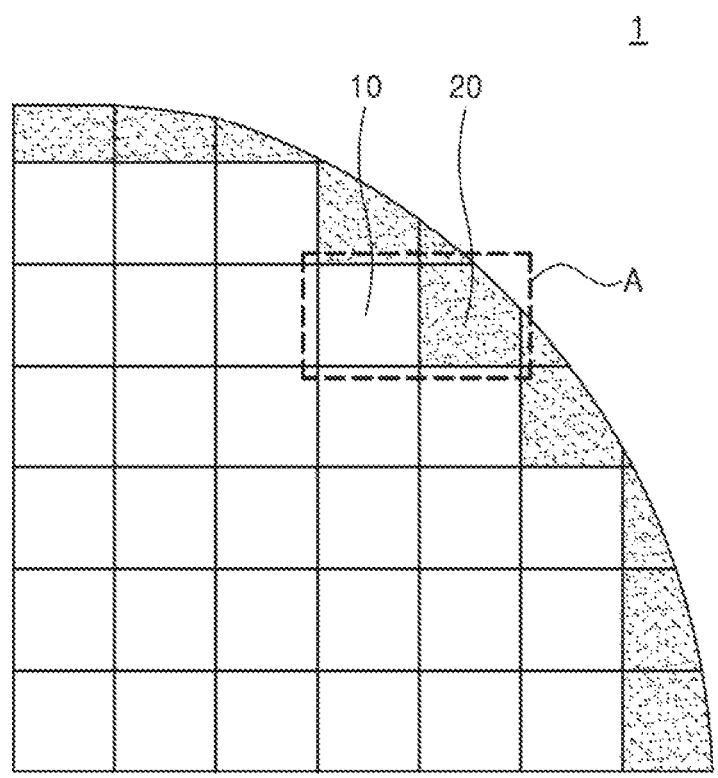
FIG. 1A is an exemplary plan view of a partial area of a wafer according to an exemplary embodiment of the inventive concept.

Hereinafter, the inventive concept will be described more fully with reference to the accompanying drawings, in which exemplary embodiments of the inventive concept are shown. In the drawings, like elements are labeled like reference numerals and repeated description thereof will be omitted. This inventive concept may, however, be embodied in many different forms and should not be construed as limited to the exemplary embodiments set forth herein. Rather, these embodiments are provided so that this disclosure will be thorough and complete, and will fully convey the scope of the inventive concept to those of ordinary skill in the art.

In the present description, terms such as 'first', 'second', etc. are used to describe various members, areas, layers, regions, and/or components. However, it is obvious that the members, areas, layers, regions, and/or components should not be defined by these terms. Also, these terms should not be construed as indicating any particular order or whether an element is at an upper or lower element or a superior or inferior element, and are used only for distinguishing one member, area, layer, region, or component from another member, area, layer, region, or component. Thus, a first member, area, layer, region, or component which will be described may also refer to a second member, area, layer, region, or component, without departing from the teaching of the inventive concept. For example, without departing from the scope of the inventive concept, a first component may be referred to as a second component, and similarly, a second component may be referred to as a first component. Terms such as "top," "bottom," "upper," "lower," "above," "below," and the like are used herein to describe the relative positions of elements or features. For example, when an upper part of a drawing is referred to as a "top" and a lower part of a drawing as a "bottom" for the sake of convenience, in practice, the "top" may also be called a "bottom" and the "bottom" a "top" without departing from the teachings of the inventive concept.

Furthermore, throughout this disclosure, directional terms such as "upper," "intermediate," "lower," and the like may be used herein to describe the relationship of one element or feature with another, and the inventive concept should not be limited by these terms. Accordingly, these terms such as "upper," "intermediate," "lower," and the like may be replaced by other terms such as "first," "second," "third," and the like to describe the elements and features.

As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless defined differently, all terms used in the description including technical and scientific terms have the same meanings as generally understood by those of ordinary skill in the art. Terms commonly used and defined in dictionaries should be construed as having the same meanings as in the associated technical context of the inventive concept, and unless defined apparently in the description, these terms are not ideally or excessively construed as having formal meanings.

When an embodiment is implementable in another manner, a predetermined process order may be different from a described one. For example, two processes that are consecutively described may be substantially simultaneously performed or may be performed in an opposite order to the described order.

In the drawings, for example, according to the manufacturing techniques and/or tolerances, shapes of the illustrated elements may be modified. Thus, the inventive concept should not be construed as being limited to the embodiments set forth herein, and should include, for example, variations in the shapes caused during manufacturing.

As used herein, the term "and/or" includes any and all combinations of one or more of the associated listed items.

Expressions such as "at least one of," when preceding a list of elements, modify the entire list of elements and do not modify the individual elements of the list.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 1B:
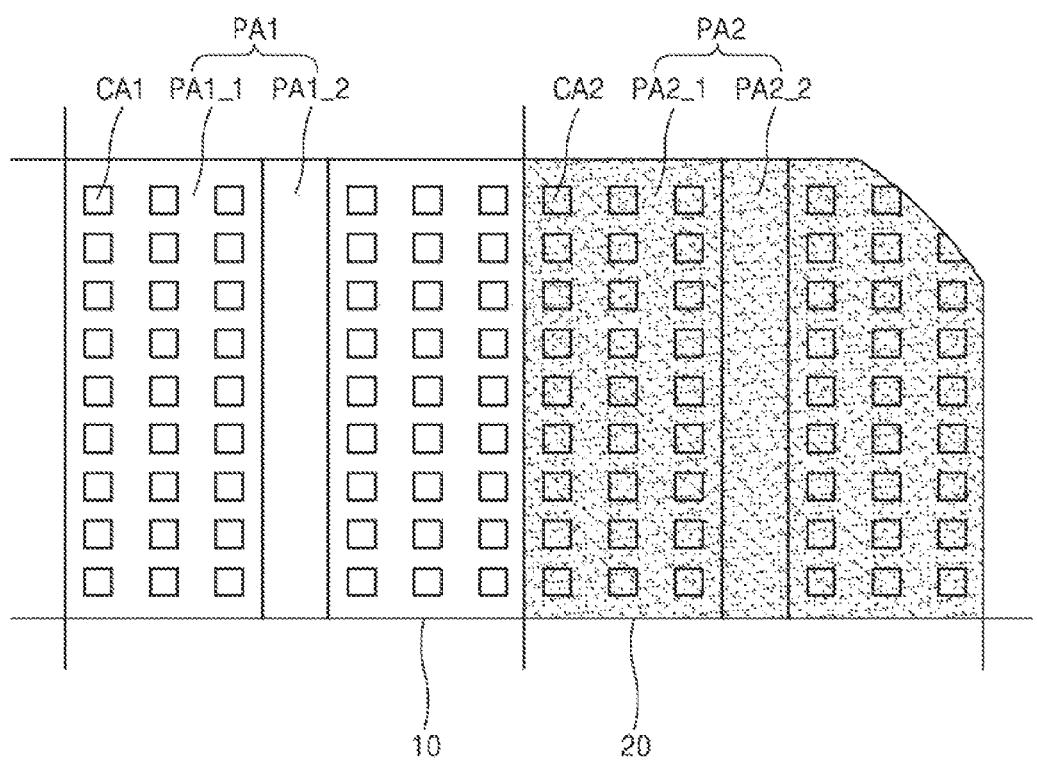
FIG. 1B a partial expanded view of an area A of FIG. 1, which is an exemplary plan view of a layout of a chip area and an edge area.

FIG. 1A is an exemplary plan view of a partial area of a wafer 1 according to an exemplary embodiment of the inventive concept. FIG. 1B a partial expanded view of an area A of FIG. 1, which is an exemplary plan view of a layout of a chip area 10 and an edge area 20.

Referring to FIGS. 1A and 1B, the wafer 1 may include a plurality of chip areas 10 and a plurality of edge areas 20 located at edges of the wafer 1 to surround the plurality of chip areas 10.

Each of the plurality of chip areas 10 may include a first cell area CA1 and a first peripheral area PA1, and the first peripheral area PA1 may include a first core area PA1_1 and a first peri-area PA1_2.

Each of the plurality of edge areas 20 may include a second cell area CA2 and a second peripheral area PA2, and the second peripheral area PA2 may include a second core area PA2_1 and a second peri-area PA2_2.

The shape and layout of the first and second cell areas CA1 and CA2 and the first and second peripheral areas PA1 and PA2 illustrated in FIG. 1B are exemplary only, and may be modified in various manners within the scope of the present inventive concept.

Figure 2:
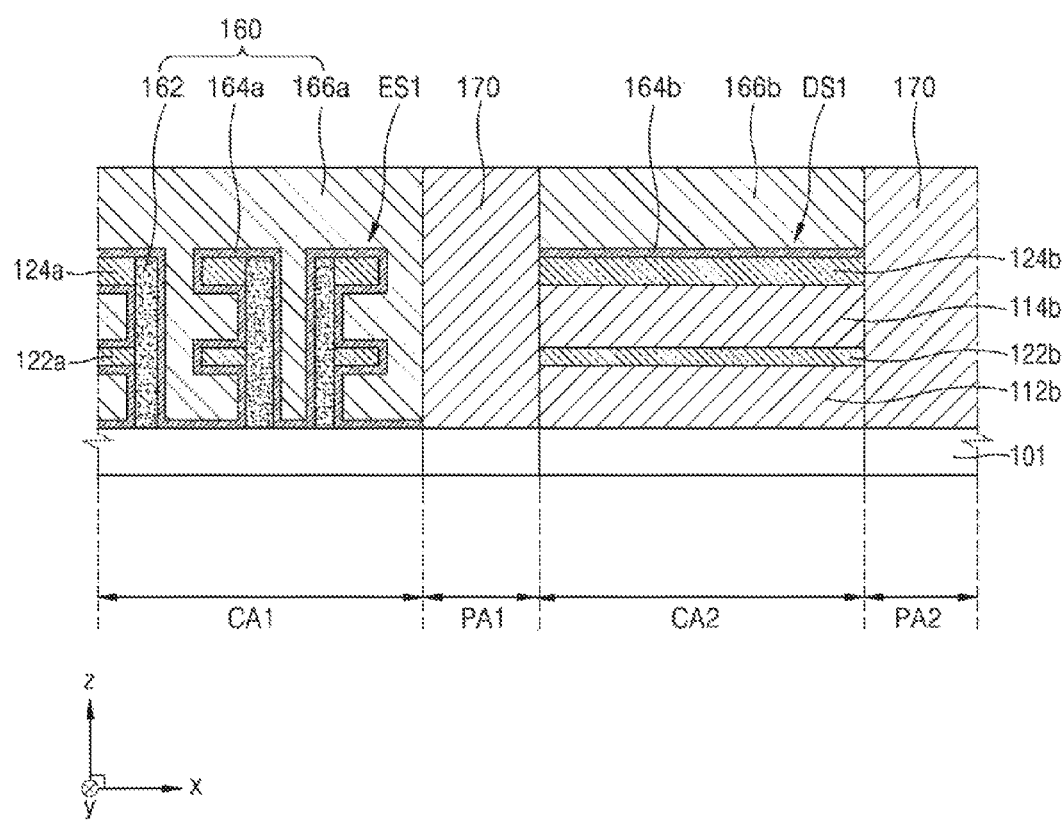
FIG. 2 is an exemplary cross-sectional view of a partial area of a semiconductor device according to an exemplary embodiment of the inventive concept.

FIG. 2 is an exemplary cross-sectional view of a partial area of a semiconductor device 100 according to an exemplary embodiment of the inventive concept. FIG. 2 shows a cross-sectional view of each of the first cell area CA1, the first peripheral area PA1, the second cell area CA2, and the second peripheral area PA2 of FIG. 1B.

Referring to FIG. 2, the semiconductor device 100 may include a bottom structure 101 formed in the first and second cell areas CA1 and CA2 and the first and second peripheral areas PA1 and PA2.

While not illustrated in the drawings, the bottom structure 101 may include a base substrate, an active area formed on the base substrate, a device isolation layer defining the active area, a source/drain area, a word line, a bit line, and a contact area or the like.

In addition, unit elements (not shown) use to form a semiconductor device, such as active elements or passive elements of various types and an interlayer insulation layer (not shown) covering the unit elements may be formed in the bottom structure 101. The unit elements may be, for example, cell transistors, such as a dynamic random access memory (DRAM) or a flash memory. The cell transistors may be a DRAM memory cell transistor having a unit cell size of $6F^2$ or $4F^2$ or the like but is not limited thereto.

The base substrate may include silicon (Si), such as crystalline Si, polycrystalline Si or amorphous Si. According to another exemplary embodiment, the base substrate may include a semiconductor, such as germanium (Ge) or a compound semiconductor, such as silicon germanium (SiGE), silicon carbide (SiC), gallium arsenide (GaAS), indium arsenide (InAs), or indium phosphide (InP).

The contact area may connect the source/drain region formed in the base substrate and a capacitor 160. The contact area may be formed of, for example, polysilicon.

In cell areas of each of the chip areas 10 (see FIG. 1B), that is, in the first cell area CA1, a bottom electrode structure ES1 may include bottom electrodes 162 and first and second supporters 122a and 124a, a gate dielectric layer 164a covering the bottom electrode structure ES1, and a top electrode 166a, which may be formed on the bottom structure 101. The capacitor 160 may include the bottom electrodes 162, the gate dielectric layer 164a, and the top electrode 166a.

In some exemplary embodiments, each of the bottom electrodes 162 may be connected to the contact area (not shown) formed in the bottom structure 101. While the bottom electrodes 162 according to the present exemplary embodiment are illustrated as having a pillar shape, the exemplary embodiments are not limited thereto. For example, the bottom electrodes 162 may have a cylindrical shape.

The gate dielectric layer 164a may be formed to cover the bottom electrodes 162 and the first and second supporters 122a and 124a. In some exemplary embodiments, the gate dielectric layer 164a may include a silicon oxide or a high-k dielectric material. In some other exemplary embodiments, the gate dielectric layer 164a may include a complex layer having a double-layer structure including, for example, a silicon oxide layer and a silicon nitride layer, or may include a silicon oxide layer having a nitrided surface. The high-k dielectric material may include at least one of aluminum oxide ($AlO_x$), tantalum oxide ($Ta_xO_y$), titanium oxide ($TiO_x$), yttrium oxide ($Y_xO_y$), zirconium oxide ($ZrO_x$), zirconium silicon oxide ($ZrSi_xO_y$), hafnium oxide ($HfO_x$), hafnium silicon oxide ($HfSi_xO_y$), lanthanum oxide ($La_xO_y$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_xO_y$).

The top electrode 166a may be formed to cover the bottom electrode structure ES1 including the bottom electrodes 162 and the first and second supporters 122a and 124a and the gate dielectric layer 164a. The top electrode 166a may include, for example, titanium, titanium nitride, tantalum nitride, platinum, tungsten, doped polysilicon, or doped silicon germanium. In some exemplary embodiments, the top electrode 166a may be formed of the same material as the bottom electrodes 162, but is not limited thereto.

The first and second supporters 122a and 124a may support the bottom electrodes 162 so that the bottom electrodes 162 formed on the bottom structure 101 do not fall down. In some exemplary embodiments, the first and second supporters 122a and 124a may include a material, such as a silicon nitride, a tantalum oxide, and a titanium oxide.

In cell areas of each of the plurality of edge areas 20 (see FIG. 1B), that is, in the second cell area CA2, a dummy structure DS1 in which a first mold film 112b, a first supporter film 122b, and a second mold film 114b, and a second supporter film 124b are sequentially stacked may be formed on the bottom structure 101. A dielectric layer 164b and a top electrode 166b may be sequentially formed on the second supporter film 124b of the dummy structure DS1. The dielectric layer 164b and the top electrode 166b may be respectively formed of the same materials as the gate dielectric layer 164a and the top electrode 166a formed in the first cell area CA1.

The first supporter 122a of the first cell area CA1 and the first supporter film 122b of the second cell area CA2 may be formed by patterning a first supporter layer 122, which will be described below with reference to FIG. 3B. Also, the second supporter 124a of the first cell area CA1 and the second supporter film 124b of the second cell area CA2 may be formed by patterning a second supporter layer 124, which will be described below with reference to FIG. 3B.

Accordingly, the first supporter film 122b and the second supporter film 124b may be at substantially the same level as the first supporter 122a and the second supporter 124a, respectively. Also, the first supporter film 122b and the second supporter film 124b may be respectively formed of the same materials as the first supporter 122a and the second supporter 124a formed in the first cell area CA1.

The first mold film 112b and the second mold film 114b may be formed of materials having a different etching selectivity with respect to the first and second supporter films 122b and 124b. For example, when the first and second supporter films 122b and 124b are formed of silicon nitride, the first and second mold films 112b and 114b may be formed of silicon oxide.

An interlayer insulation layer 170 may be formed on the bottom structure 101 in peripheral areas of each of the plurality of chip areas 10 (see FIG. 1B) and each of the plurality of edge areas 20 (see FIG. 1B), that is, in the first peripheral area PA1 and the second peripheral area PA2. The interlayer insulation layer 170 may include, for example, a silicon oxide, but is not limited thereto.

Figure 3A:
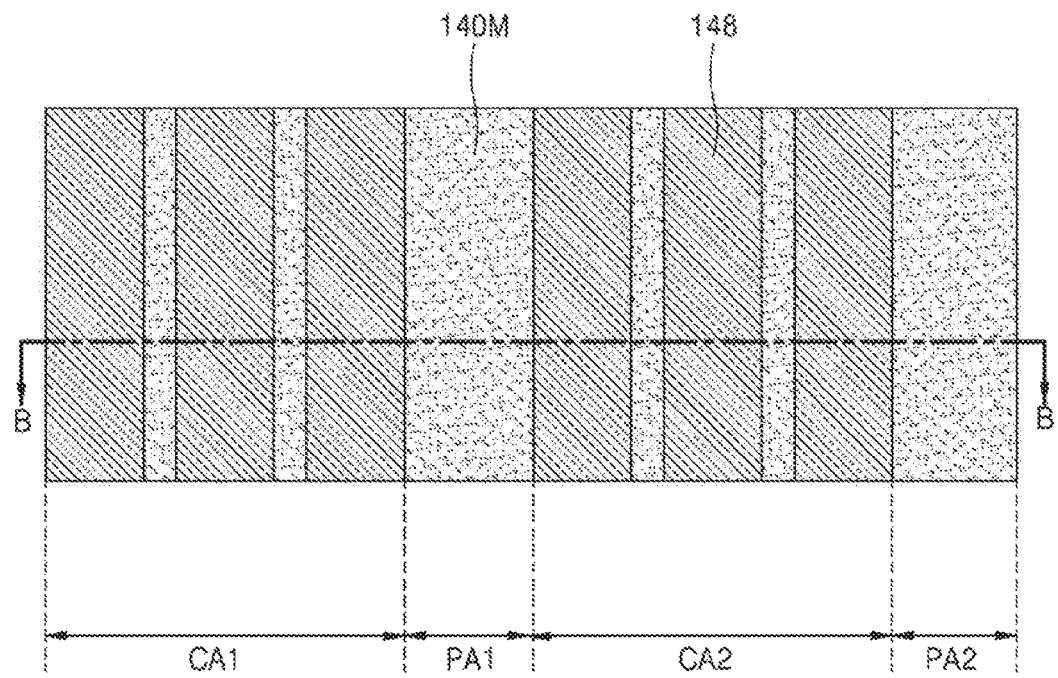
FIGS. 3A through 30B are plan views and cross-sectional views illustrating a method of manufacturing a semiconductor device according to a process order, according to an exemplary embodiment of the inventive concept.

FIGS. 3A through 30B are plan views and cross-sectional views illustrating a method of manufacturing a semiconductor device according to a process order, according to an exemplary embodiment of the inventive concept. FIGS. 3A, 4A, . . . , 30A are each a plan view of the semiconductor device in the first cell area CA1, the first peripheral area PA1, the second cell area CA2, and the second peripheral area PA2, and FIGS. 3B, 4B, . . . , 30B are each a cross-sectional view of the semiconductor device of FIGS. 3A, 4A, . . . , 30A cut along a line B-B.

In FIGS. 3A through 30B, like reference numerals as those in FIGS. 1A through 2 denote like elements, and description of the elements will be omitted for simplification of description.

Figure 3B:
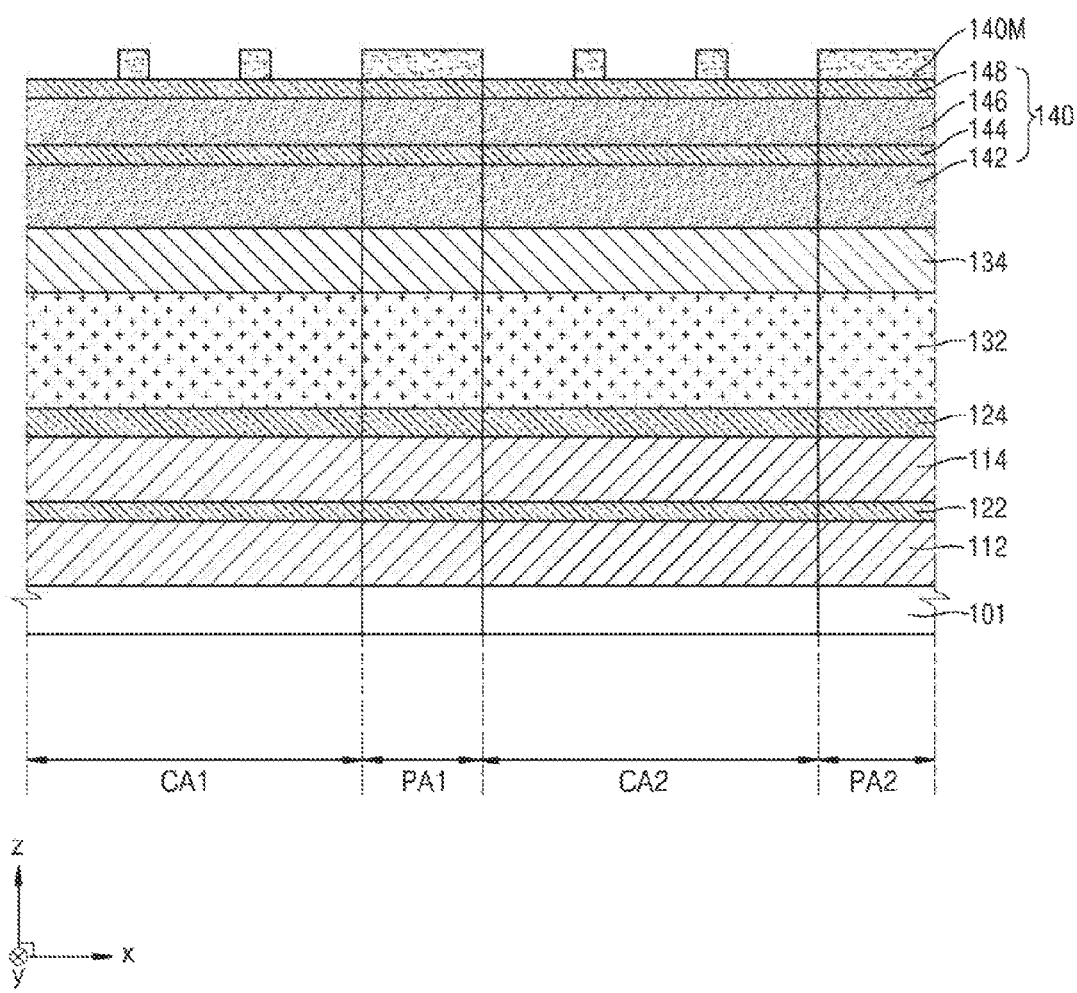
Figure 4A:
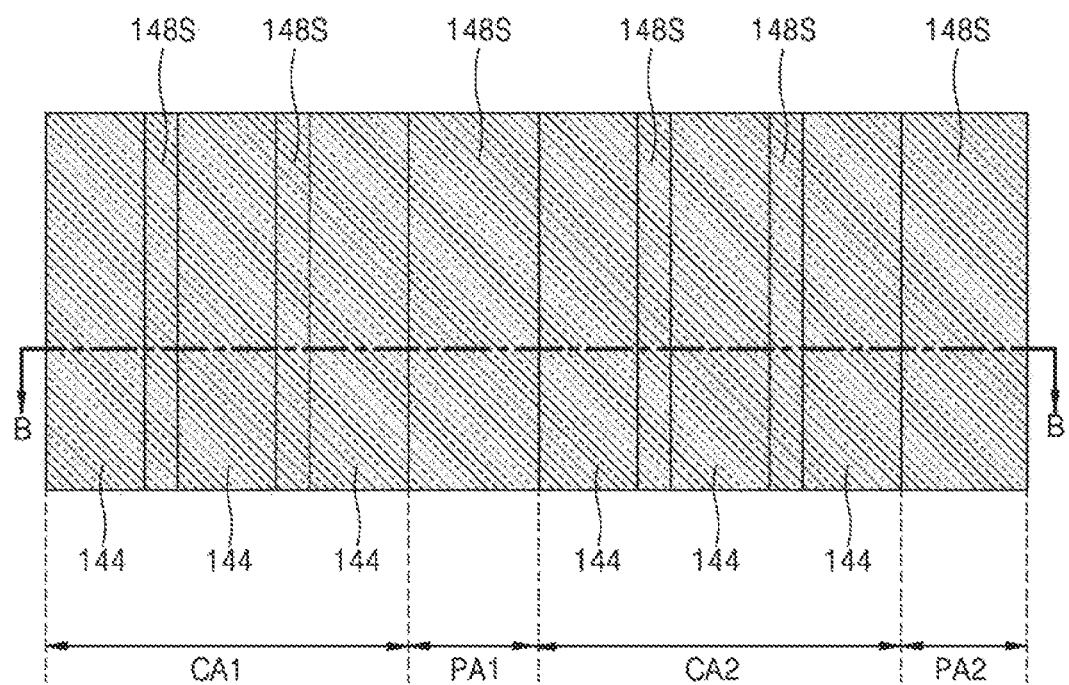

Referring to FIGS. 3A and 3B, a first mold layer 112, a first supporter layer 122, a second mold layer 114, a second supporter layer 124, a first mask layer 132, a second mask layer 134, a first preliminary pattern layer 140, and a first line mask layer 140M may be sequentially formed on the bottom structure 101 in the first and second cell areas CA1 and CA2 and the first and second peripheral areas PA1 and PA2.

Each of the first mold layer 112, the first supporter layer 122, the second mold layer 114, the second supporter layer 124, the first mask layer 132, the second mask layer 134, the first preliminary pattern layer 140, and the first line mask layer 140M may be formed using, for example, a physical vapor deposition (PVD) process, a chemical vapor deposition (CVD) process, an atomic layer deposition (ALD) process, or a spin coating process.

The first mold layer 112 and the second mold layer 114 may function as a sacrificial layer used to form the bottom electrodes 162 (see FIG. 2) in a subsequent process. In some exemplary embodiments, the first mold layer 112 and the second mold layer 114 may include, for example, a silicon oxide.

Each of the first supporter layer 122 and the second supporter layer 124 may be a material layer used to form the first supporter 122a (see FIG. 2) and the second supporter 124a (see FIG. 2) that support the bottom electrodes 162 (see FIG. 2). In some exemplary embodiments, the first supporter layer 122 and the second supporter layer 124 may be formed of a material having a different etching selectivity with respect to the first mold layer 112 and the second mold layer 114. For example, when the first mold layer 112 and the second mold layer 114 are formed of a silicon oxide, the first supporter layer 122 and the second supporter layer 124 may be formed of a silicon nitride.

The first mask layer 132 and the second mask layer 134 may be material layers used to form a first hole pattern mask layer 132M (see FIGS. 16A and 16B) and a second hole pattern mask layer 134M (see FIGS. 15A and 15B), respectively. In some exemplary embodiments, the first mask layer 132 may include polysilicon, and the second mask layer 134 may include silicon oxide.

Figure 8A:
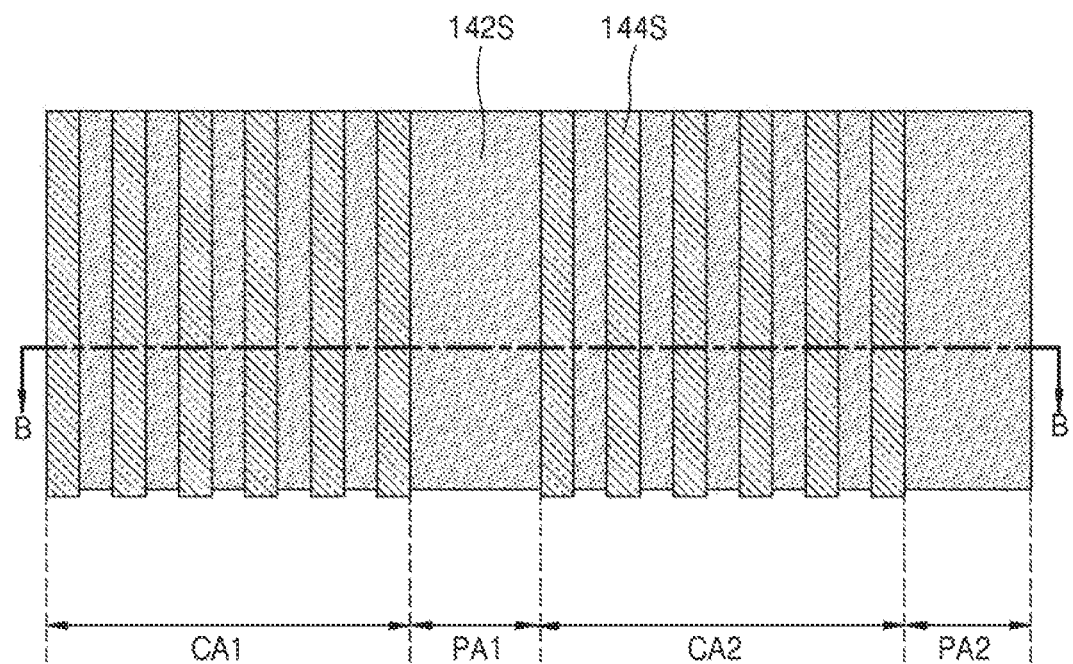
Figure 8B:
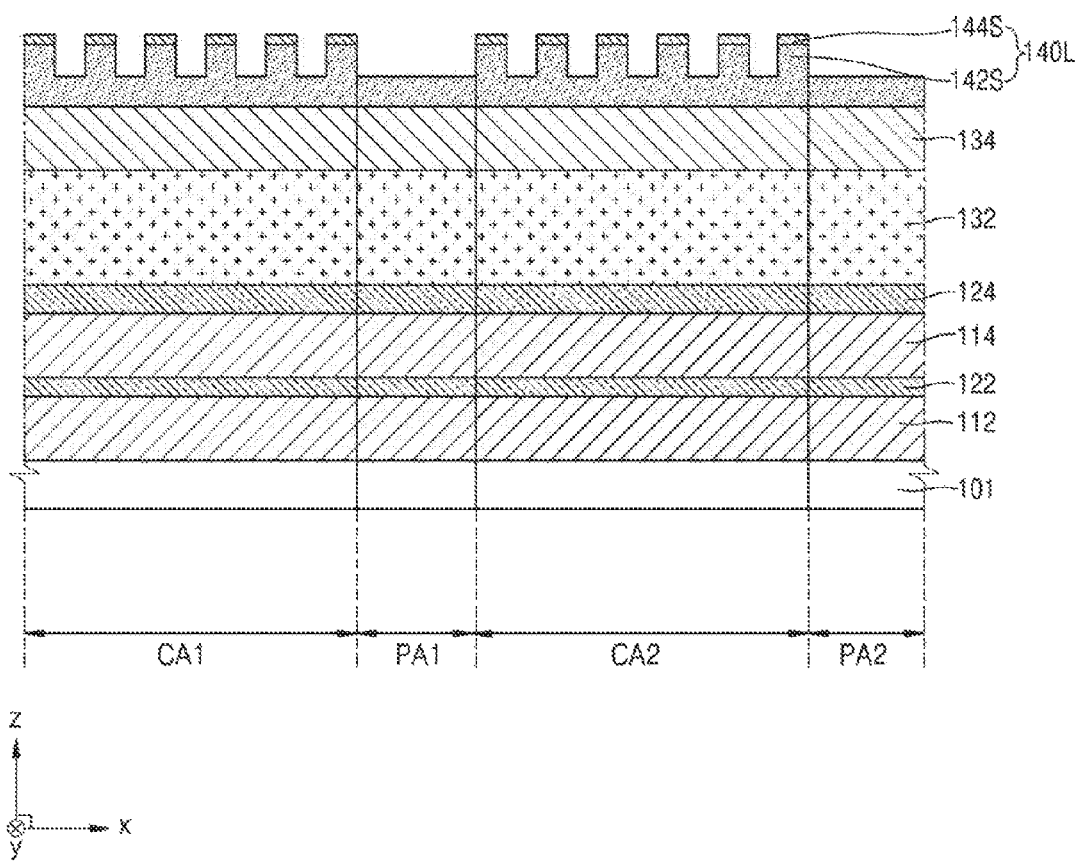

The first preliminary pattern layer 140 may include a plurality of material layers used to form a first line pattern 140L (see FIGS. 8A and 8B). In detail, the first preliminary pattern layer 140 may include a first bottom material layer 142, a first top material layer 144, a second bottom material layer 146, and a second top material layer 148 that are sequentially stacked.

In some exemplary embodiments, the first top material layer 144 and the second top material layer 148 may include silicon oxynitride (SiON).

The first bottom material layer 142 and the second bottom material layer 146 may be formed of a material having a different etching selectivity with respect to the first top material layer 144, the second top material layer 148, and the second mask layer 134. For example, when the first top material layer 144 and the second top material layer 148 are formed of silicon oxynitride, and the second mask layer 134 is formed of silicon oxide, the first bottom material layer 142 and the second bottom material layer 146 may be formed of, for example, a spin on hardmask (SOH).

The first line mask layer 140M may be formed on the second top material layer 148. In the first and second cell areas CA1 and CA2, a plurality of first line masks of the first line mask layer 140M are spaced apart from one another in a first direction (X direction) and may extend in a second direction (Y direction) perpendicular to the first direction (X direction). In the first and second peripheral areas PA1 and PA2, the first line mask layers 140M may be formed to cover the second top material layer 148 without an opening.

Figure 4B:
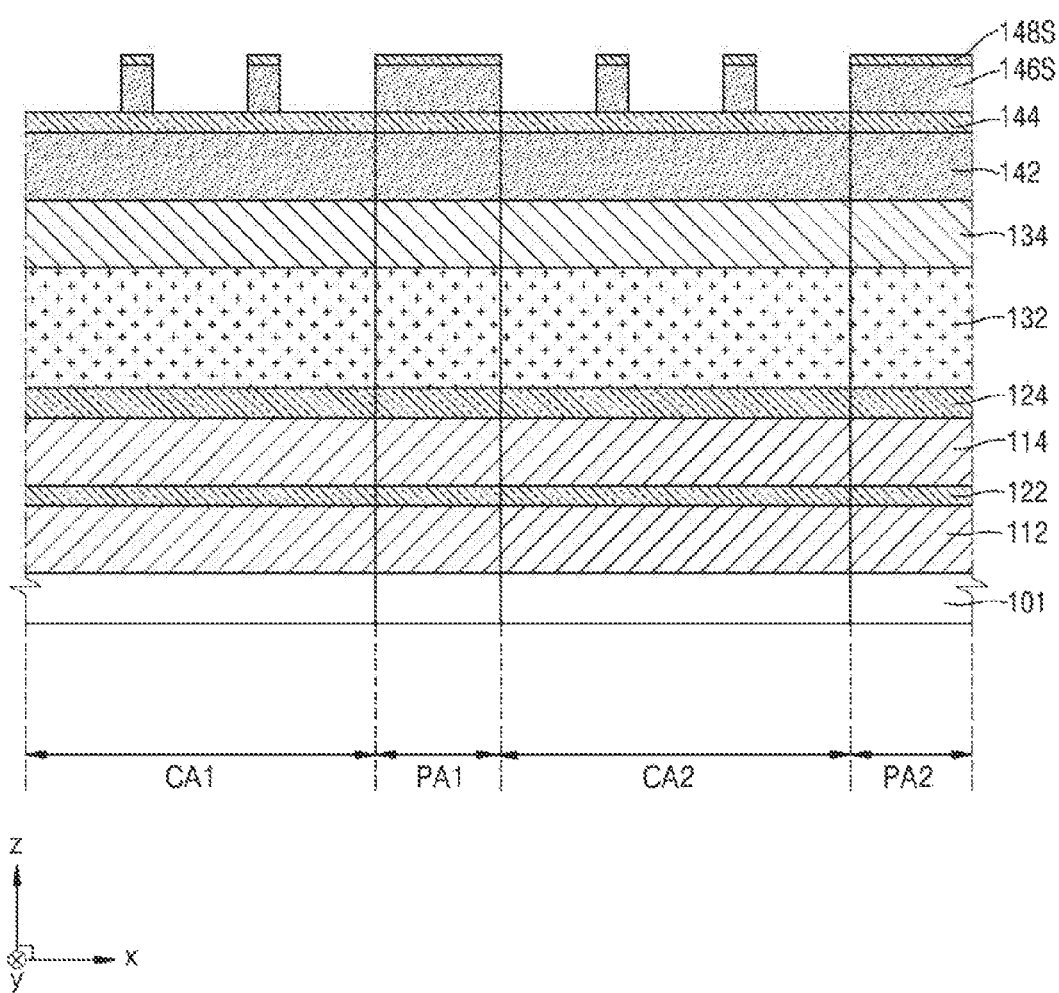

Referring to FIGS. 4A and 4B, the second bottom material layer 146 (see FIGS. 3A and 3B) and the second top material layer 148 (see FIGS. 3A and 3B) may be etched by using the first line mask layers 140M (see FIGS. 3A and 3B) as an etching mask, thereby forming a second bottom sacrificial layer pattern 146S and a second top sacrificial layer pattern 148S.

In the first and second cell areas CA1 and CA2, a plurality of second bottom sacrificial layer patterns of the second bottom sacrificial layer pattern 146S and a plurality of second top sacrificial layer patterns of the second top sacrificial layer pattern 148S may be spaced apart from each other in the first direction (X direction) and extend in the second direction (Y direction).

In the first and second peripheral areas PA1 and PA2, the second bottom sacrificial layer patterns 146S and the second top sacrificial layer patterns 148S may be formed to cover the first top material layer 144 without an opening.

The second bottom sacrificial layer patterns 146S and the second top sacrificial layer patterns 148S may be formed using an anisotropic etching process. In some exemplary embodiments, the anisotropic etching process may be one of a physical etching process, such as a sputtering etching process, a chemical etching process, such as a reactive radical etching process, and a physiochemical etching process, such as a reactive ion etching (RIE) process, a magnetically enhanced RIE (MERIE) process, a transformer coupled plasma (TCP) process, and an inductively coupled plasma (ICP) etching process.

Figure 5A:
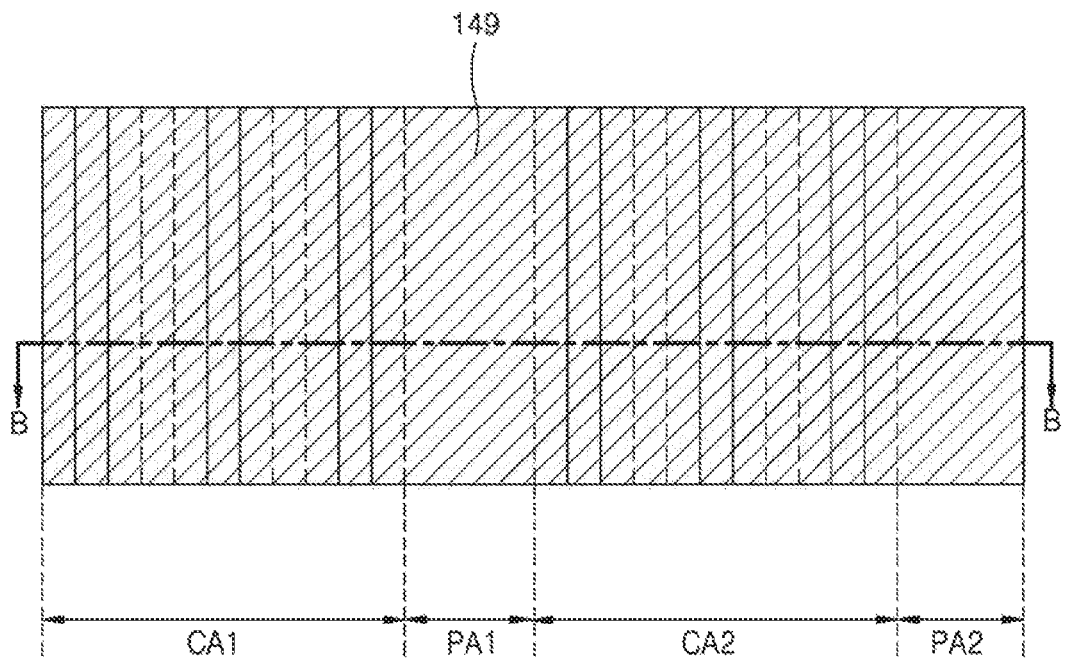
Figure 5B:
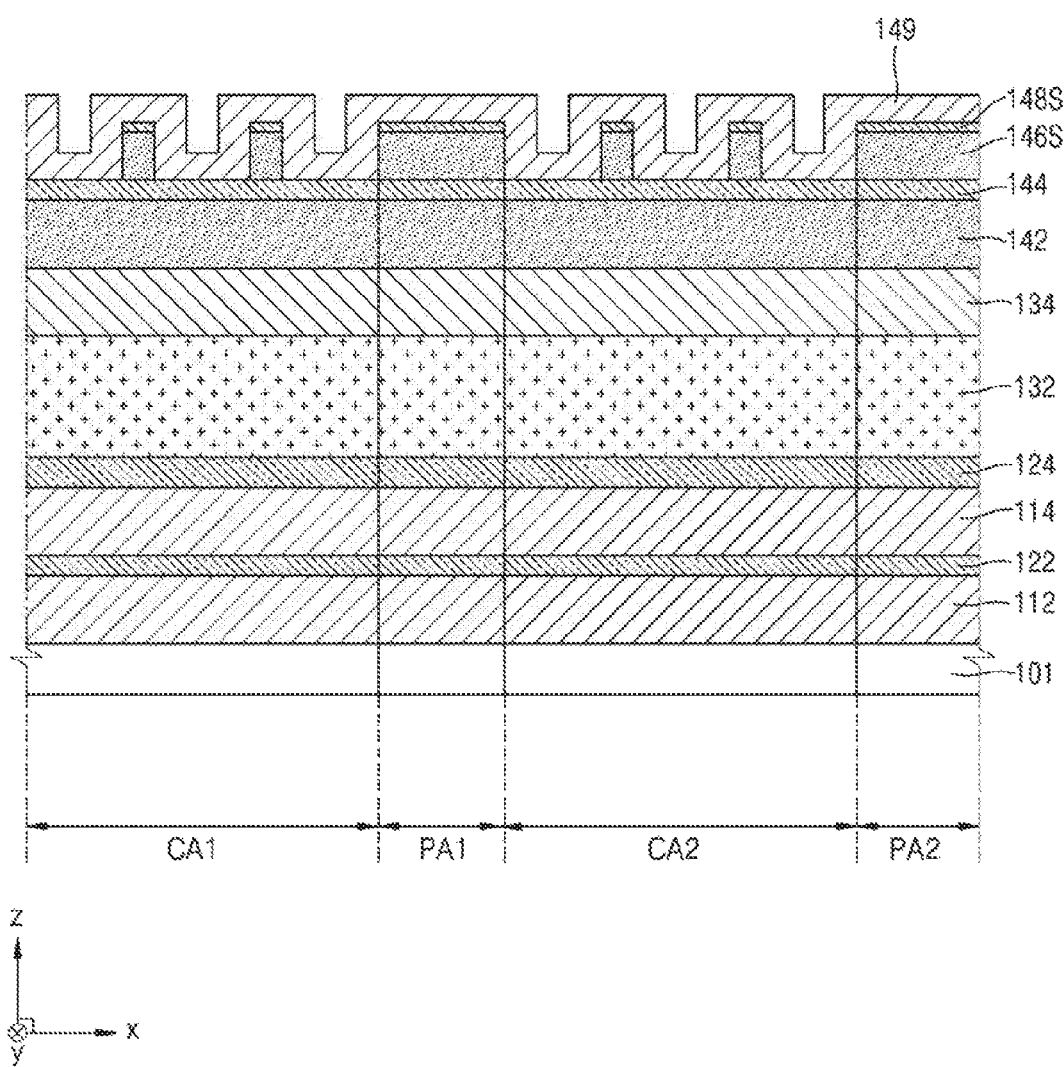

Referring to FIGS. 5A and 5B, a spacer layer 149 covering the second bottom sacrificial layer patterns 146S and the second top sacrificial layer patterns 148S may be formed on the first top material layer 144.

The spacer layer 149 may be formed of a material having a different etching selectivity with respect to the first top material layer 144. For example, when the first top material layer 144 is formed of silicon oxynitride, the spacer layer 149 may be formed of silicon oxide.

In some exemplary embodiments, an ALD process may be performed to form the spacer layer 149, but the exemplary embodiments are not limited thereto.

Figure 6A:
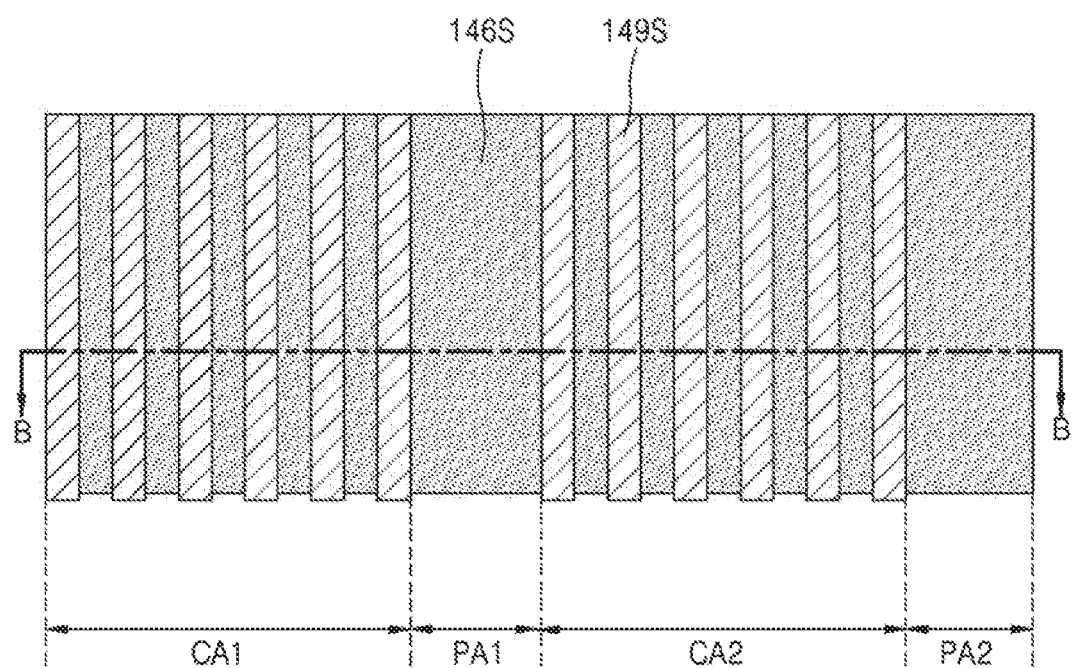
Figure 6B:
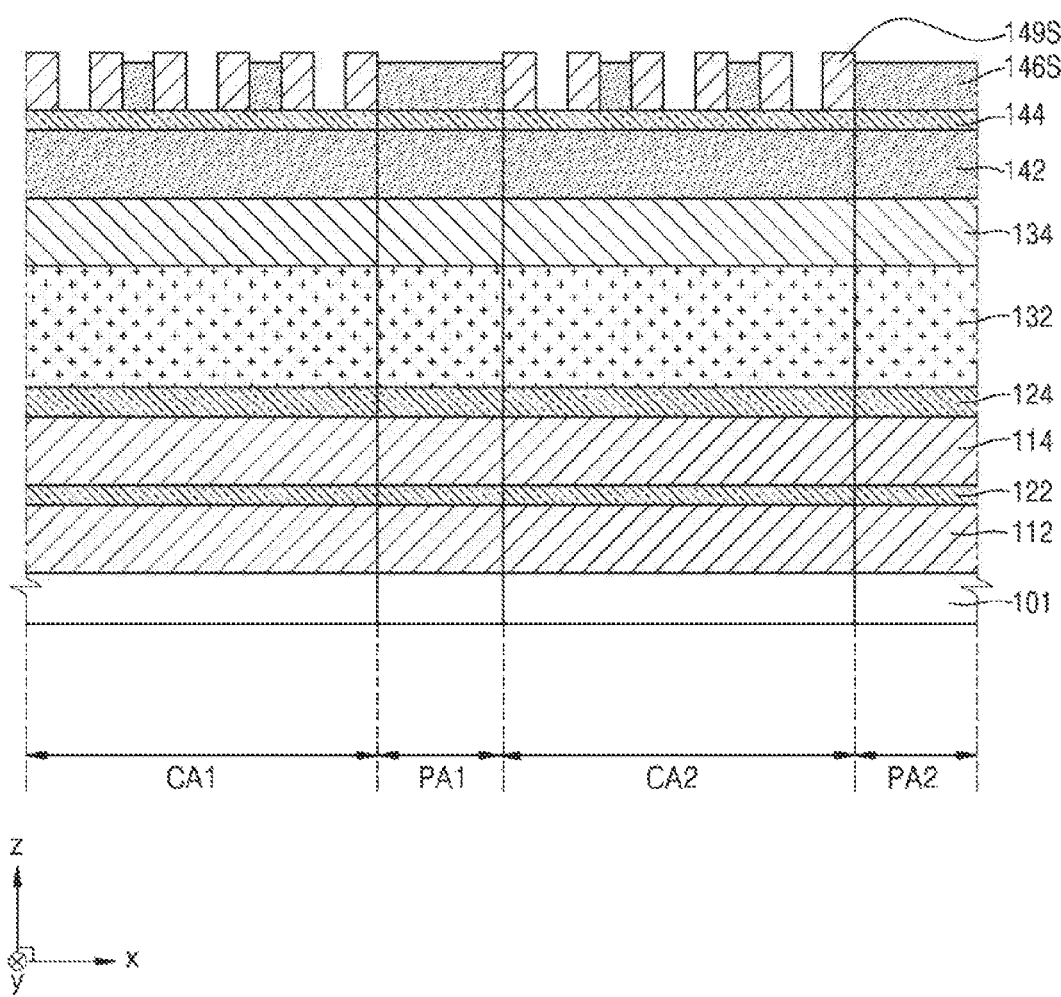

Referring to FIGS. 6A and 6B, the spacer layer 149 (see FIGS. 5A and 5B) may be etched to form a plurality of spacers 149S. In the above etching process, the second top sacrificial layer patterns 148S (see FIGS. 5A and 5B) may be removed.

In some exemplary embodiments, an anisotropic etching process may be performed to form the plurality of spacers 149S.

According to the anisotropic etching process, the plurality of spacers 149S that are spaced apart from one another in the first direction (X direction) and extend in the second direction (Y direction) are left in the first and second cell areas CA1 and CA2, and the spacer layer 149 (see FIGS. 5A and 5B) of the first and second peripheral areas PA1 and PA2 may be removed.

Figure 7A:
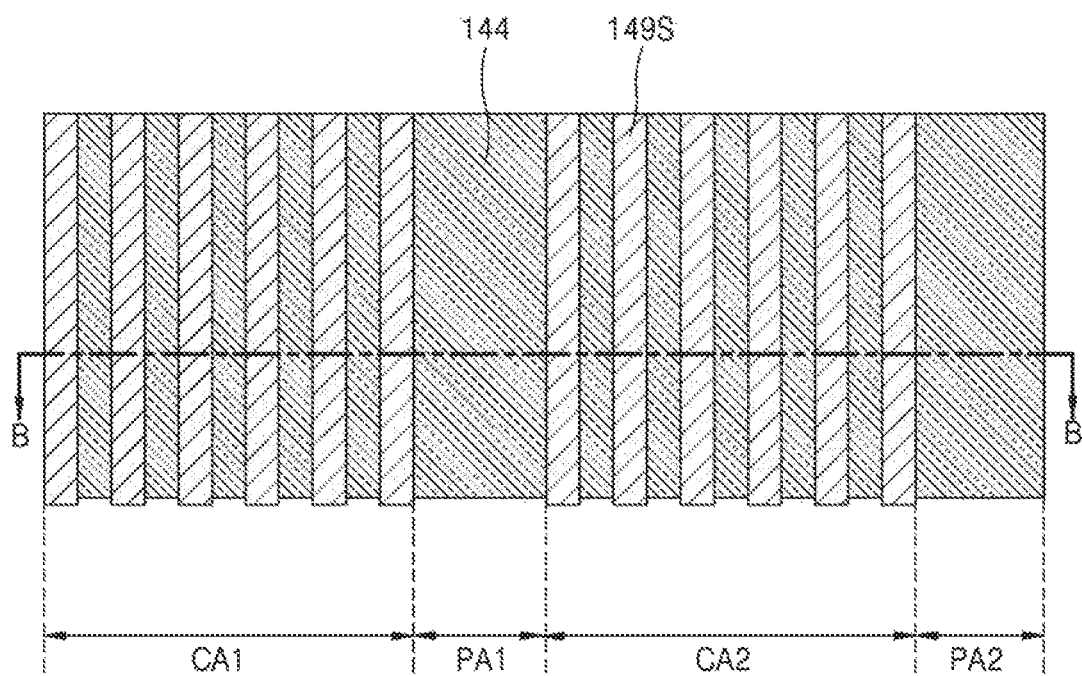
Figure 7B:
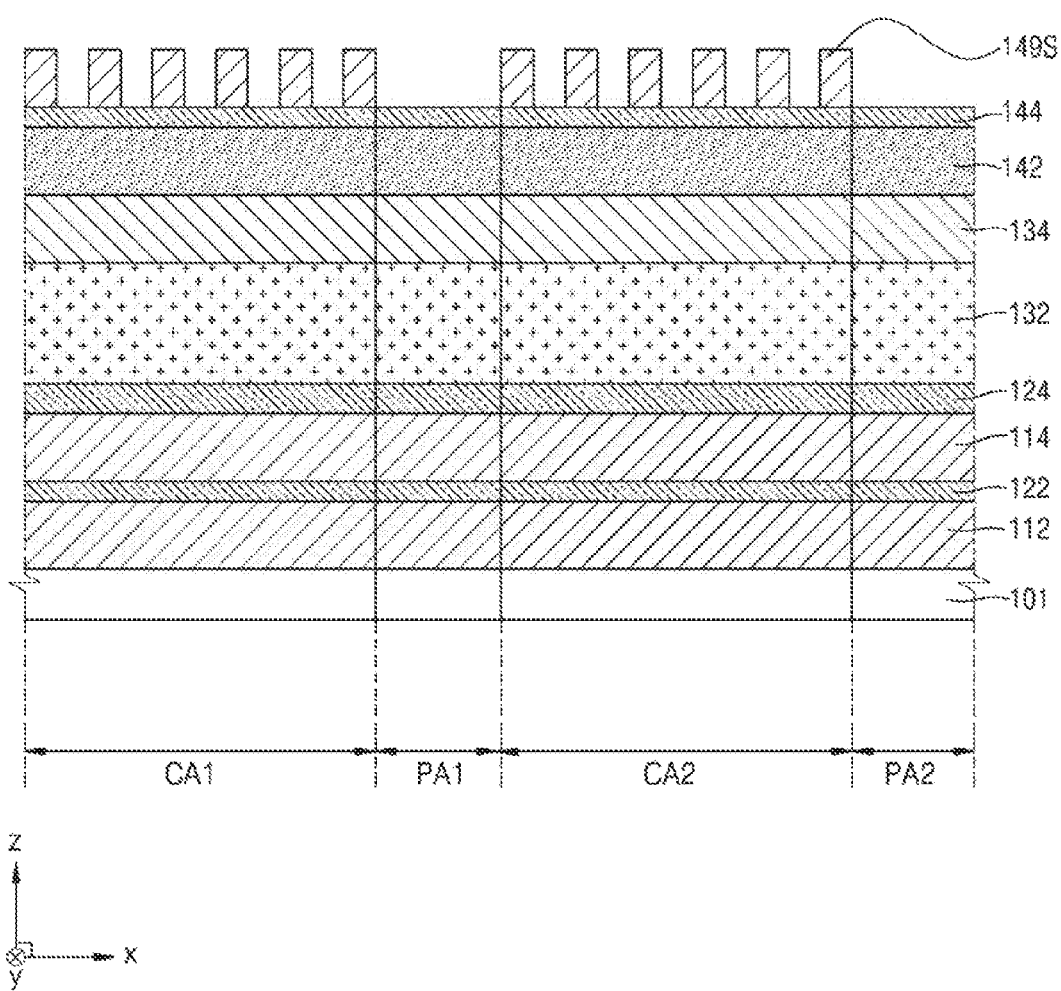

Referring to FIGS. 7A and 7B, the second bottom sacrificial layer patterns 146S (see FIGS. 6A and 6B) may be removed from the first and second cell areas CA1 and CA2 and the first and second peripheral areas PA1 and PA2. In some exemplary embodiments, a dry etching process, a wet etching process or an ashing and strip process or the like may be performed to remove the second bottom sacrificial layer patterns 146S.

Referring to FIGS. 8A and 8B, the first bottom material layer 142 (see FIGS. 7A and 7B) and the first top material layer 144 (see FIGS. 7A and 7B) may be etched by using the plurality of spacers 149S (see FIGS. 7A and 7B) as an etching mask, thereby forming a first line pattern 140L.

In some exemplary embodiments, the first line pattern 140L may be formed to include a first bottom material pattern 142S and a first top material pattern 144S remaining after the etching process above as illustrated in FIG. 8B. In some another exemplary embodiments, unlike FIG. 8B, the first line pattern 140L may be formed to include the plurality of spacers 149S (see FIGS. 7A and 7B), and the first bottom material pattern 142S and the first top material pattern 144S remaining after the etching process.

Figure 9A:
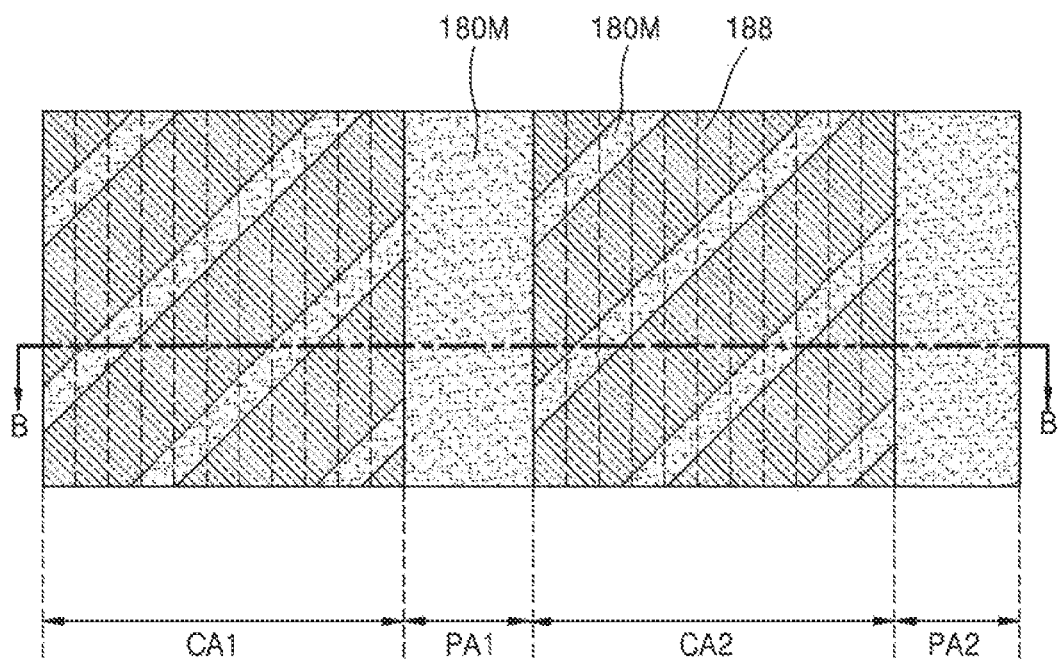
Figure 9B:
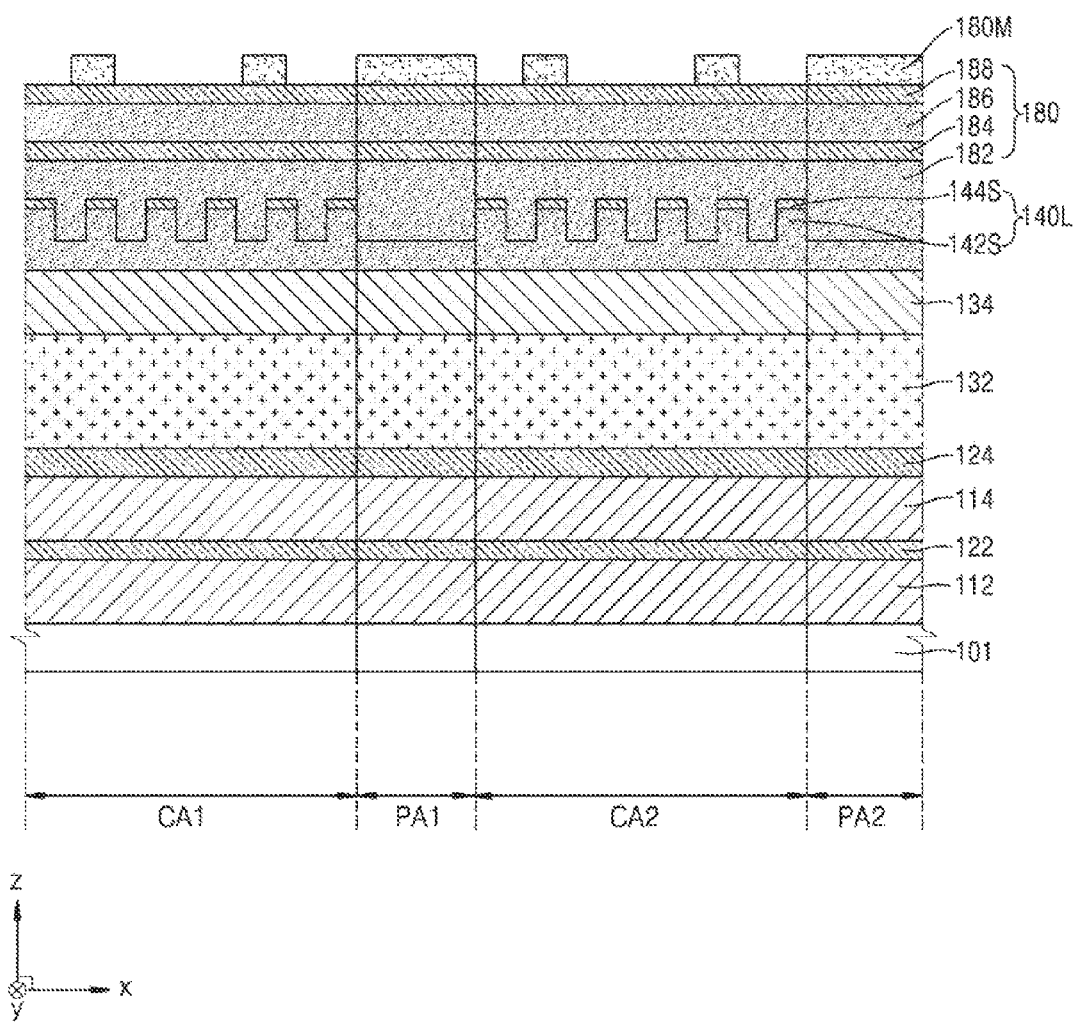

Referring to FIGS. 9A and 9B, a second preliminary pattern layer 180 and a second line mask layer 180 covering the first line pattern 140L of the first and second cell areas CA1 and CA2 and the first and second peripheral areas PA1 and PA2 may be formed. In some exemplary embodiments, each of the second preliminary pattern layer 180 and the second line mask layer 180M may be formed using, for example, a PVD process, a CVD process, an ALD process, or a spin coating process.

Figure 14A:
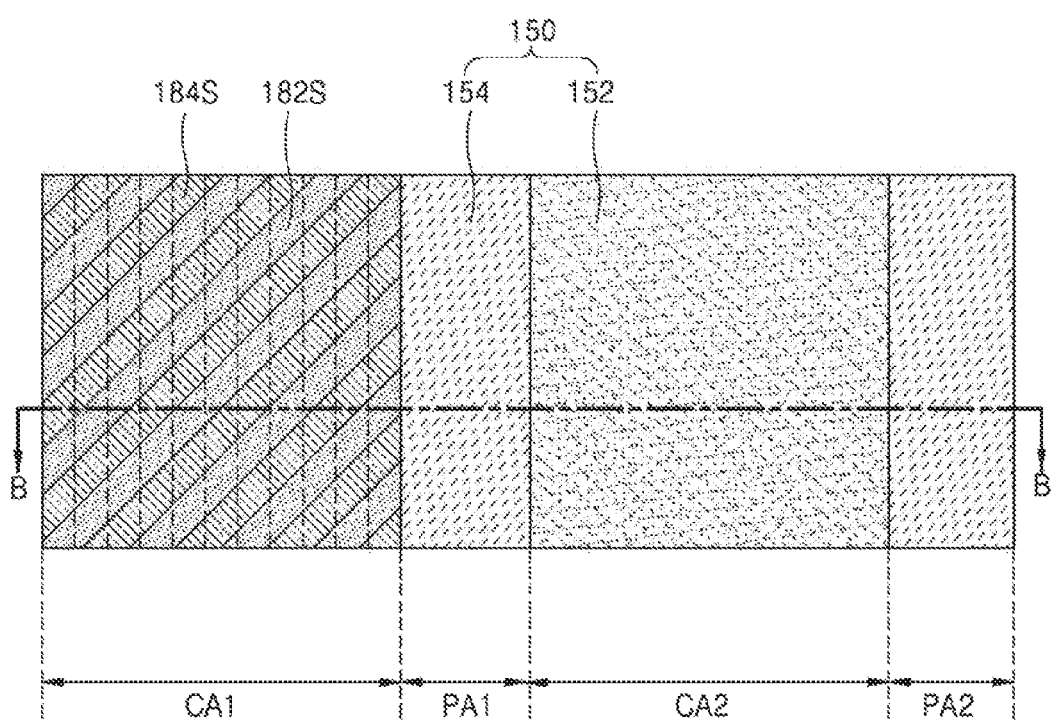
Figure 14B:
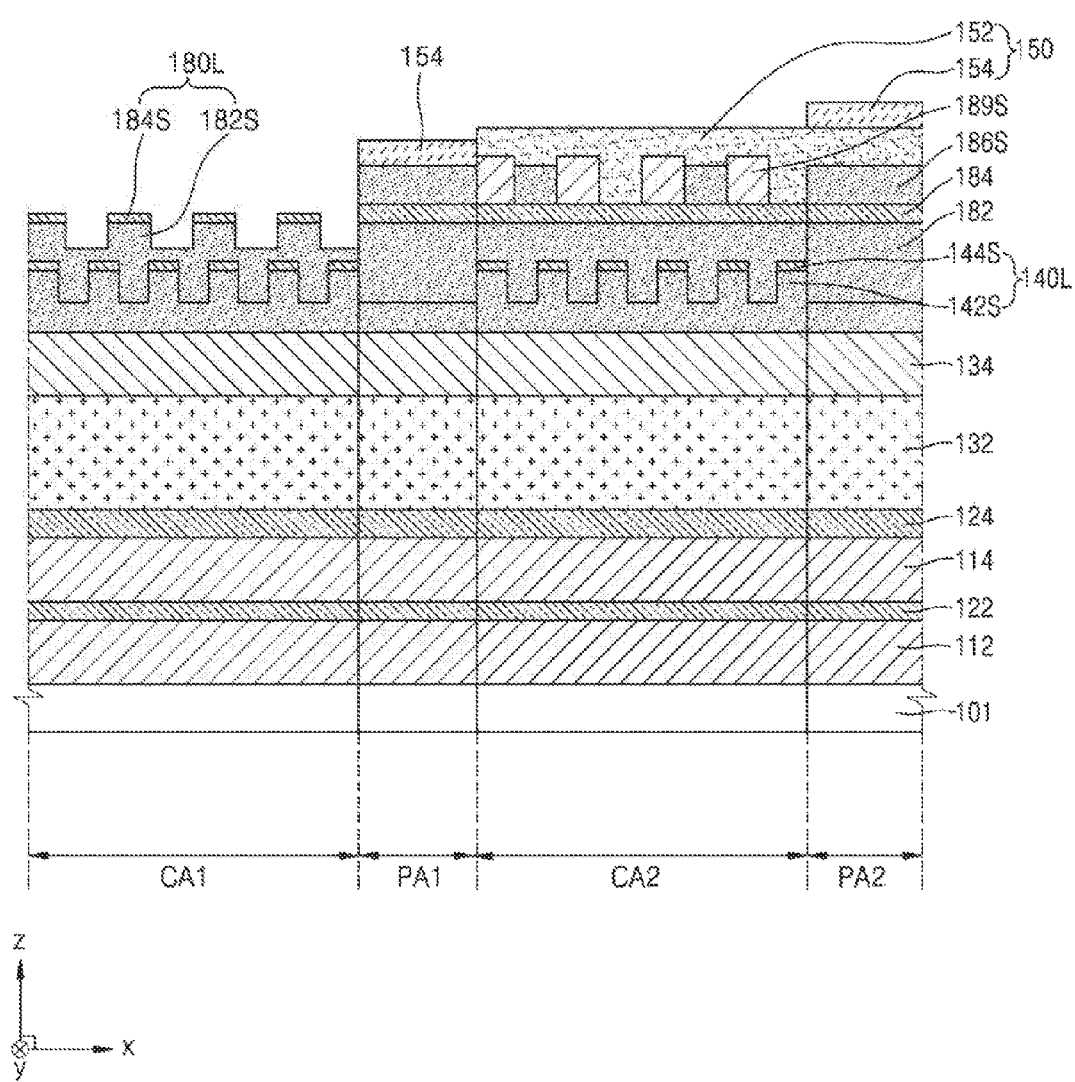

The second preliminary pattern layer 180 may include a plurality of material layers used to form a second line pattern 180L (see FIGS. 14A and 14B). In detail, the second preliminary pattern layer 180 may include a first bottom material layer 182, a first top material layer 184, a second bottom material layer 186, and a second top material layer 188 that are sequentially stacked.

In some exemplary embodiments, the first top material layer 184 and the second top material layer 188 may include silicon oxynitride.

The first bottom material layer 182 and the second bottom material layer 186 may be formed of a material having a different etching selectivity with respect to the first top material layer 184 and the second top material layer 188. For example, when the first top material layer 184 and the second top material layer 188 are formed of silicon oxynitride, the first bottom material layer 182 and the second bottom material layer 186 may be formed of, for example, a SOH.

The second line mask layer 180M may be formed on the second top material layer 188.

In the first and second cell areas CA1 and CA2, the second line mask layer 180M may extend in a fourth direction (W direction of FIG. 9A) that crosses the second direction (Y direction).

In the first and second peripheral areas PA1 and PA2, the first line mask layer 180M may be formed to cover the second top material layer 188 without an opening.

Figure 10A:
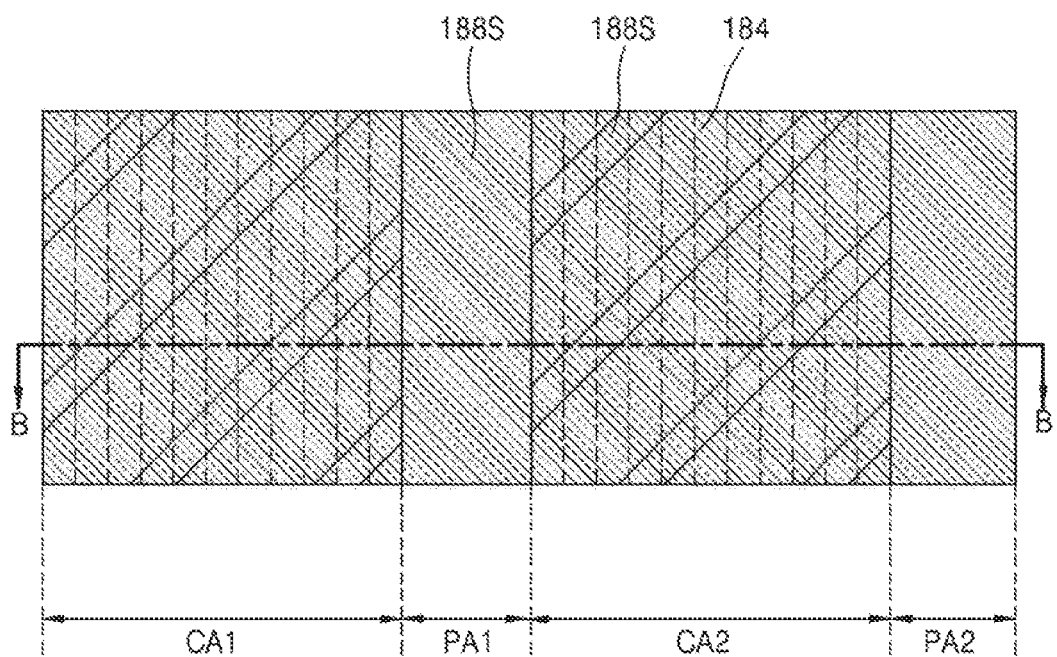
Figure 10B:
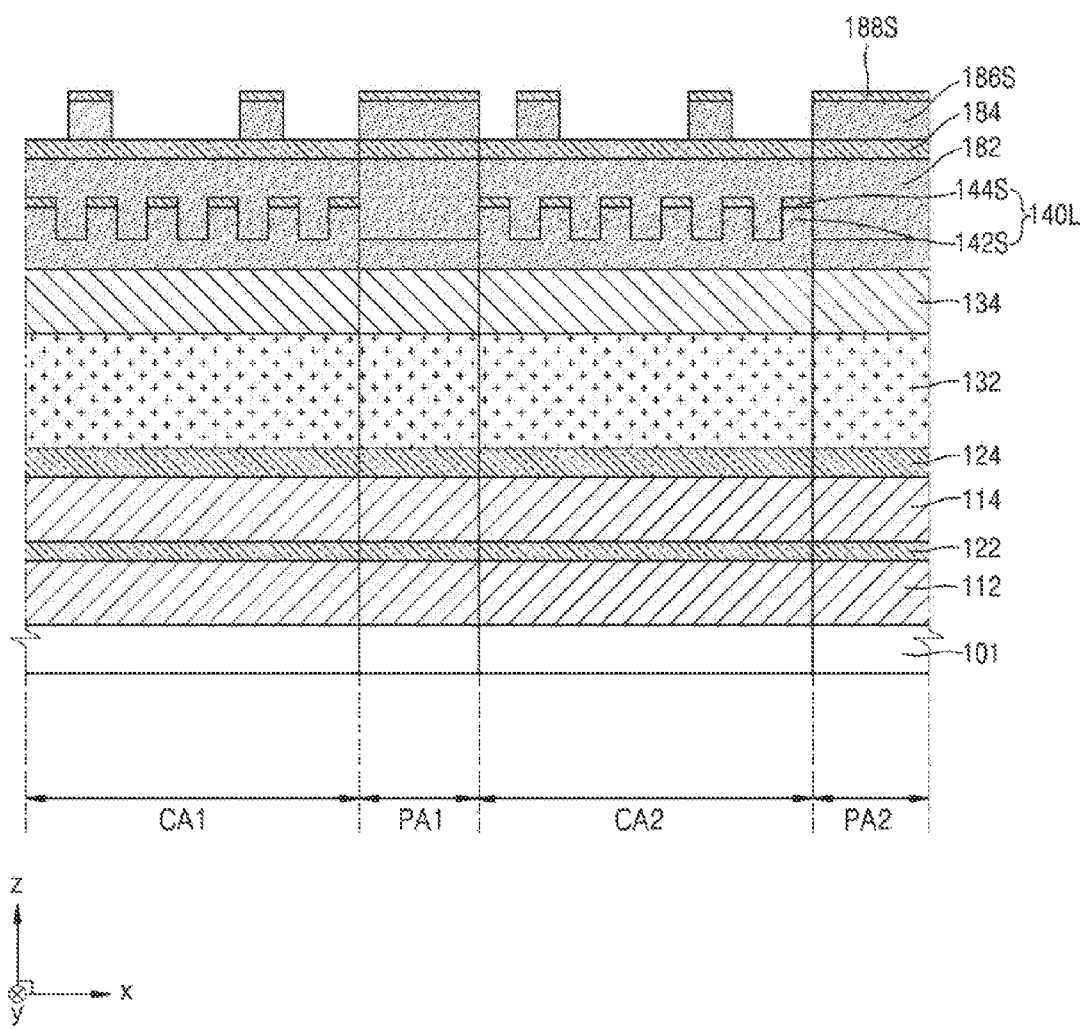

Referring to FIGS. 10A and 10B, the second bottom material layer 186 and the second top material layer 188 may be etched by using the second line mask layer 180M (see FIGS. 9A and 9B) as an etching mask, thereby forming a second bottom sacrificial layer pattern 186S and a second top sacrificial layer pattern 188S.

In the first and second cell areas CA1 and CA2, the second bottom sacrificial layer pattern 186S and the second top sacrificial layer pattern 188S may extend in the third direction (W direction).

In the first and second peripheral areas PA1 and PA2, the second bottom sacrificial layer pattern 186S and the second top sacrificial layer pattern 188S may be formed to cover the first top material layer 184 without an opening.

The second bottom sacrificial layer pattern 186S and the second top sacrificial layer pattern 188S may be formed using an anisotropic etching process.

Figure 11A:
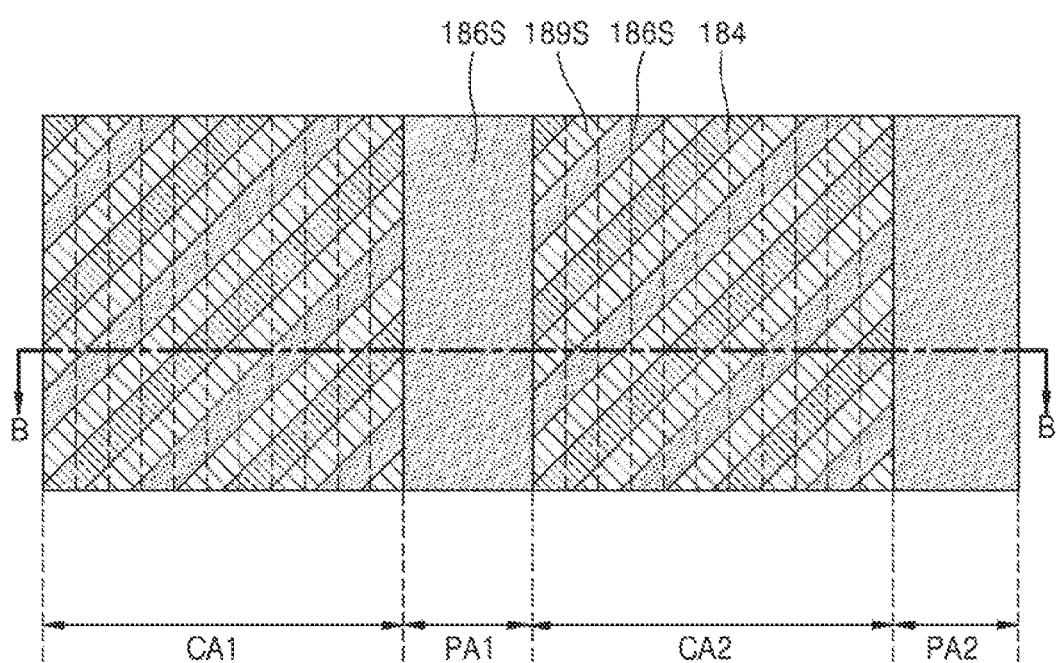
Figure 11B:
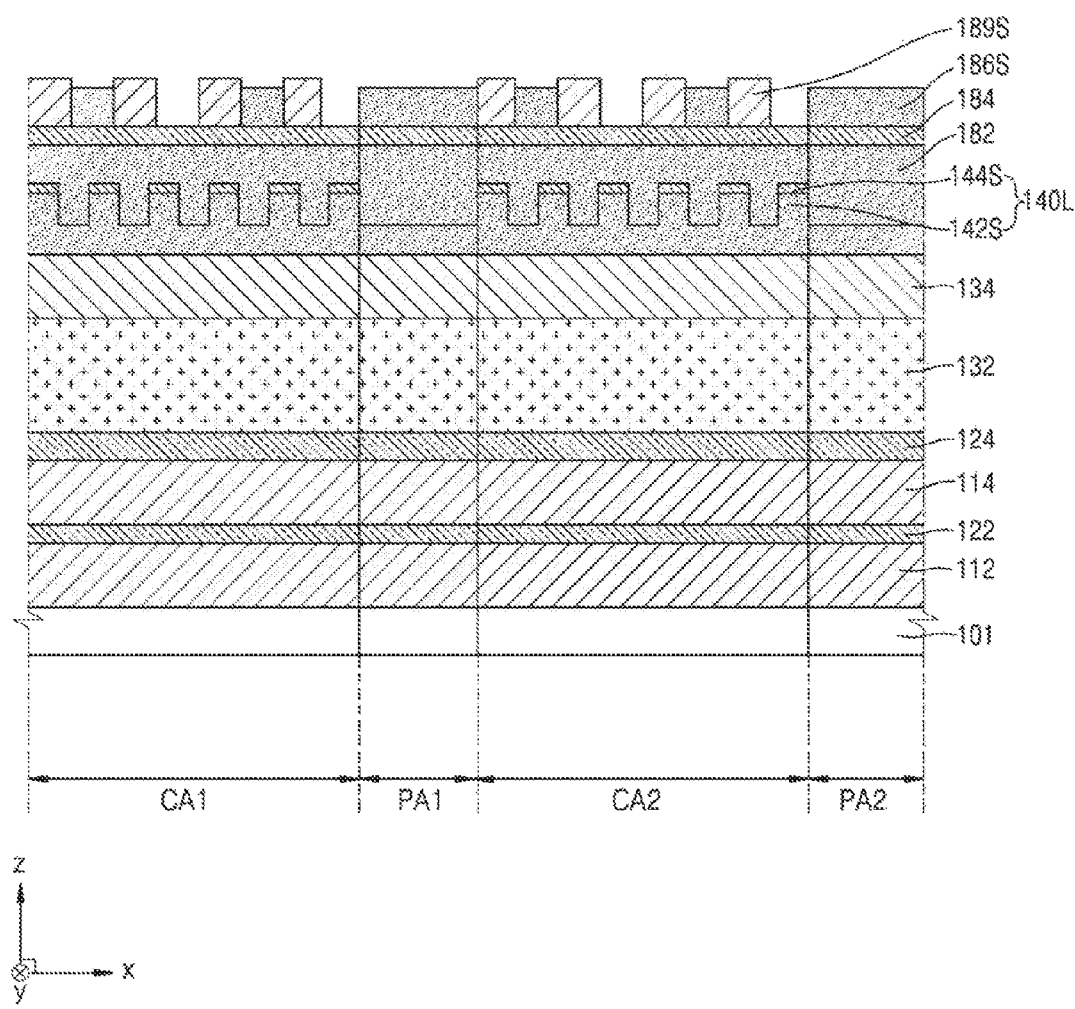

Referring to FIGS. 11A and 11B, a plurality of spacers 189S disposed on sidewalls of the second bottom sacrificial layer pattern 186S located in the first and second cell areas CA1 and CA2 may be formed. In some exemplary embodiments, the plurality of spacers 189S may be formed of silicon oxide.

The plurality of spacers 189S may be formed by forming a spacer layer (not shown) covering the second bottom sacrificial layer pattern 186S and the second top sacrificial layer pattern 188S on the first top material layer 184 (see FIGS. 10A and 10B) and then anisotropically etching the spacer layer.

During the etching process of the spacer layer, the second top sacrificial layer pattern 188S (see FIGS. 10A and 10B) may be removed.

Figure 12A:
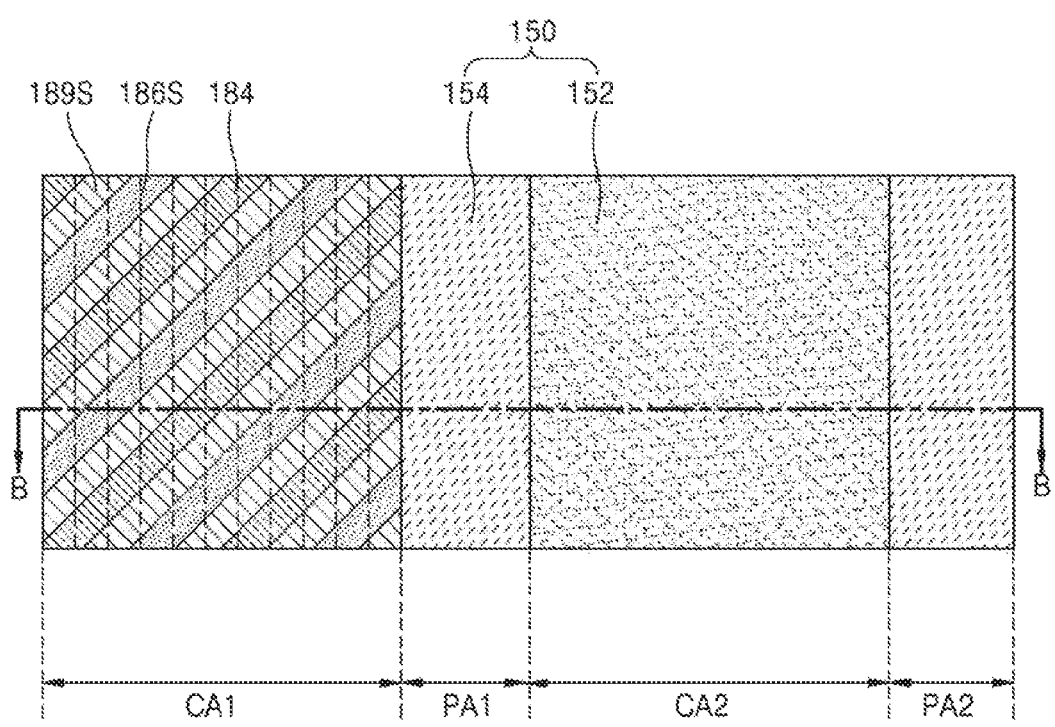
Figure 12B:
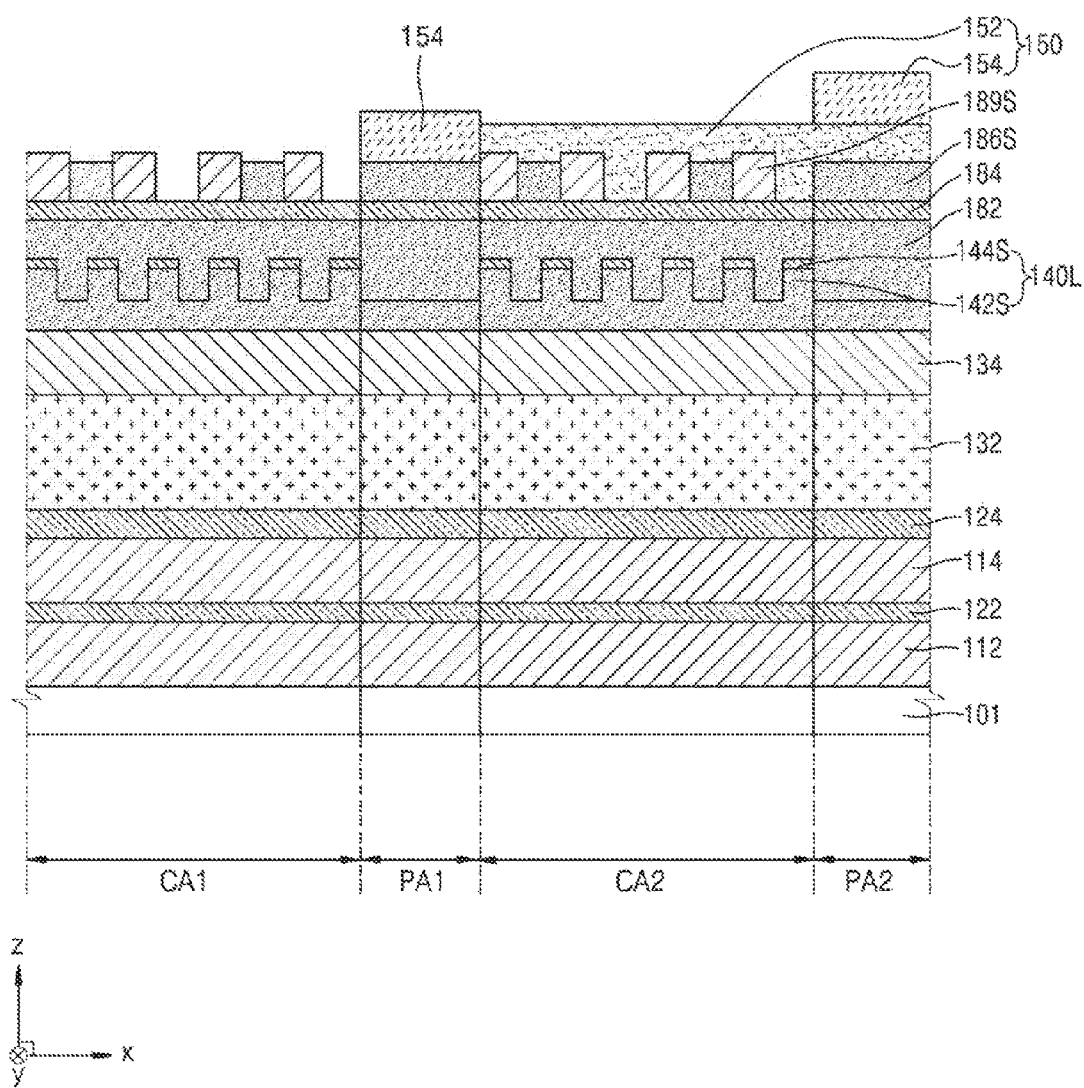

Referring to FIGS. 12A and 12B, an etching stopper layer 150 covering the first peripheral area PA1, the second cell area CA2, and the second peripheral area PA2 may be formed.

In some exemplary embodiments, the etching stopper layer 150 may include a photo sensitive etch stopping (PSES) mask layer 152 covering the second cell area CA2 and the second peripheral area PA2 and a trim mask layer 154 covering the first and second peripheral areas PA1 and PA2 as illustrated in FIG. 12B.

In some other exemplary embodiments, the trim mask layer 154 may cover the first and second peripheral areas PA1 and PA2 but unlike FIG. 12B, the PSES mask layer 152 may not cover the second peripheral area PA2 but may cover only the second cell area CA2.

In some other exemplary embodiments, the PSES mask layer 152 may cover the second cell area CA2 and the second peripheral area PA2, but unlike FIG. 12B, the trim mask layer 154 may not cover the second peripheral area PA2 but may cover only the first peripheral area PA1.

The PSES mask layer 152 and the trim mask layer 154 may be formed of a material having a different etching selectivity with respect to the second bottom sacrificial layer pattern 186S, the first top material layer 184, the first bottom material layer 182, the first top material pattern 144S, the first bottom material pattern 142S, and the second mask layer 134.

The PSES mask layer 152 and the trim mask layer 154 may each include at least one of, for example, silicon oxide, silicon nitride, silicon oxynitride, a metal layer, a photoresist, a spin on glass (SOG), and a SOH.

In some exemplary embodiments, the PSES mask layer 152 and the trim mask layer 154 may be formed of the same material, but are not limited thereto.

Figure 13A:
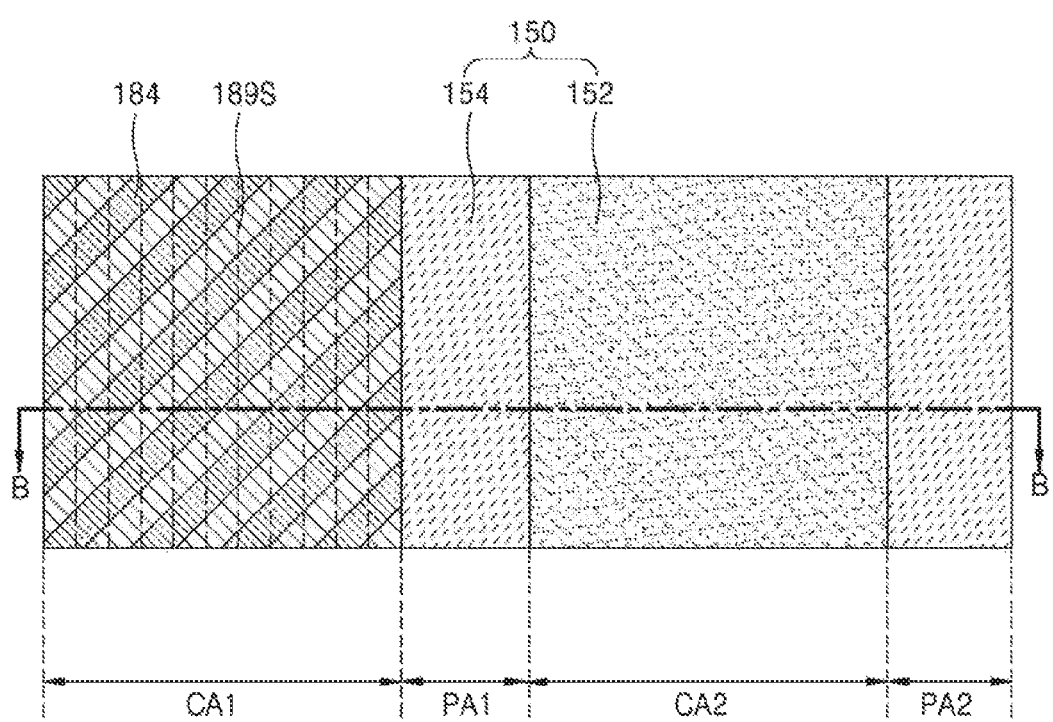
Figure 13B:
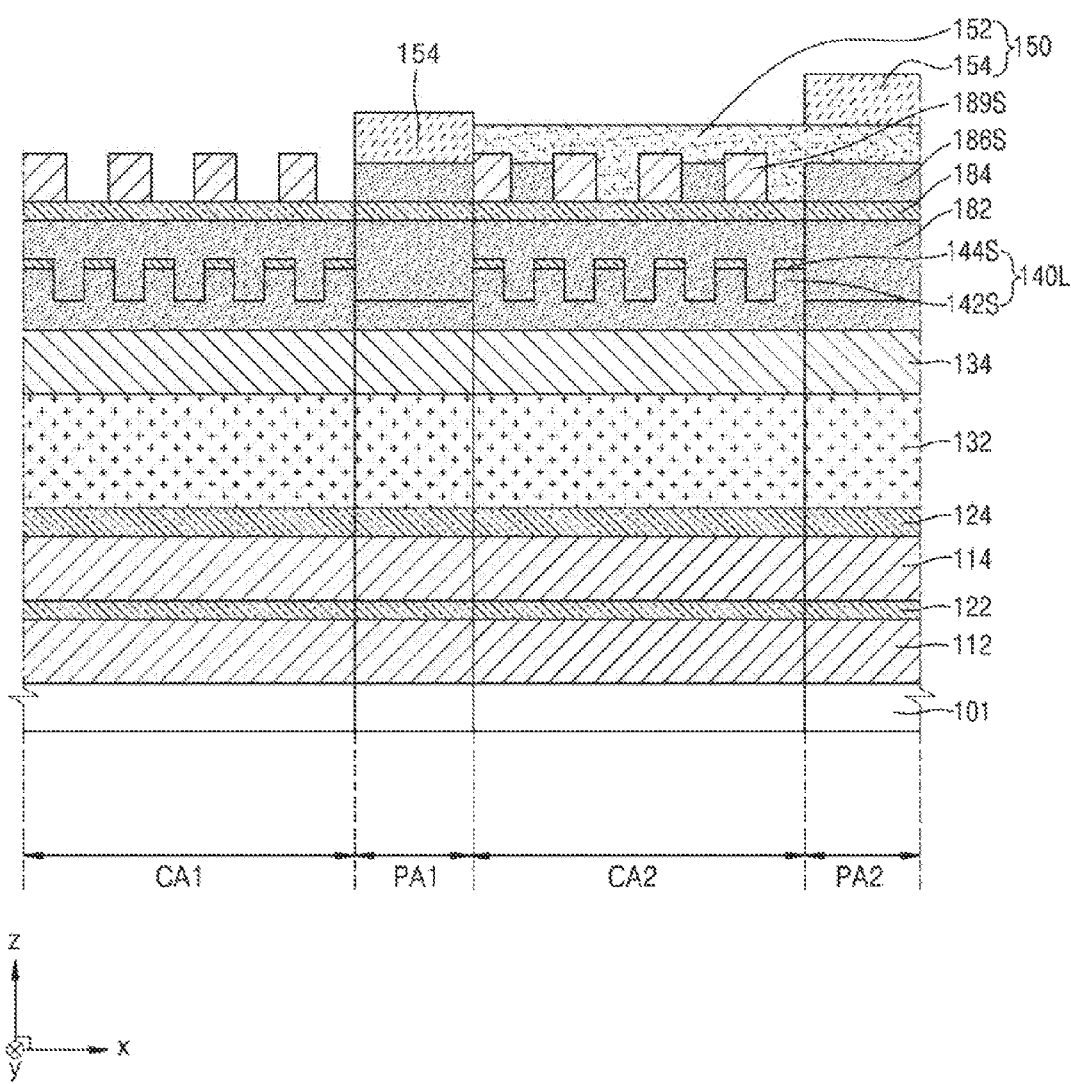

Referring to FIGS. 13A and 13B, the second bottom sacrificial layer pattern 186S (see FIGS. 12A and 12B) may be removed from the first cell area CA1. In some exemplary embodiments, a dry etching process, a wet etching process or an ashing and strip process or the like may be performed to remove the second bottom sacrificial layer pattern 186S (see FIGS. 12A and 12B).

During the removing process of the second bottom sacrificial layer pattern 186S (see FIGS. 12A and 12B) from the first cell area CA1, due to the presence of the etching stopper layer 150, the second bottom sacrificial layer pattern 186S of the first peripheral area PA1, the second cell area CA2, and the second peripheral area PA2 is not removed.

Referring to FIGS. 14A and 14B, the first bottom material layer 182 and the first top material layer 184 located in the first cell area CA1 may be etched by using the plurality of spacers 189S located in the first cell area CA1 (see FIGS. 13A and 13B), thereby forming a second line pattern 180L.

In some exemplary embodiments, the second line pattern 180L may be formed to include a first bottom material pattern 182S and a first top material pattern 184S remaining after the etching process as illustrated in FIG. 14B. In some other exemplary embodiments, unlike FIG. 14B, the first line pattern 180L may be formed to include the plurality of spacers 149S (see FIGS. 13A and 13B), and the first bottom material pattern 182S and the first top material pattern 184S remaining after the etching process may be formed.

While the second line pattern 180L is formed, due to the presence of the etching stopper layer 150, the first bottom material layer 182 and the first top material layer 184 of the first peripheral area PA1, the second cell area CA2, and the second peripheral area PA2 are not patterned.

While the second line pattern 180L is formed, a portion of an upper portion of the etching stopper layer 150 may be removed.

Figure 15A:
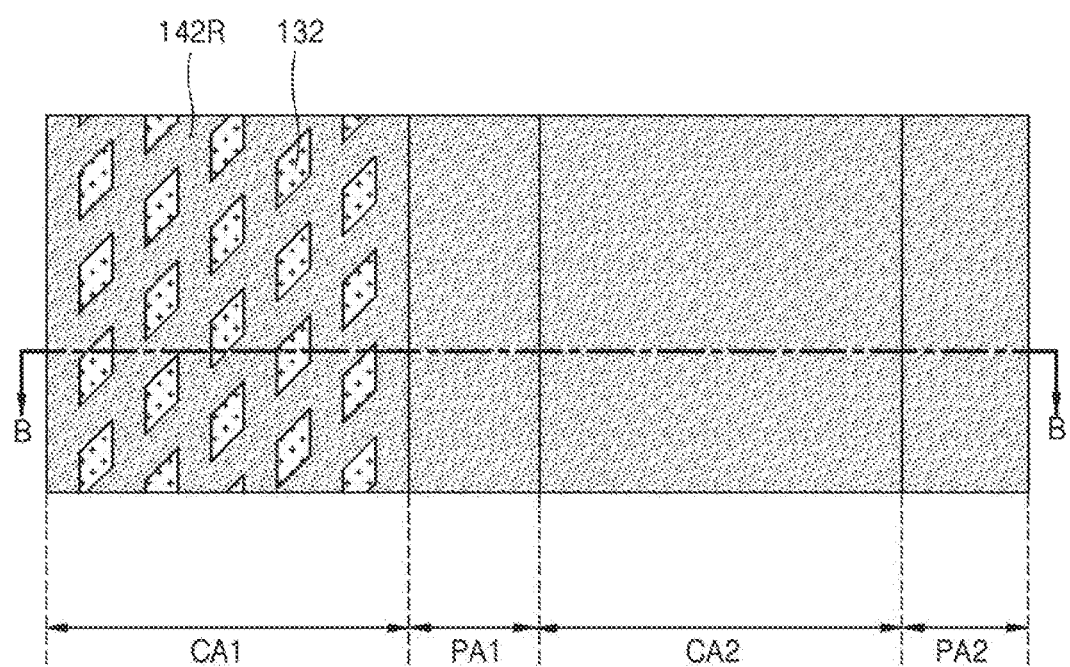
Figure 15B:
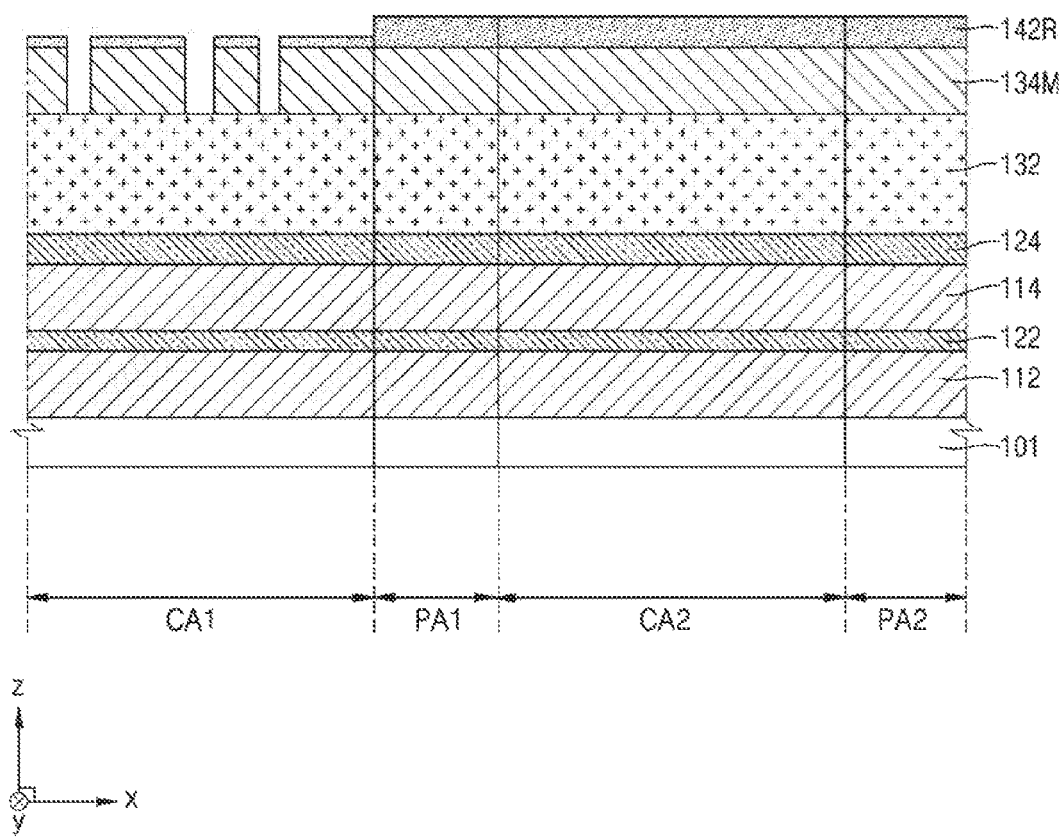

Referring to FIGS. 15A and 15B, the second mask layer 134 (see FIG. 14B) located in the first cell area CA1 may be etched by using the first and second line patterns 140L and 180L (see FIGS. 14A and 14B) located in the first cell area CA1 as an etching mask, thereby forming a second hole pattern mask layer 134M.

While the second hole pattern mask layer 134M is formed, the etching stopper layer 150 (see FIGS. 14A and 14B) may be formed, but due to the presence of the etching stopper layer 150 (see FIGS. 14A and 14B), the second mask layer 134 (see FIG. 14B) of the first peripheral area PA1, the second cell area CA2, and the second peripheral area PA2 is not patterned.

As illustrated in FIG. 15B, after forming the second hole pattern mask layer 134M, a first bottom material layer 142R may remain on the second hole pattern mask layer 134M.

Figure 16A:
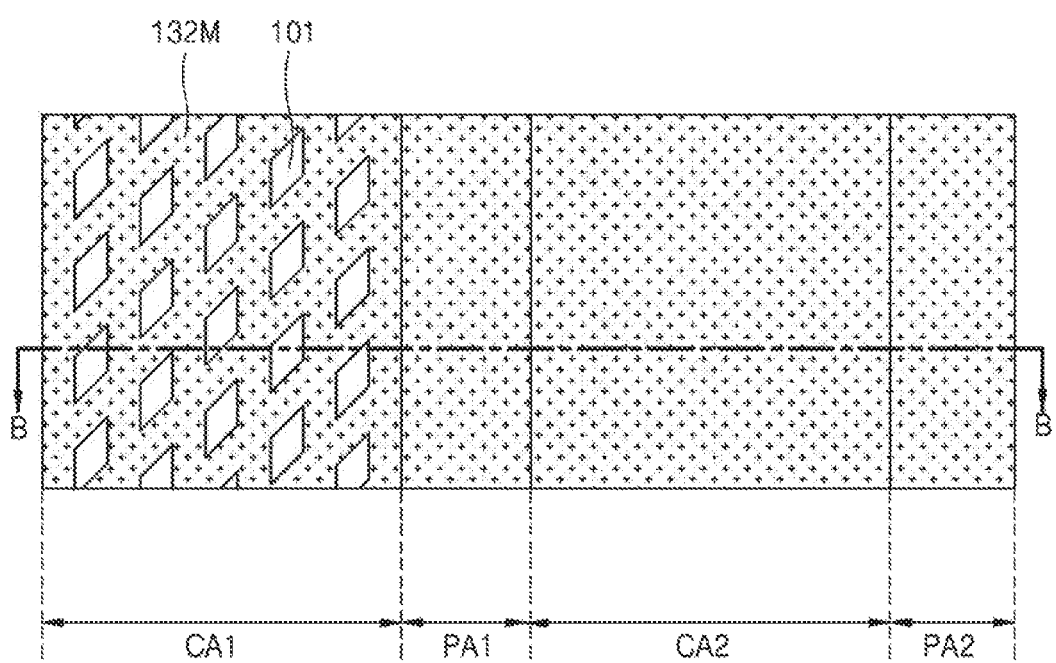
Figure 16B:
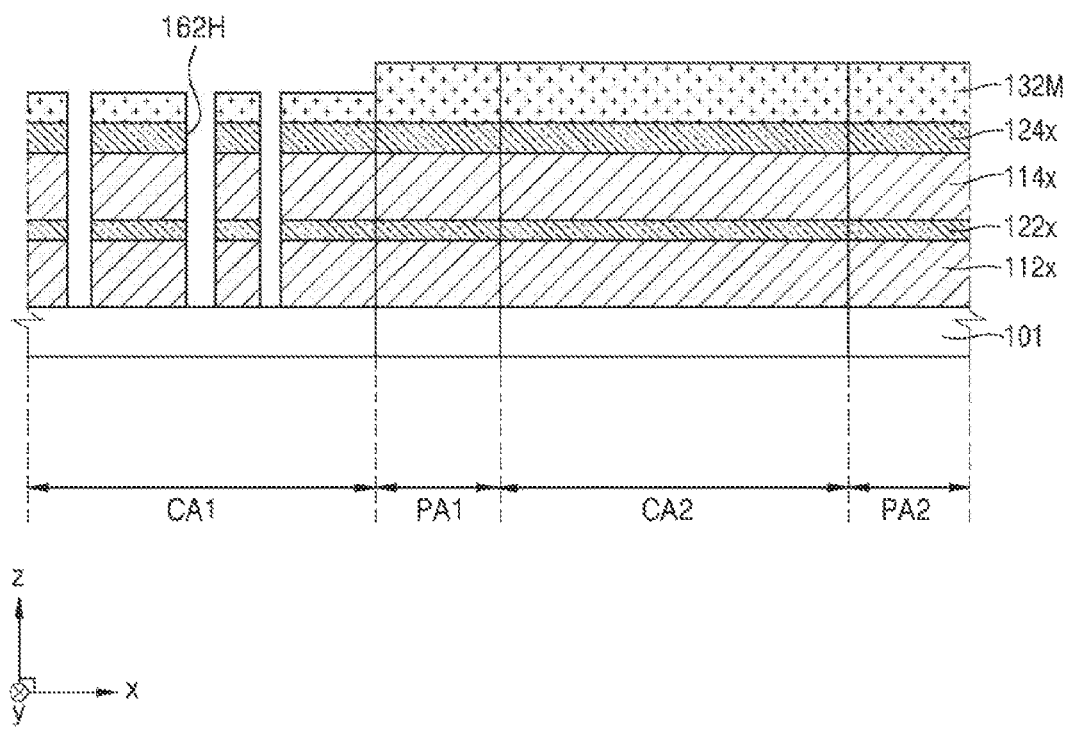

Referring to FIGS. 16A and 16B, the first mask layer 132 (see FIG. 15B) may be etched by using the second hole pattern mask layer 134M (see FIGS. 15A and 15B) as an etching mask, thereby forming a first hole pattern mask layer 132M. After forming the first hole pattern mask layer 132M, the first hole pattern mask layer 132M and a portion of the second hole pattern mask layer 134M that may remain (see FIGS. 15A and 15B) may be used as an etching mask to etch the first and second supporter layers 122 and 124 (see FIGS. 15A and 15B) and the first and second mold layers 112 and 114 (see FIGS. 15A and 15B), thereby forming first and second supporter layers 122x and 124x and first and second mold layers 112x and 114x having a hole pattern 162H in the first cell area CA1.

The hole pattern 162H may be formed at a position corresponding to the contact area (not shown) included in the bottom structure 101.

Figure 17A:
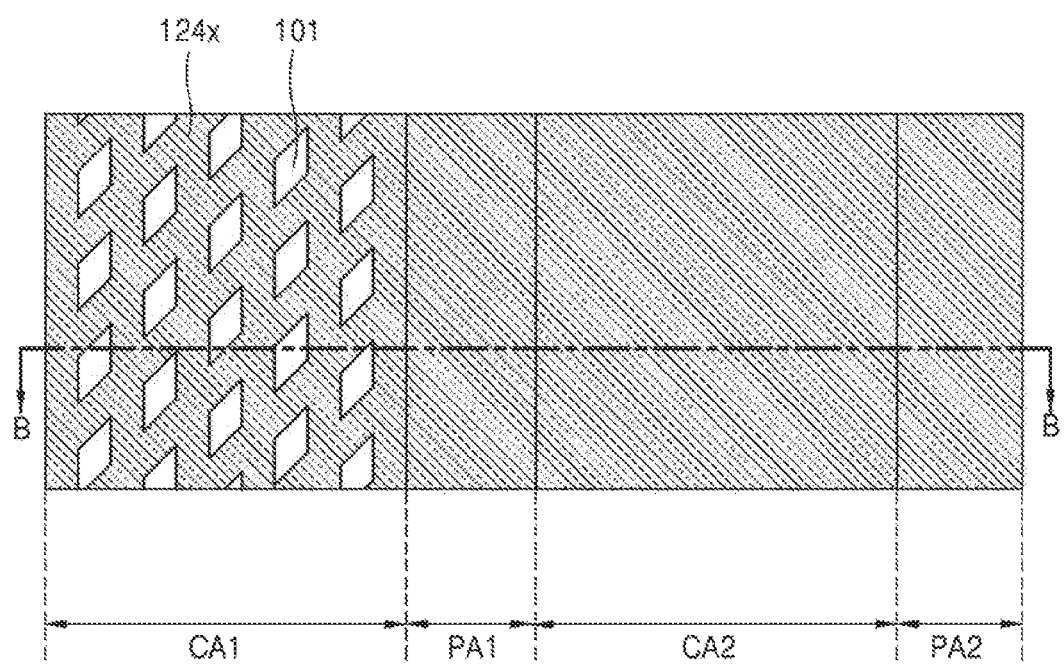
Figure 17B:
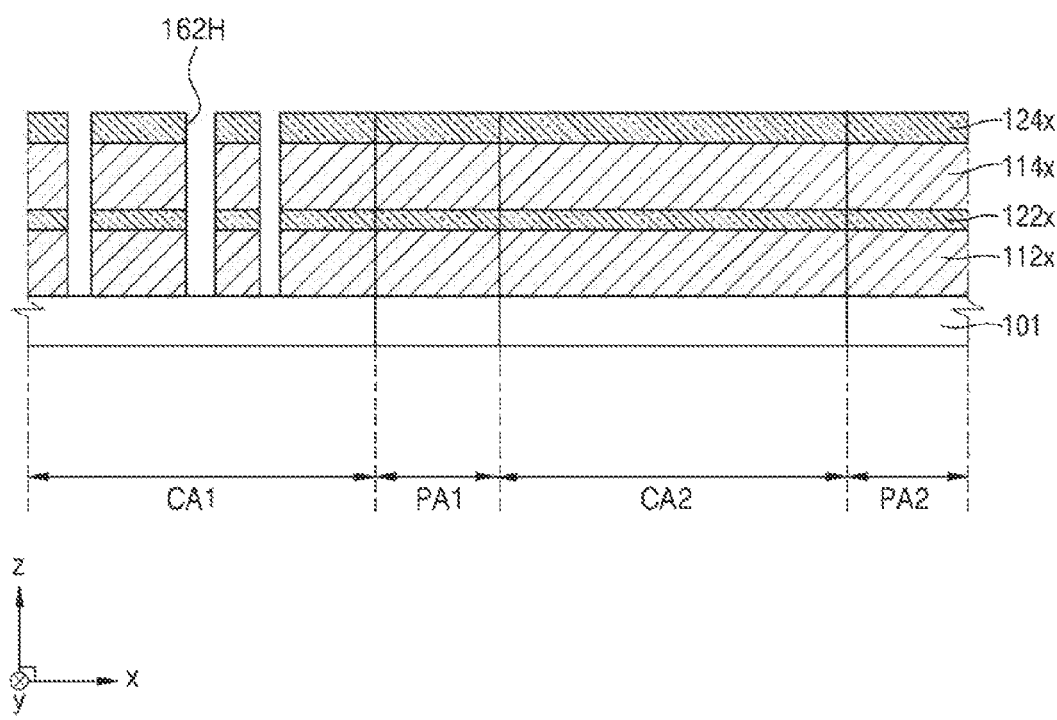

Referring to FIGS. 17A and 17B, an etch back process or the like may be performed to remove the first hole pattern mask layer 132M (see FIGS. 16A and 16B).

Figure 18A:
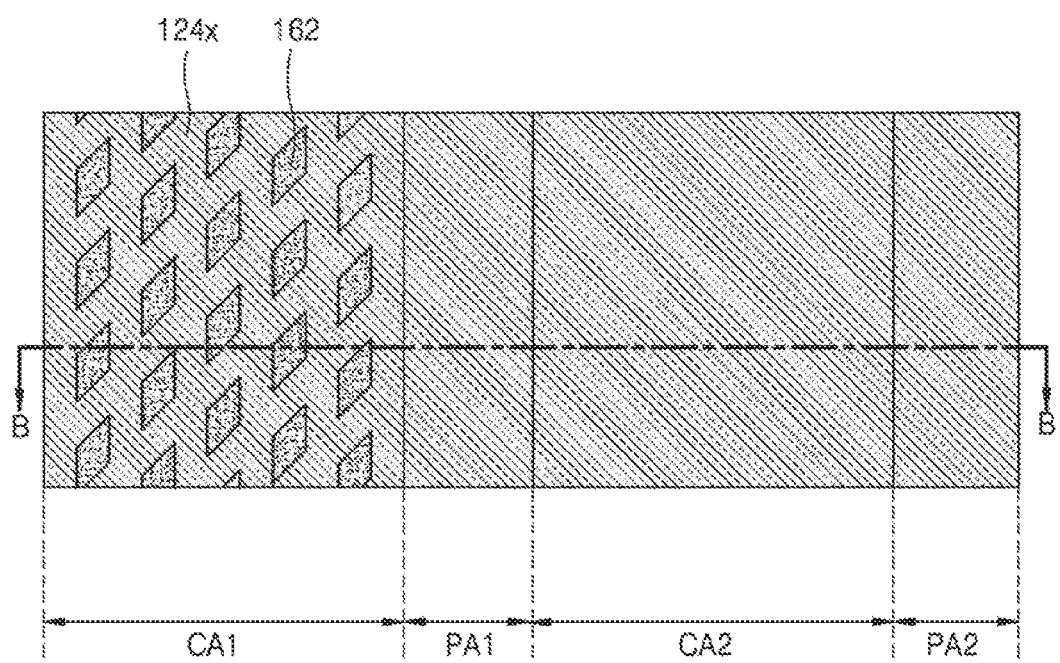
Figure 18B:
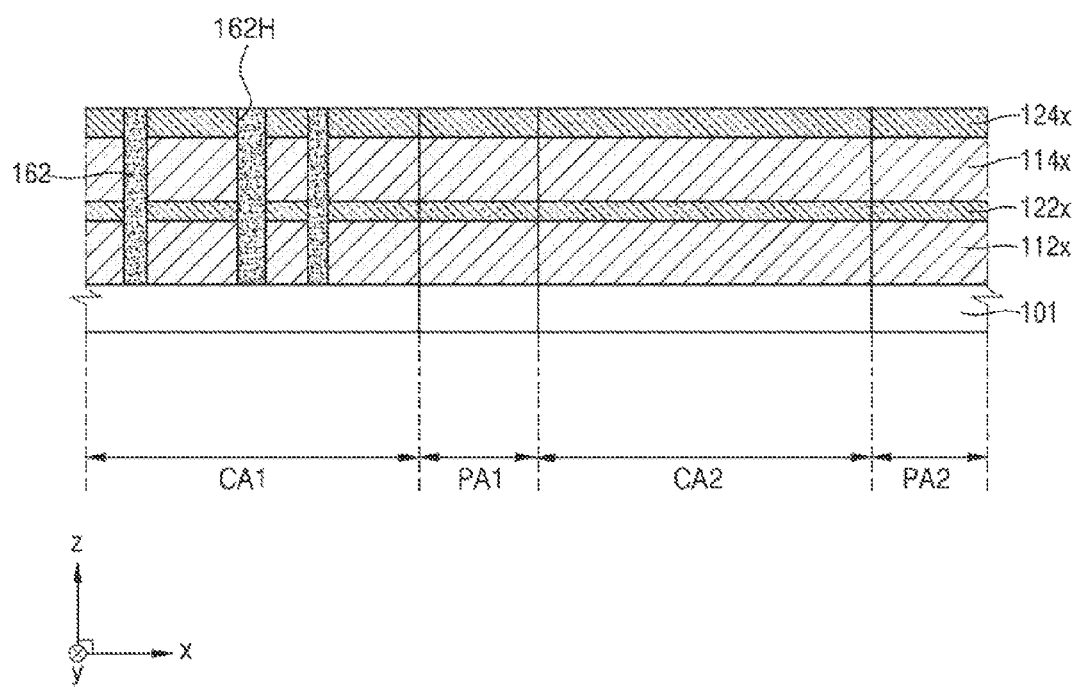

Referring to FIGS. 18A and 18B, after forming a conductive material layer (not shown) covering the hole pattern 162H, an etch back process and/or a chemical mechanical polishing (CMP) process are performed on the conductive material layer until the second supporter layer 124x is exposed, thereby forming the plurality of bottom electrodes 162.

In some exemplary embodiments, the plurality of bottom electrodes 162 may be formed using a PVD process, a CVD process, a metal organic CVD (MOCVD) process, an ALD process, or a metal organic ALD (MOALD) process.

In some exemplary embodiments, the bottom electrodes 162 may include a material such as titanium (Ti), a titanium nitride (TiN), a tantalum nitride (TaN), platinum (Pt), tungsten (W), doped polysilicon (poly-Si), or doped silicon germanium (SiGe). While the bottom electrodes 162 in the present exemplary embodiment are illustrated as having a pillar shape, they are not limited thereto. For example, the bottom electrodes 162 may also have a cylindrical shape.

Figure 19A:
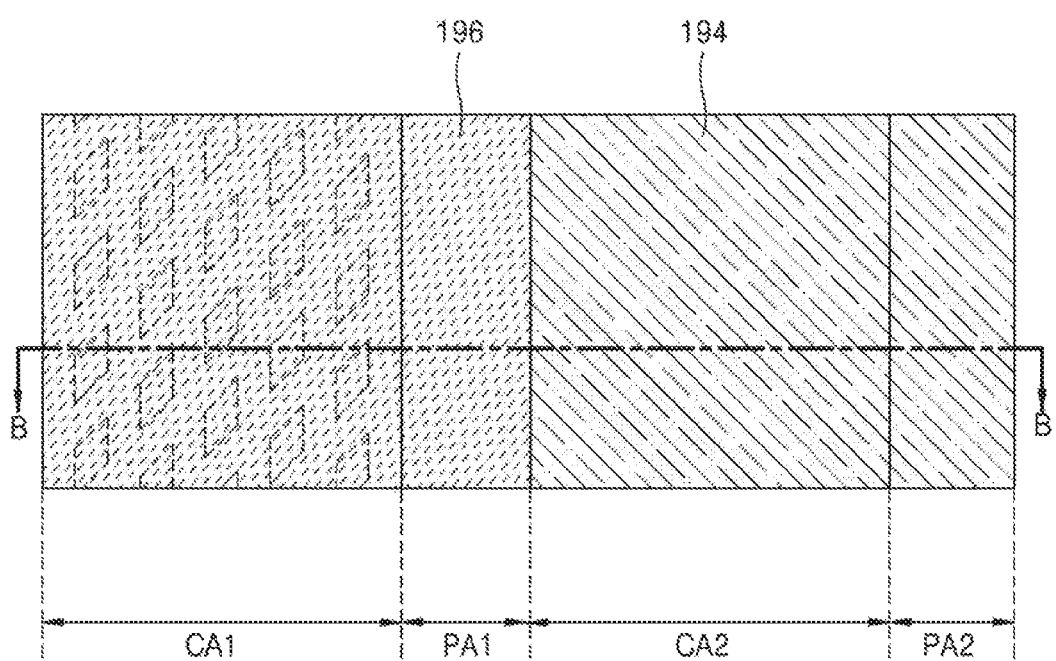
Figure 19B:
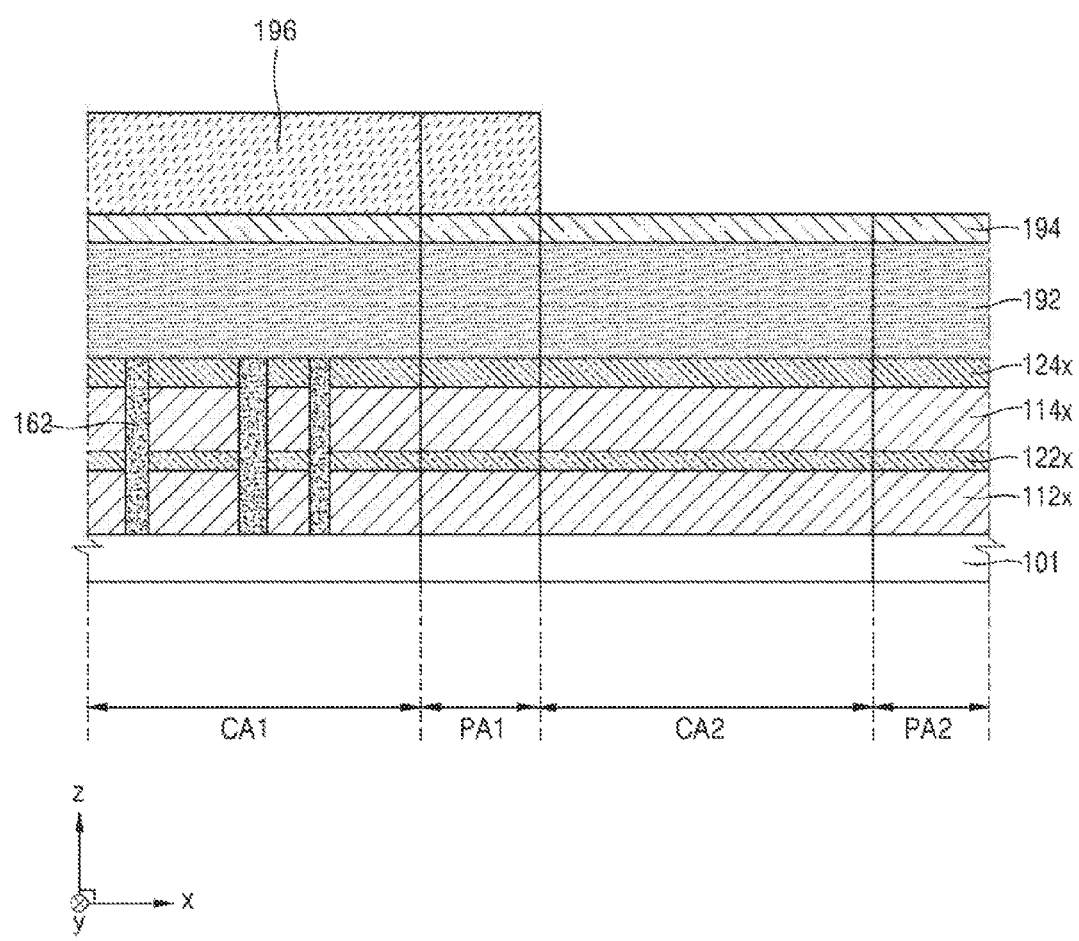

Referring to FIGS. 19A and 19B, a carbon-containing layer 192 and a rework layer 194 sequentially covering top surfaces of the second supporter layer 124x and the bottom electrodes 162 in the first and second cell areas CA1 and CA2 and the first and second peripheral areas PA1 and PA2 may be formed, and a blank mask layer 196 covering a top surface of the rework layer 194 of the first cell area CA1 and the first peripheral area PA1 may be formed.

In some exemplary embodiments, the carbon-containing layer 192 may be, for example, an amorphous carbon layer (ACL), and the rework layer 194 may be, for example, a silicon oxynitride layer.

The blank mask layer 196 may include a material having a different etching selectivity with respect to the carbon-containing layer 192 and the rework layer 194. The blank mask layer 196 may include at least one of, for example, silicon oxide, silicon nitride, a metal layer, a photoresist, a SOG, and a SOH.

In some exemplary embodiments, the carbon-containing layer 192, the rework layer 194, and the blank mask layer 196 may each be formed using a PVD process, a CVD process, an ALD process, or a spin coating process.

Figure 20A:
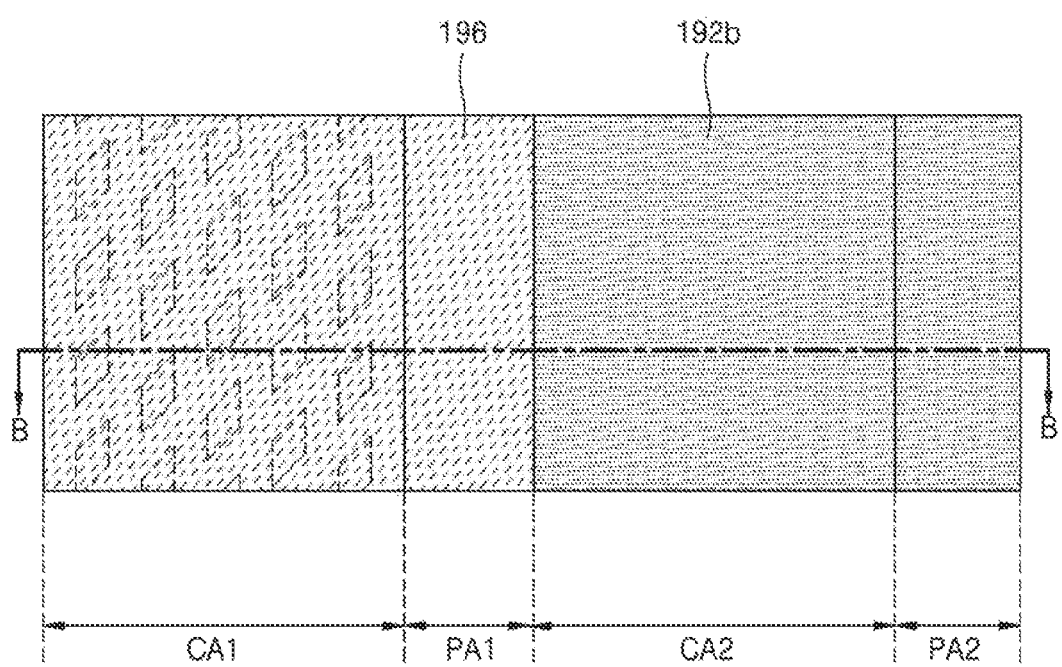
Figure 20B:
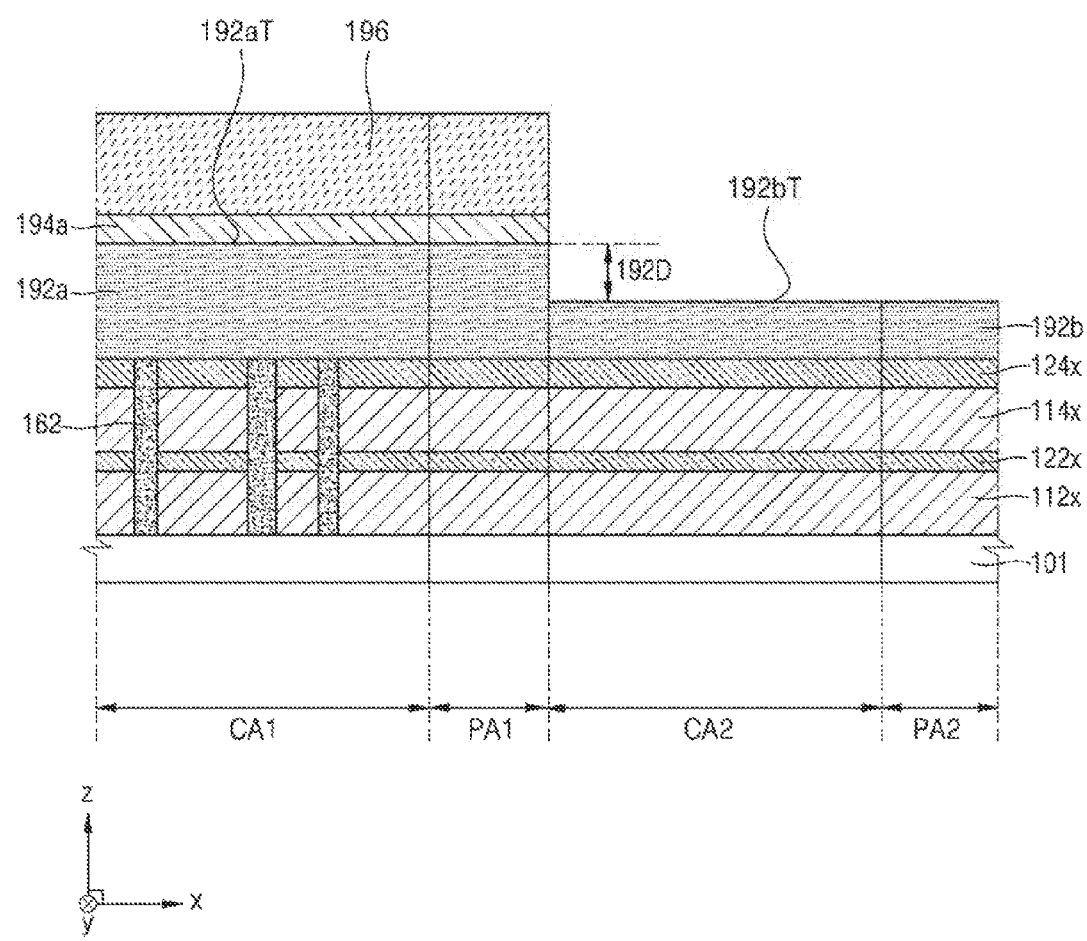

Referring to FIGS. 20A and 20B, a portion of an upper portion of the carbon-containing layer 192 (see FIGS. 19A and 19B) and the rework layer 194 are removed from the second cell area CA2 and the second peripheral area PA2 by using the blank mask layer 196 as an etching mask, thereby forming a first carbon-containing layer 192a and a first rework layer 194a located in the first cell area CA1 and the first peripheral area PA1 and a second carbon-containing layer 192b located in the second cell area CA2 and the second peripheral area PA2.

The first carbon-containing layer 192a and the second carbon-containing layer 192b may be etched to have a step that is sufficient to cause defocusing in an exposure process performed to form a supporter mask pattern 198, which will be described below with reference to FIGS. 22A and 22B. For example, a height difference 192D between a top surface 192aT of the first carbon-containing layer 192a and a top surface 192bT of the second carbon-containing layer 192b may be from about 2000 Å to about 3000 Å. However, the height difference 192D that allows the defocusing to occur may vary according to a type of exposure equipment, and thus is not limited thereto.

Figure 21A:
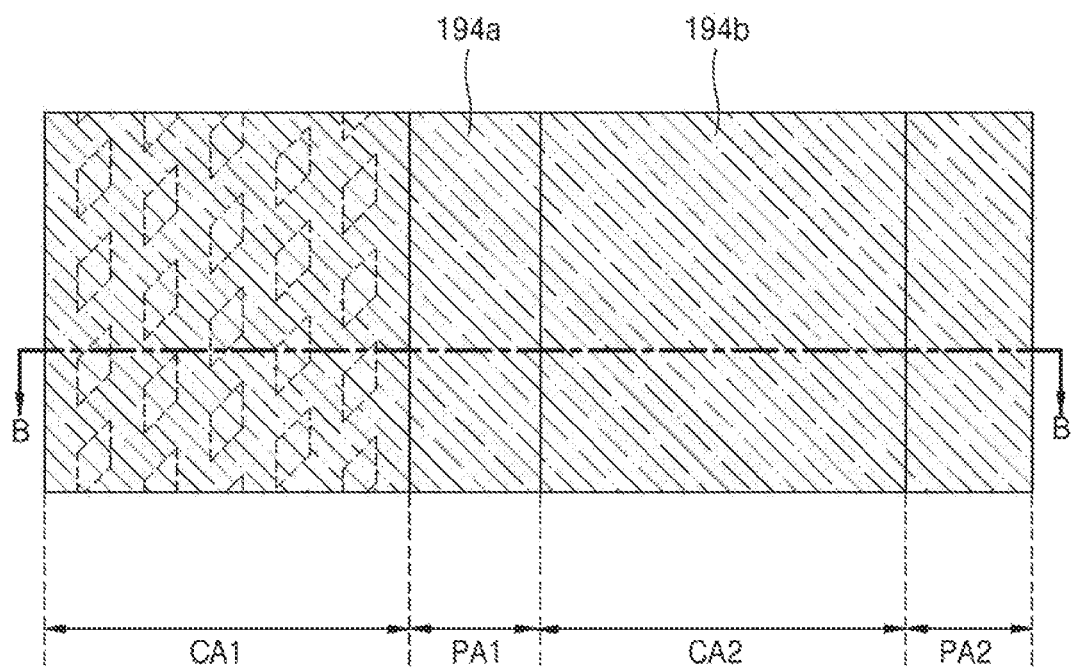
Figure 21B:
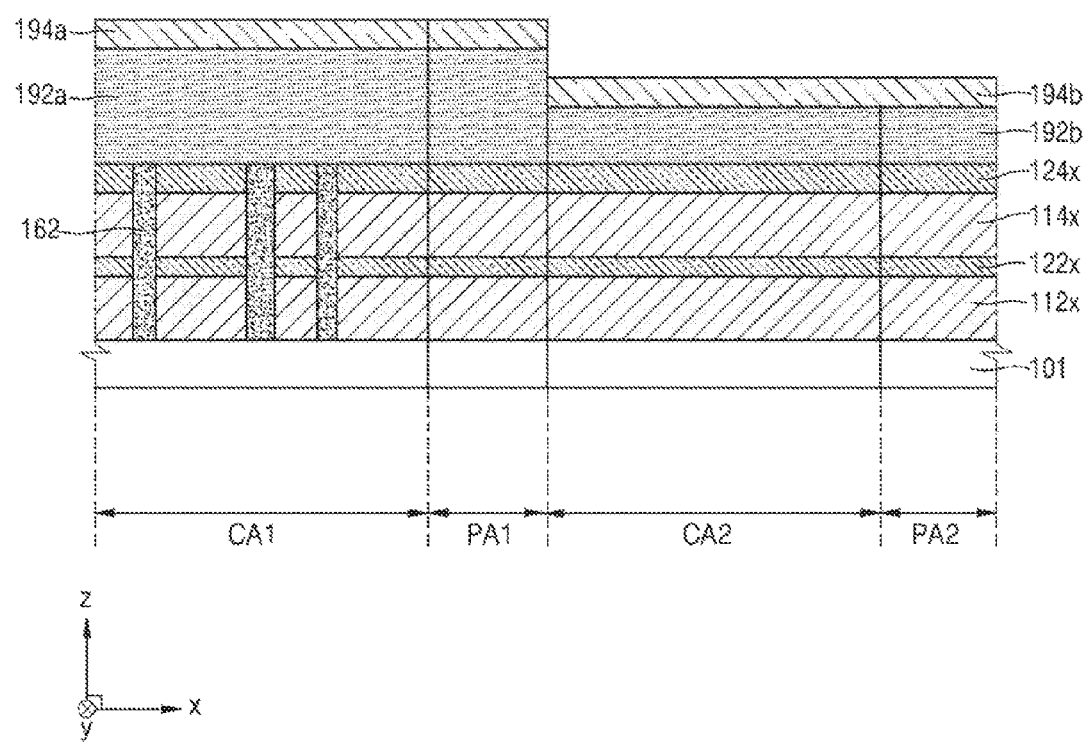

Referring to FIGS. 21A and 21B, a second rework layer 194b covering the second carbon-containing layer 192b may be formed. In some embodiments of the inventive concept, the second rework layer 194b may be omitted.

Figure 22A:
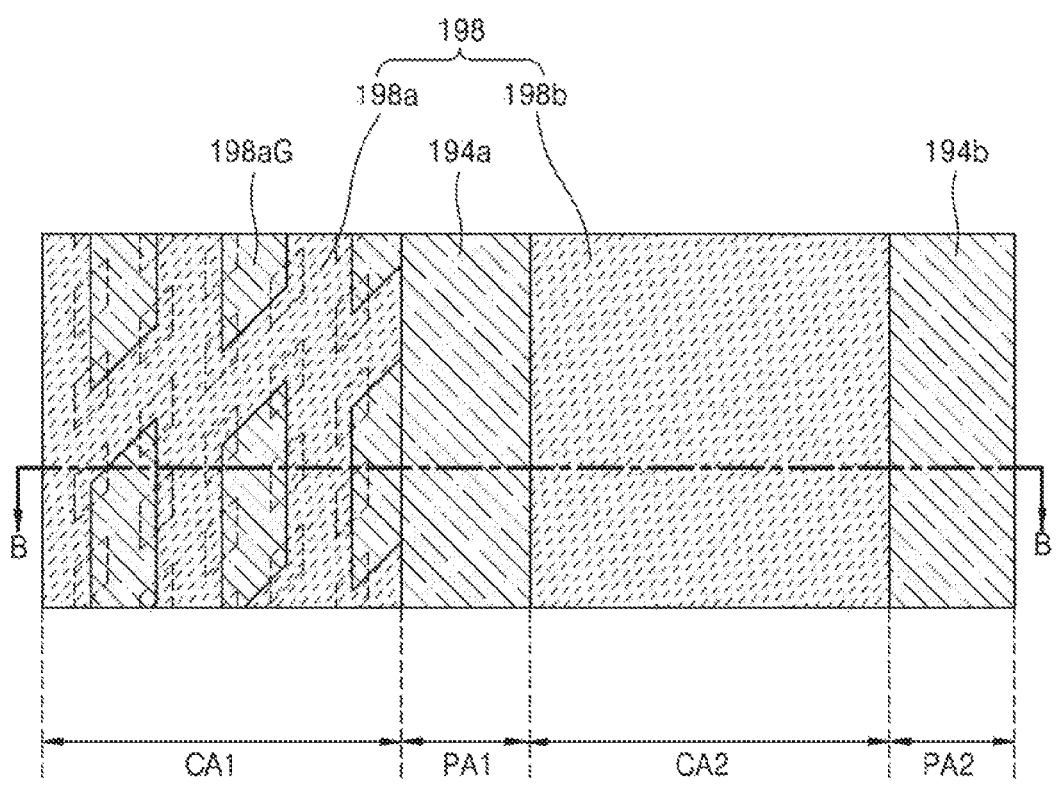
Figure 22B:
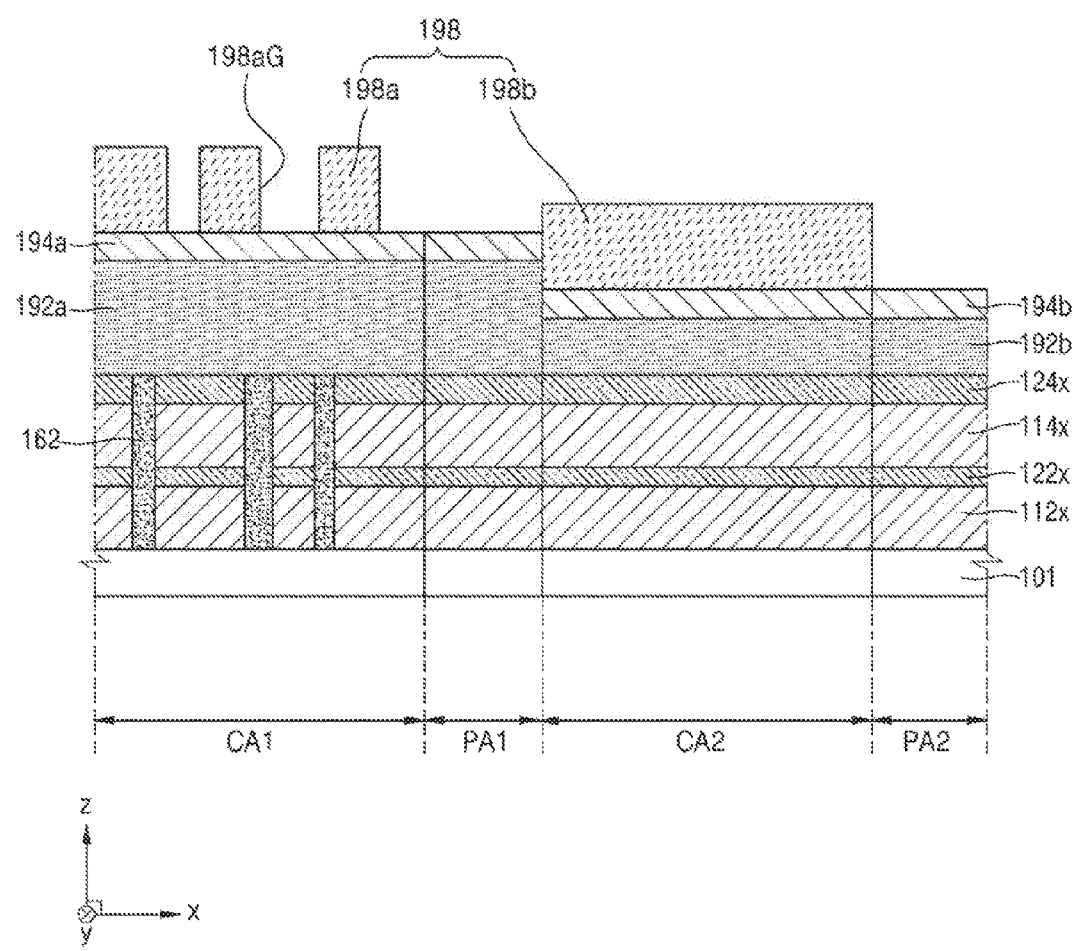

Referring to FIGS. 22A and 22B, a supporter mask pattern 198 may be formed on the first rework layer 194a in the first cell area CA1 and on the second rework layer 194b in the second cell area CA2.

The supporter mask pattern 198 may include a first supporter mask pattern 198a located in the first cell area CA1 and a second supporter mask pattern 198b located in the second cell area CA2. As the first and second rework layers 194b and 194b have a step between each other, the first and second supporter mask patterns 198a and 198b may also be arranged with a step therebetween.

In some exemplary embodiments, the first and second supporter mask patterns 198a and 198b may be formed by forming a photoresist layer (not shown) covering the first and second cell areas CA1 and CA2, and then performing an exposure process on a portion of the photoresist layer, and then developing the exposed portion of the photoresist layer.

As the first and second supporter mask patterns 198a and 198b are disposed with a step therebetween, the exposure process may be performed such that the photoresist layer formed in the first cell area CA1 is focused, and the photoresist layer formed in the second cell area CA2 is defocused. Thus, a plurality of opening portions 198aG are formed in the first supporter mask pattern 198a of the first cell area CA1, but the second supporter mask pattern 198b in the second cell area CA2 is formed to cover the entire second cell area CA2 without an opening.

Figure 23A:
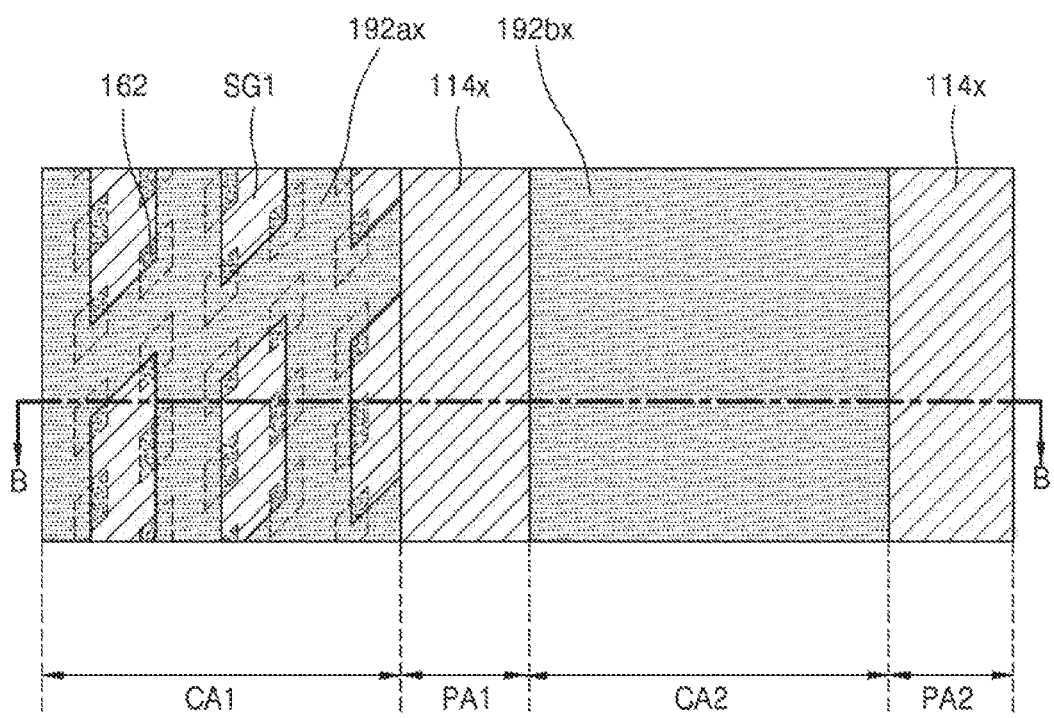
Figure 23B:
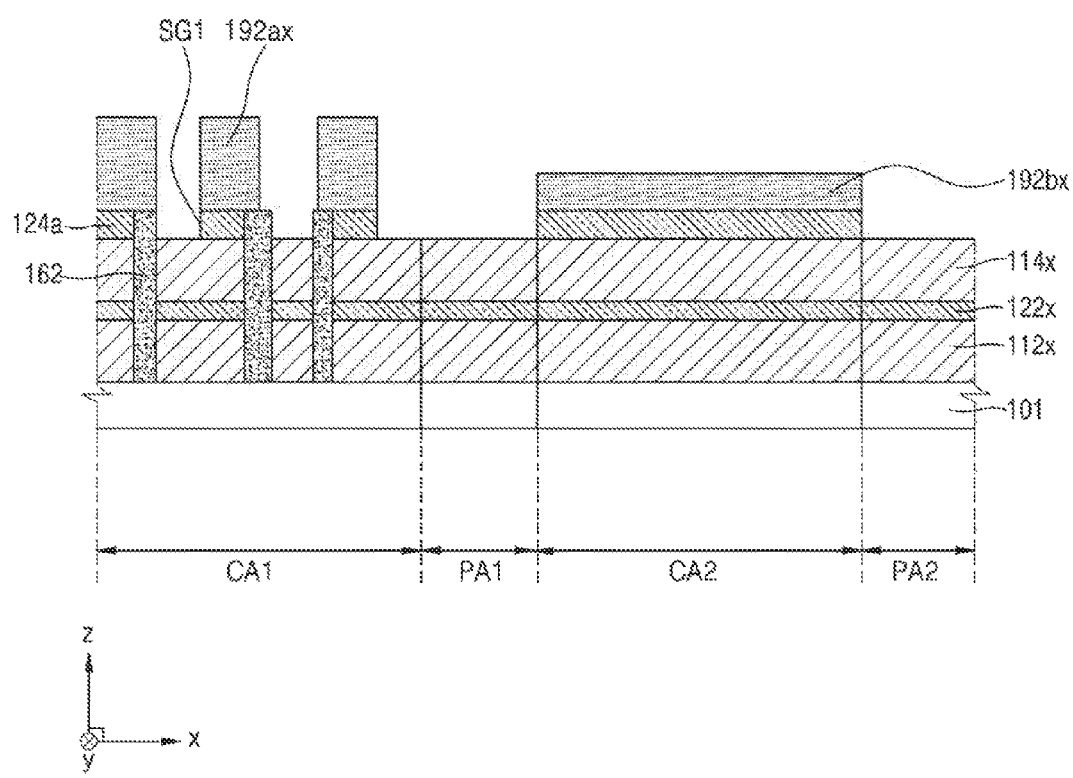

Referring to FIGS. 23A and 23B, the first and second rework layers 194a and 194b (see FIGS. 22A and 22B), the first and second carbon-containing layers 192a and 192b (see FIGS. 22A and 22B), and the second supporter layer 124x (see FIGS. 22A and 22B) may be etched by using the supporter mask pattern 198 (see FIGS. 22A and 22B) as an etching mask.

According to the etching process described above, the second supporter 124a and a third supporter mask pattern 192ax located in the first cell area CA1 and the second supporter film 124b and a fourth supporter mask pattern 192bx located in the second cell area CA2 are formed, and the first and second rework layers 194a and 194b (see FIGS. 22A and 22B), the first and second carbon-containing layers 192a and 192b (see FIGS. 22A and 22B), and the second supporter layer 124x (see FIGS. 22A and 22B) located in the first and second peripheral areas PA1 and PA2 may be removed.

The second supporter 124a located in the first cell area CA1 includes a plurality of supporter openings SG1, and the second supporter film 124b located in the second cell area CA2 may cover the entire second cell area CA2 without an opening.

Figure 24A:
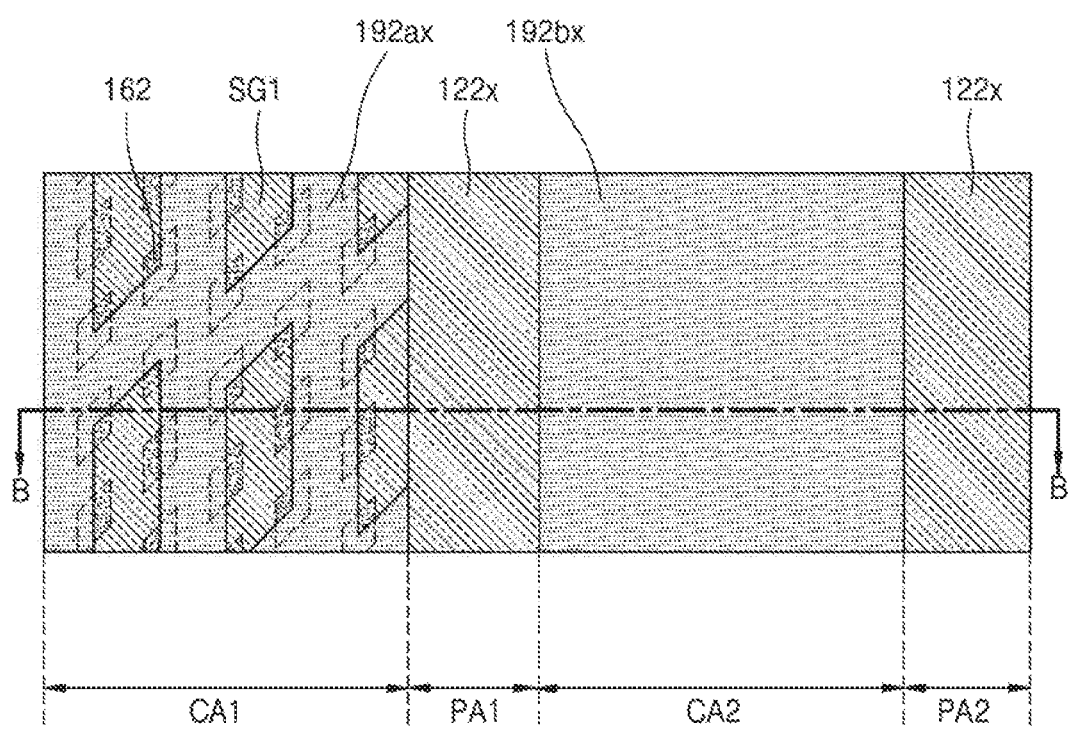
Figure 24B:
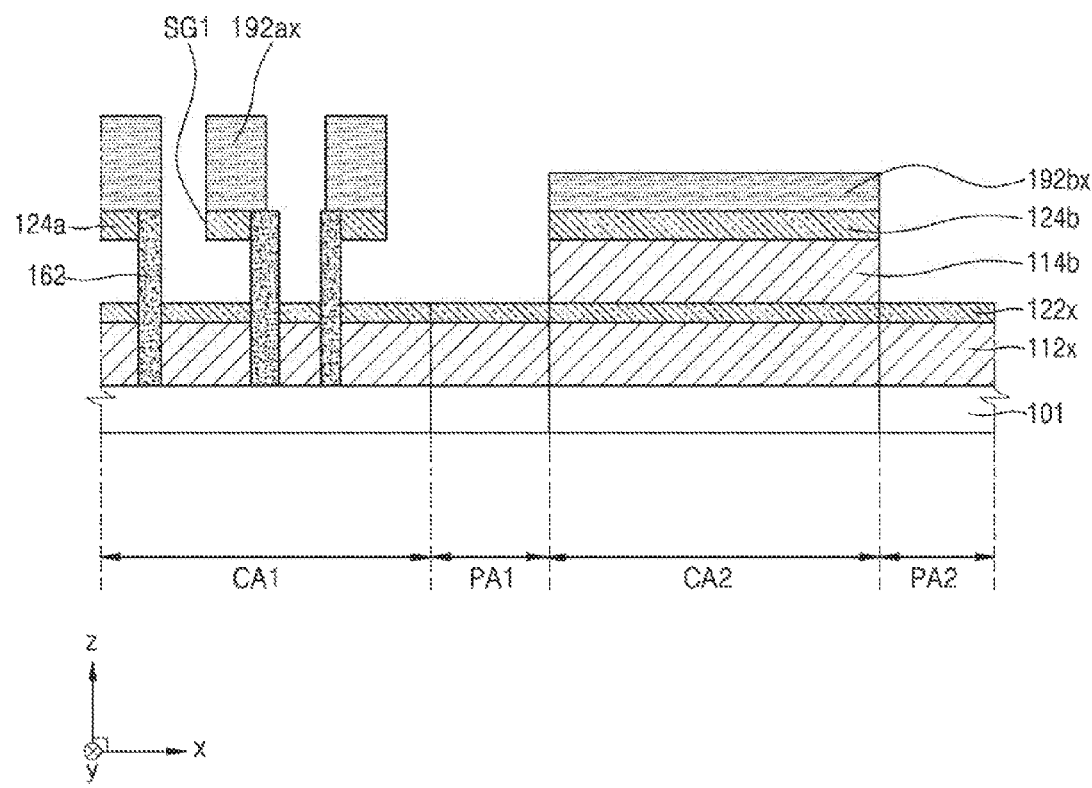

Referring to FIGS. 24A and 24B, the second mold layer 114x in the first cell area CA1 and the first and second peripheral areas PA1 and PA2 (see FIGS. 23A and 23B) may be removed to expose the first supporter layer 122x. The second mold layer 114x (see FIGS. 23A and 23B) located in the first cell area CA1 and the first and second peripheral areas PA1 and PA2 may be removed by using, for example, a list-off process using a Limulus amoebocyte lysate (LAL), a wet etching process, or an ashing and strip process.

During a process of removing the second mold layer 114x of the first cell area CA1 and the first and second peripheral areas PA1 and PA2 (see FIGS. 23A and 23B), the second mold film 114b located in the second cell area CA2 may be covered by the second supporter film 124b so that the second mold film 114b located in the second cell area CA2 is not removed.

Figure 25A:
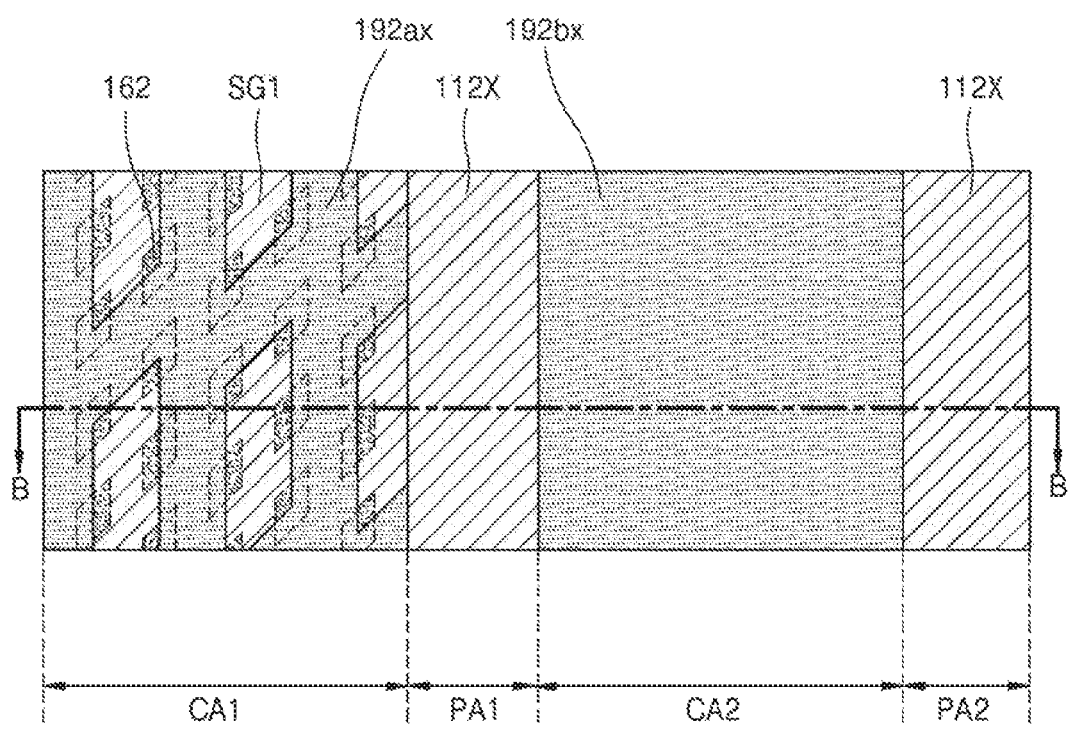
Figure 25B:
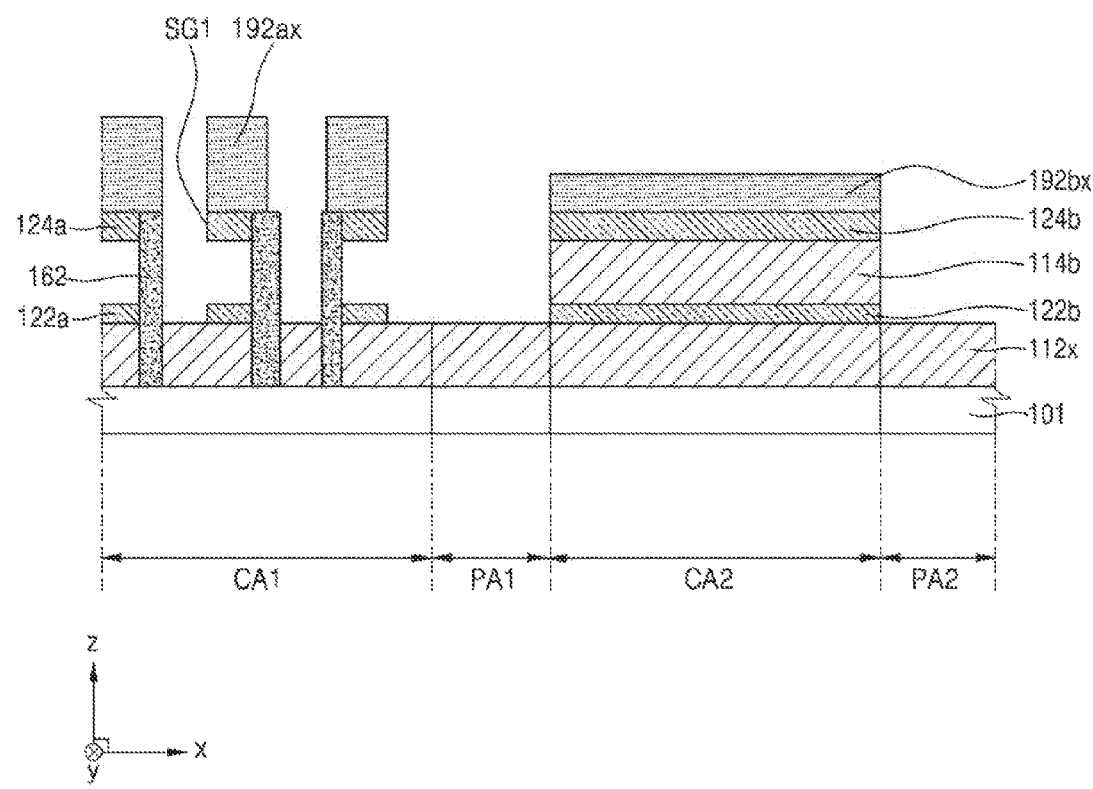

Referring to FIGS. 25A and 25B, by etching the first supporter layer 122x by using the third supporter mask pattern 192ax and the fourth supporter mask pattern 192bx as an etching mask, the first supporter 122a located in the first cell area CA1 and the first supporter film 122b located in the second cell area CA2 may be formed.

Figure 26A:
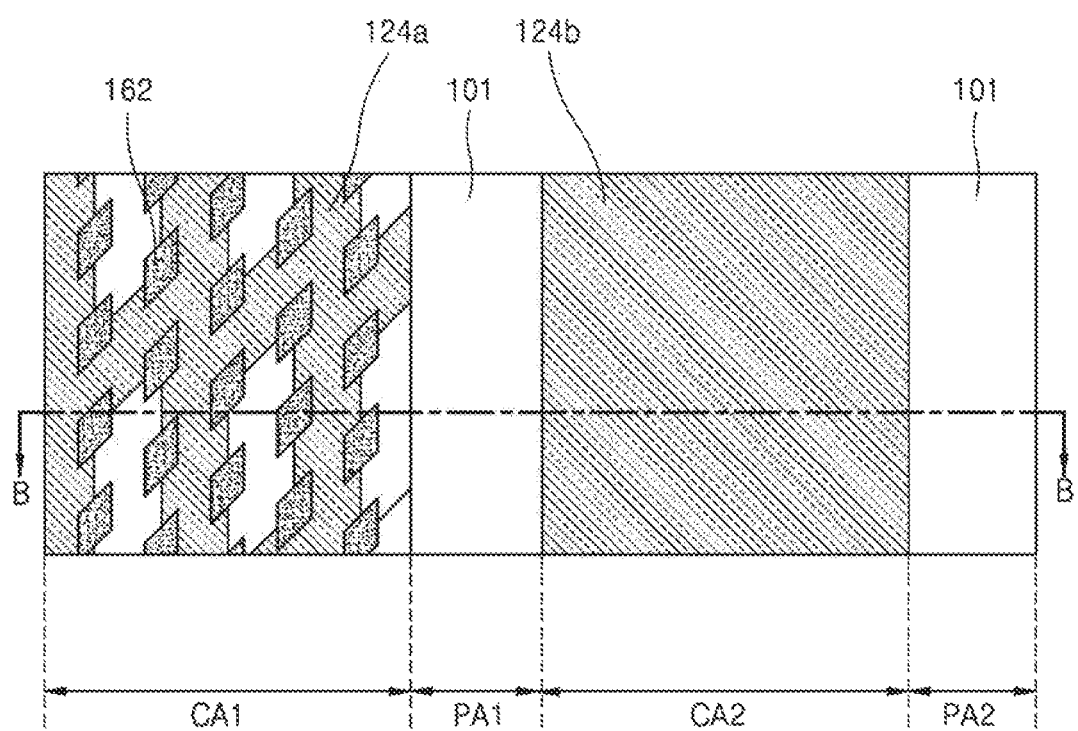
Figure 26B:
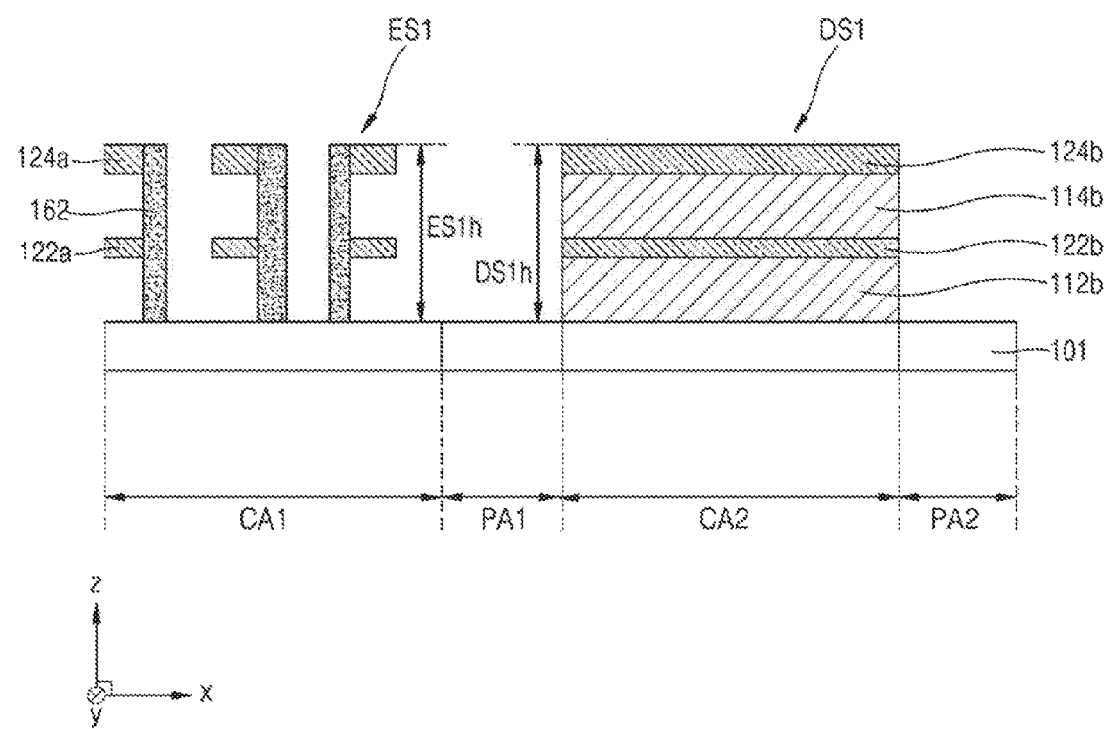

Referring to FIGS. 26A and 26B, by removing the third and fourth supporter mask patterns 192ax and 192bx (see FIGS. 25A and 25B) and the first mold layer 112x located in the first cell area CA1 and the first and second peripheral areas PA1 and PA2 (see FIGS. 25A and 25B), the bottom electrode structure ES located in the first cell area CA1 and the dummy structure DS1 located in the second cell area CA2 may be formed.

The third and fourth supporter mask patterns 192ax and 192bx (see FIGS. 25A and 25B) and the first mold layer 112x located in the first cell area CA1 and the first and second peripheral areas PA1 and PA2 (see FIGS. 25A and 25B) may be removed by using a list-off process using a LAL, a wet drying process, an ashing and strip process, or the like.

In some exemplary embodiments, the third and fourth supporter mask patterns 192ax and 192bx (see FIGS. 25A and 25B) and the first mold layer 112x located in the first cell area CA1 and the first and second peripheral areas PA1 and PA2 (see FIGS. 25A and 25B) may be simultaneously removed, but are not limited thereto.

In some exemplary embodiments, a length ES1h of the bottom electrode structure ES1 in a third direction (Z direction) perpendicular to a top surface of the bottom structure 101 may be substantially the same as a length DS1h of the dummy structure DS1 in the third direction (Z direction).

The dummy structure DS1 located in the second cell area CA2 of the preset exemplary embodiment is not patterned, unlike the bottom electrode structure ES1 located in the first cell area CA1, but is formed to cover the entire second cell area CA2. When the dummy structure DS1, which is not patterned, is formed in the second cell area CA2, falling or tearing of a capacitor that may occur in the edge area 20 (see FIG. 1) may be prevented or the likelihood of falling or tearing reduced.

At the same time, as the height ES1h of the bottom electrode structure ES1 is substantially the same the height DS1h of the dummy structure DS1, a variance in a subsequent planarization process may be controlled more easily. This will be described in detail below with reference to FIGS. 29A and 29B.

Figure 27A:
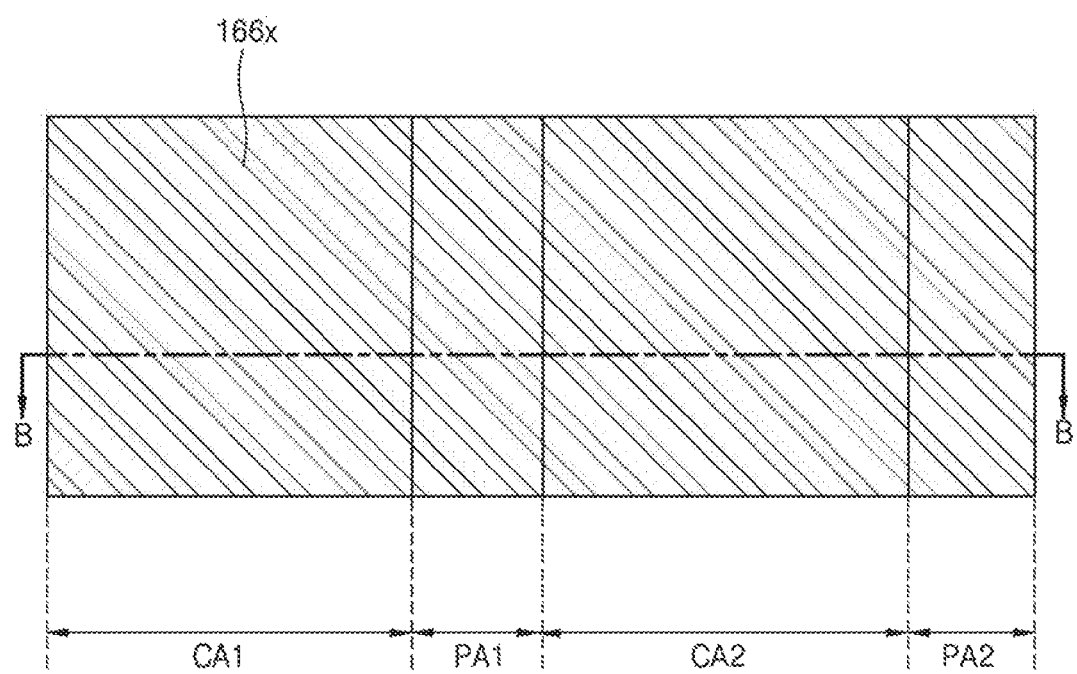
Figure 27B:
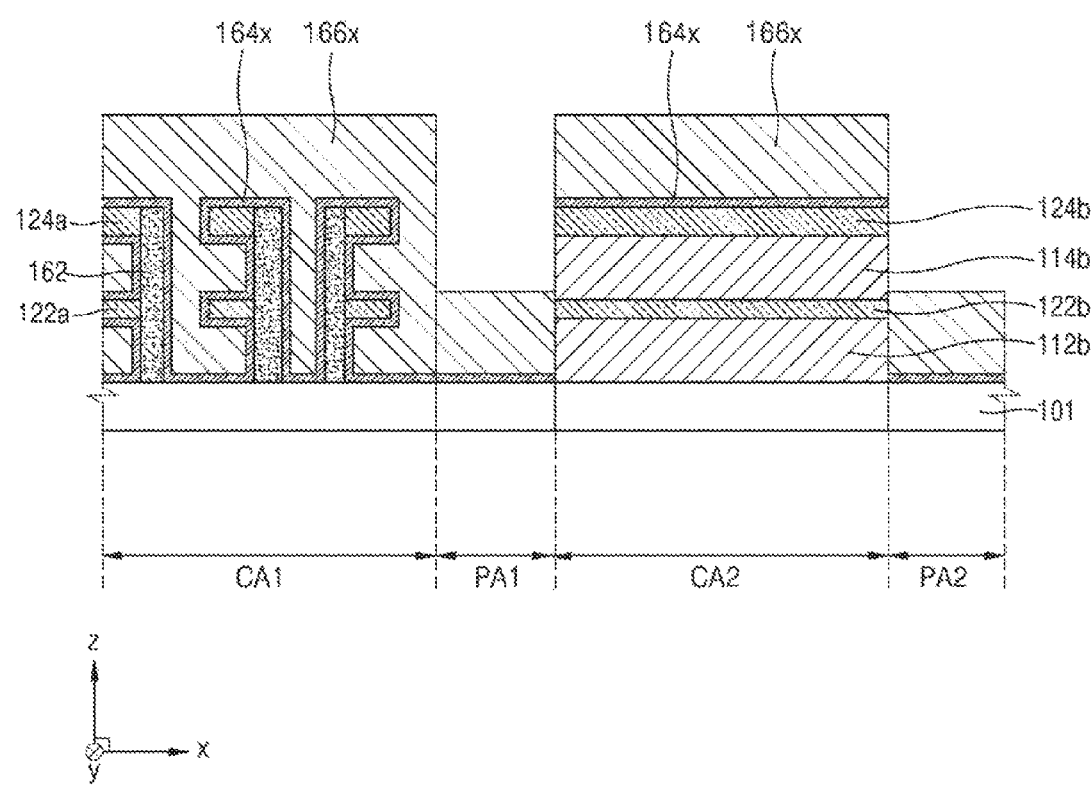

Referring to FIGS. 27A and 27B, a dielectric material layer 164x and a top electrode material layer 166x covering the first and second cell areas CA1 and CA2 and the first and second peripheral areas PA1 and PA2 may be sequentially formed.

In some exemplary embodiments, the dielectric material layer 164x may include, for example, a silicon oxide or a high-k dielectric material. The top electrode material layer 166x may include a material, such as titanium, titanium nitride, tantalum nitride, platinum, tungsten, doped polysilicon, or doped silicon germanium.

The top electrode material layer 166x may be formed using, for example, a PVD process, a CVD process, a MOCVD process, an ALD process, or a MOALD process, but is not limited thereto.

Figure 28A:
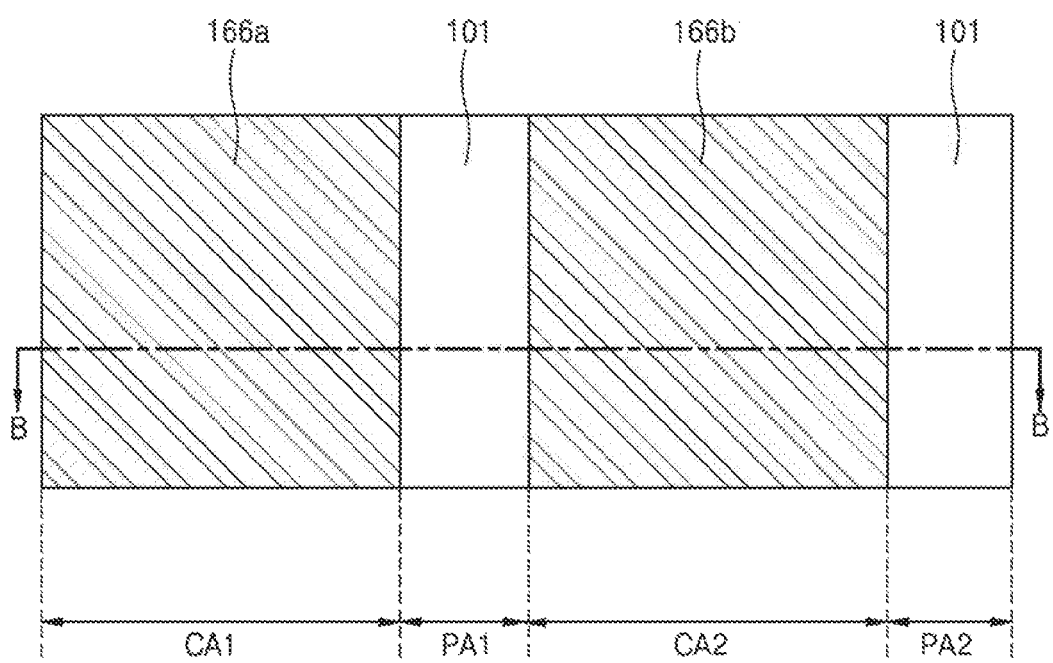
Figure 28B:
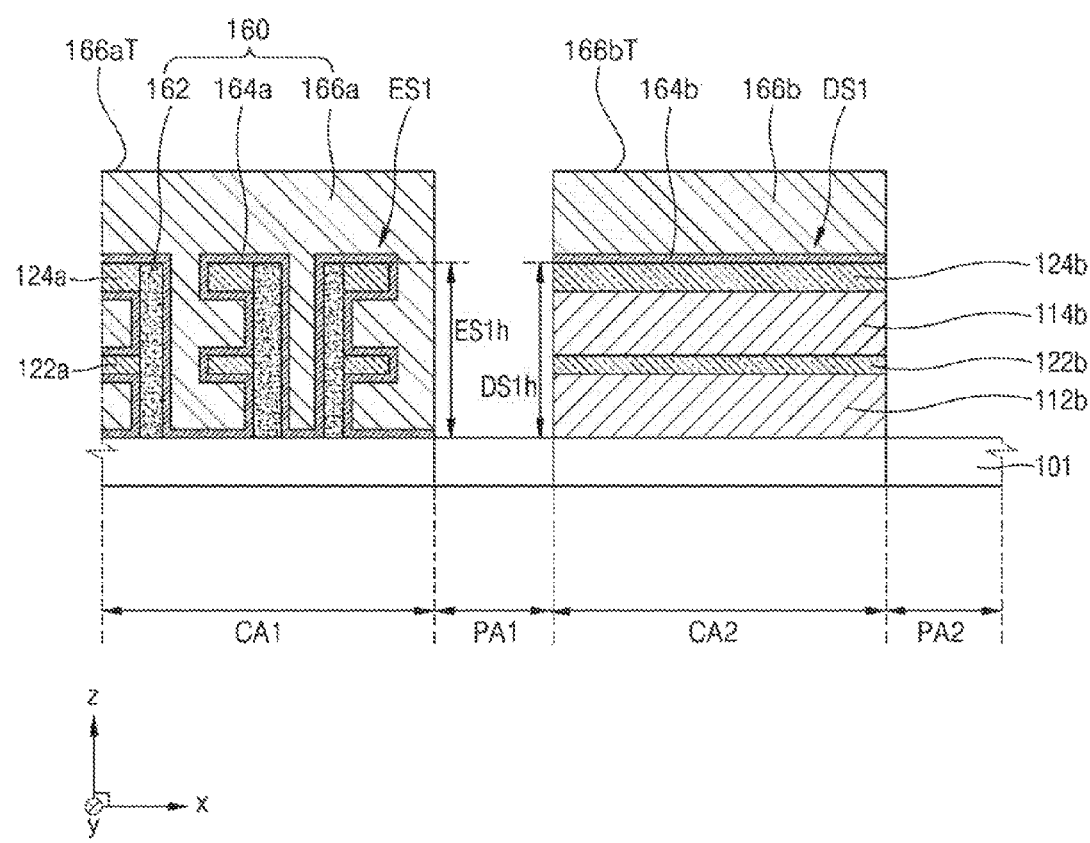

Referring to FIGS. 28A and 28B, after forming a cell close mask layer (not shown) covering the first and second cell areas CA1 and CA2, an anisotropic etching process is performed by using the cell close mask layer as an etching mask, to thereby remove the dielectric material layer 164x (see FIGS. 27A and 27B) and the top electrode material layer 166x (see FIGS. 27A and 27B) located in the first and second peripheral areas PA1 and PA2 and, thus, form the gate dielectric layer 164a and the top electrode 166a located in the first cell area CA1 and the dielectric layer 164b and the top electrode 166b located in the second cell area CA2. Accordingly, the first and second cell areas CA1 and CA2 may be electrically insulated from each other.

As described above with reference to FIGS. 26A and 26B, the length ES1h of the bottom electrode structure ES1 in the third direction (Z direction) may be substantially the same as the length DS1h of the dummy structure DS1 in the third direction (Z direction). Accordingly, a top surface 166aT of the top electrode 166a located in the first cell area CA1 may be at substantially a same level as a top surface 166bT of the top electrode 166b located in the second cell area CA2.

Figure 29A:
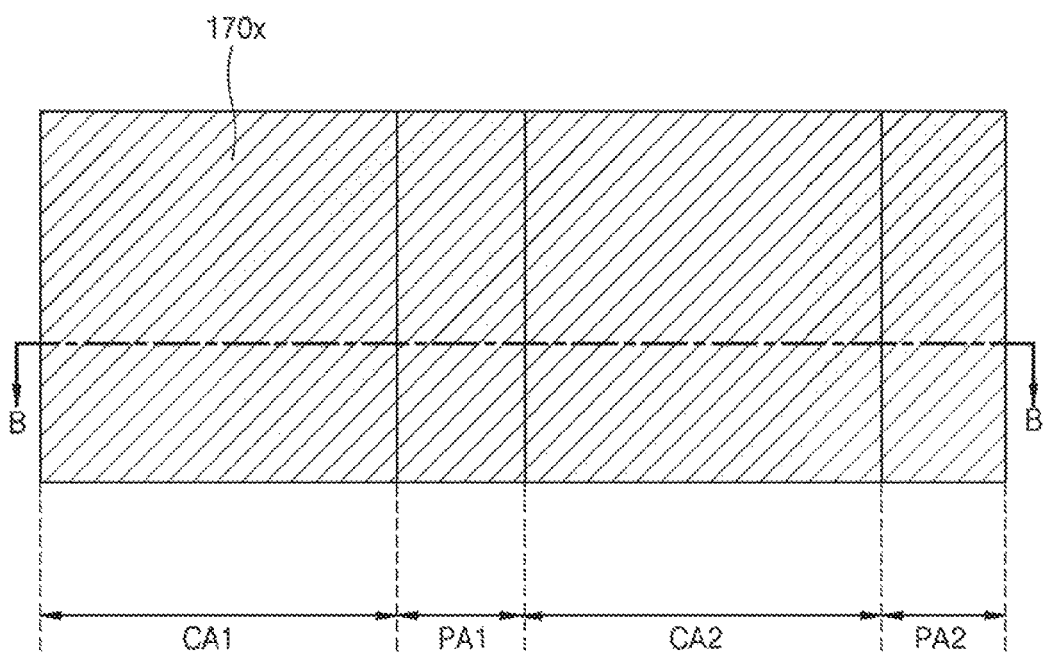
Figure 29B:
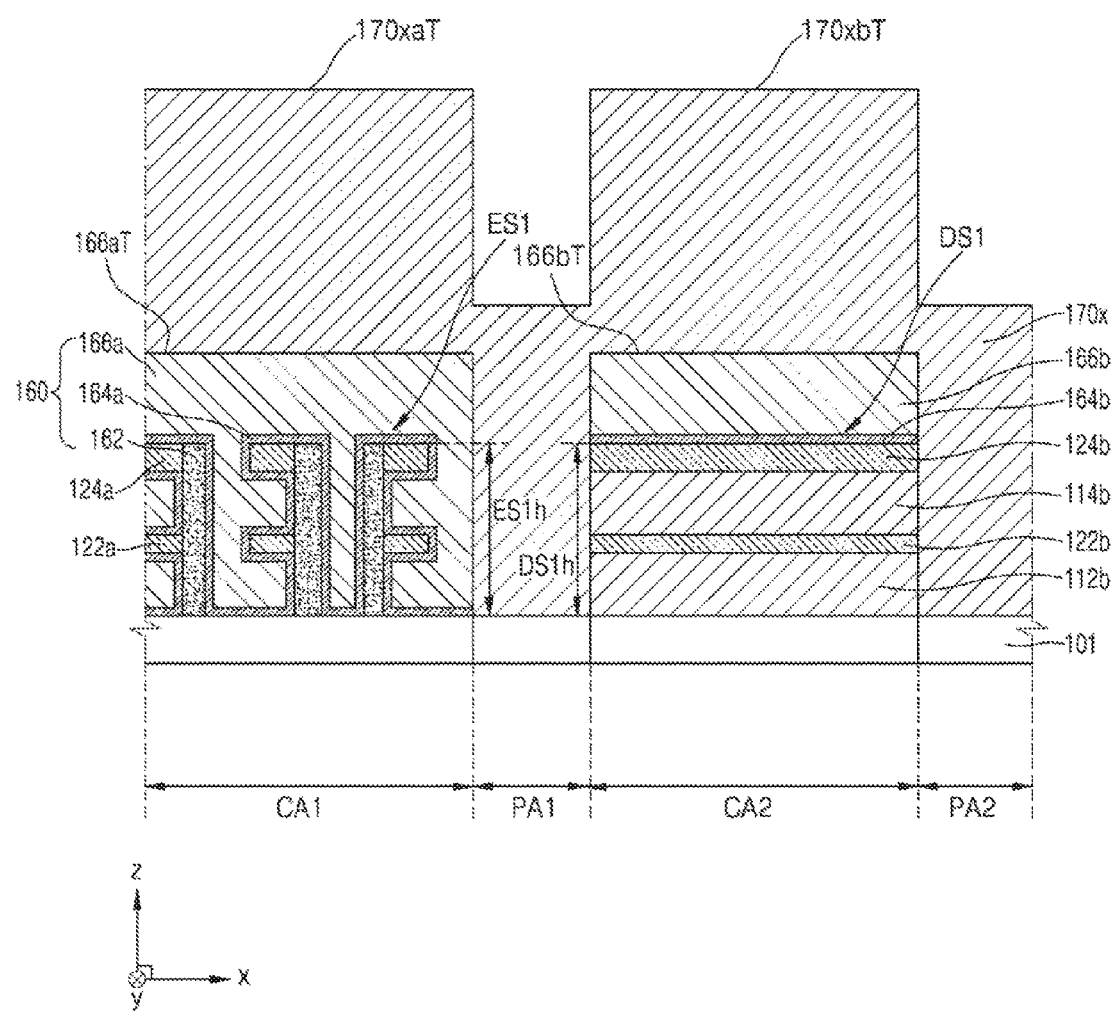

Referring to FIGS. 29A and 29B, an interlayer insulation material layer 170x covering the first and second cell areas CA1 and CA2 and the first and second peripheral areas PA1 and PA2 may be formed. In some exemplary embodiments, the interlayer insulation material layer 170x may include, for example, silicon oxide.

As described above with reference to FIGS. 26A and 26B, the top surface 166aT of the top electrode 166a located in the first cell area CA1 may be at substantially the same level as the top surface 166bT of the top electrode 166b located in the second cell area CA2. Accordingly, a top surface 170xaT of the interlayer insulation material layer 170x located in the first cell area CA1 may be at substantially a same level as a top surface 170xbT of the interlayer insulation material layer 170x located in the second cell area CA2.

When the top surface 170xaT of the interlayer insulation material layer 170x located in the first cell area CA1 of the chip area 10 (see FIG. 1) is at substantially the same level as the top surface 170xbT of the interlayer insulation material layer 170x located in the second cell area CA2 of the edge area 20 (see FIG. 1), the chip area 10 and the edge area 20 may have a uniform top surface without an excessively planarized portion.

Figure 30A:
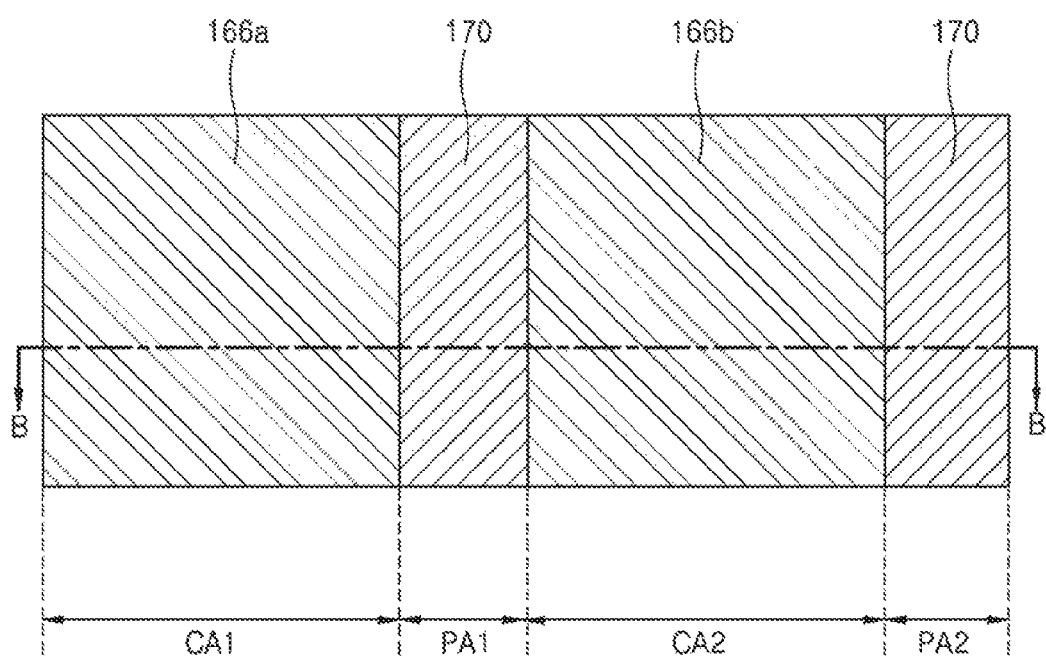
Figure 30B:
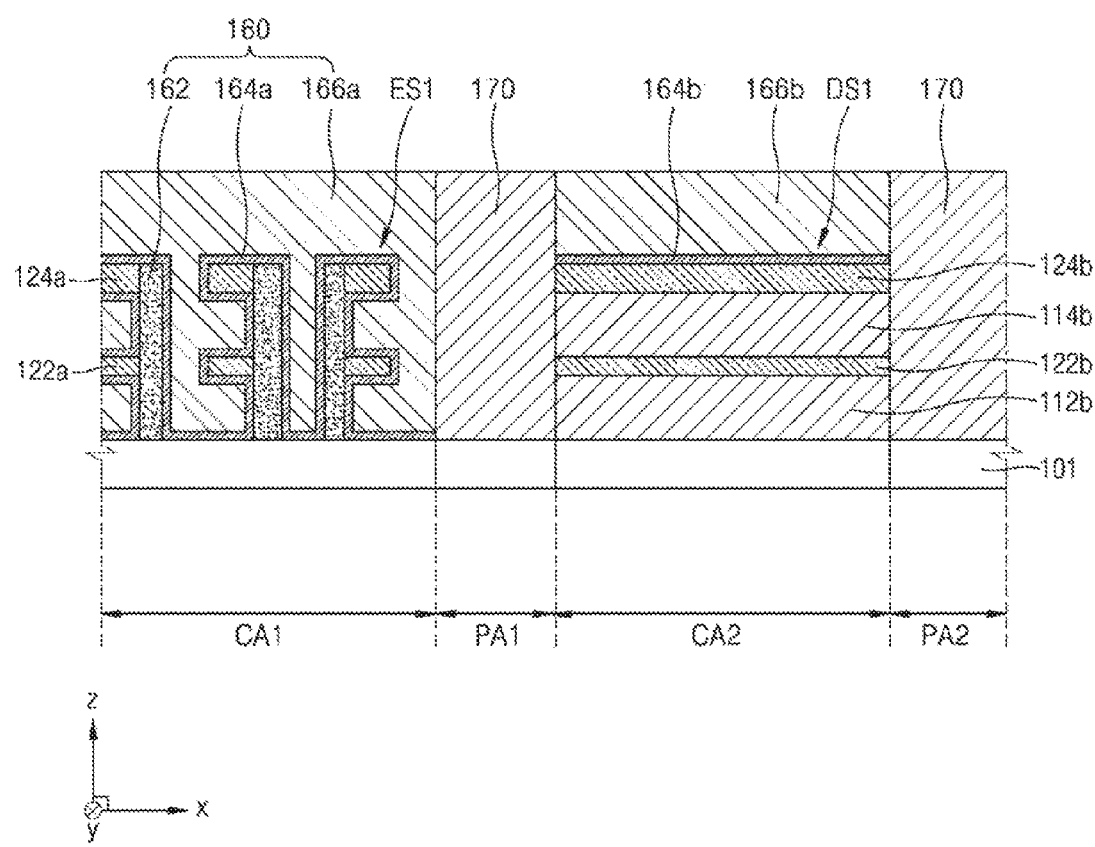

Referring to FIGS. 30A and 30B, until each of the top surfaces 166aT and 166bT of the top electrodes 166a and 166b is exposed, a planarization process, such as a CMP process, may be performed on the interlayer insulation material layer 170x to thereby form an interlayer insulation layer 170 covering each of the first and second peripheral areas PA1 and PA2.

Figure 31A:
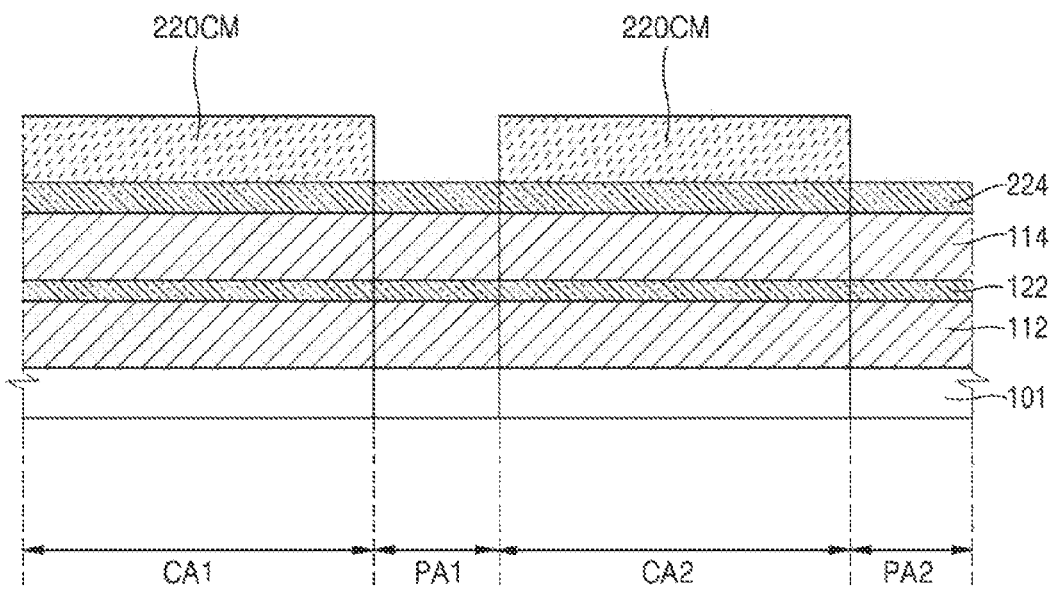
FIGS. 31A through 31N are cross-sectional views illustrating a method of manufacturing a semiconductor device according to a process order, according to another exemplary embodiment of the inventive concept.
Figure 31B:
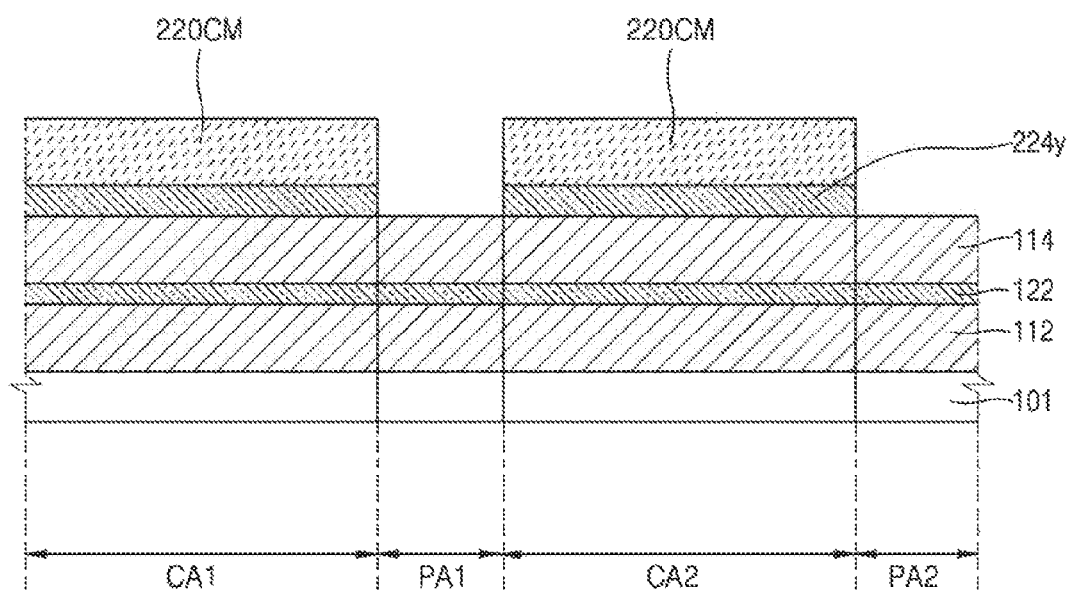
Figure 31C:
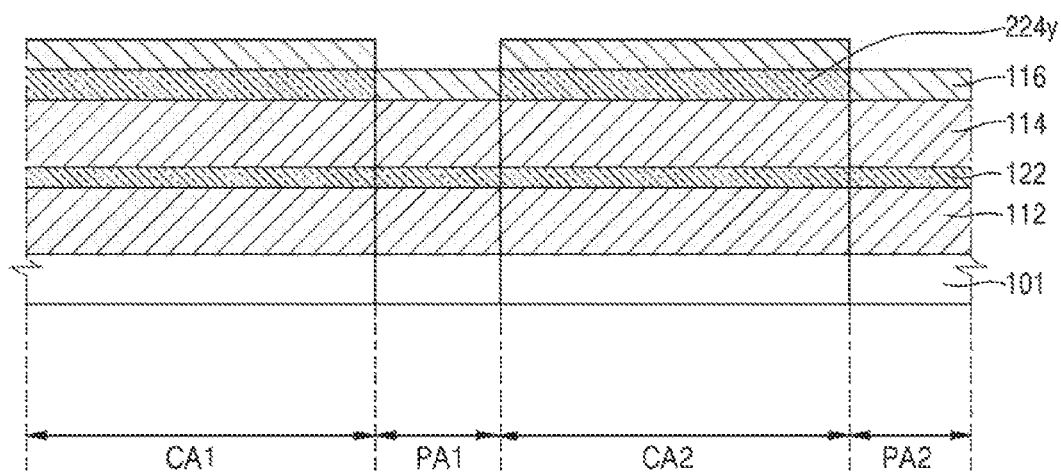
Figure 31D:
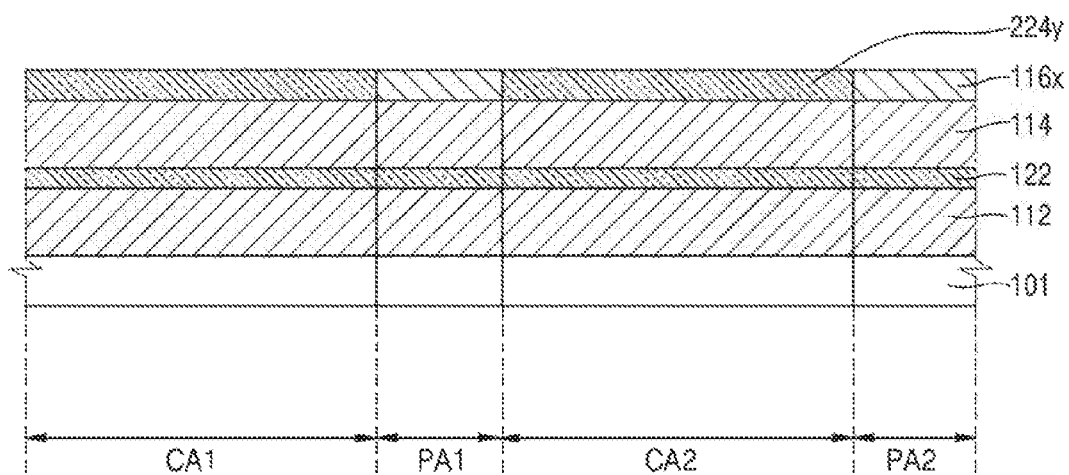
Figure 31E:
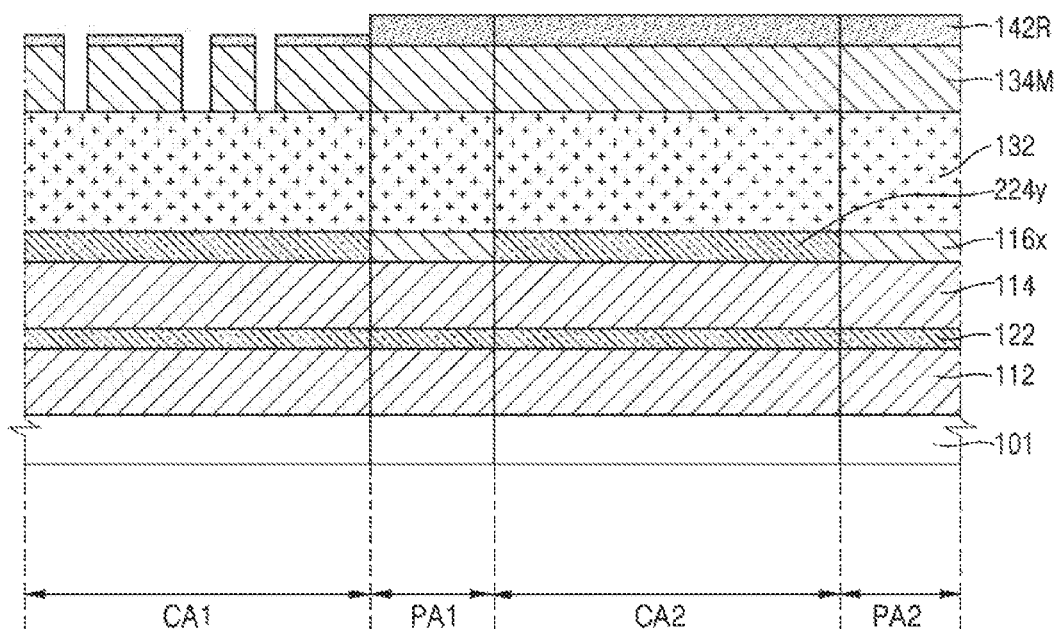
Figure 31F:
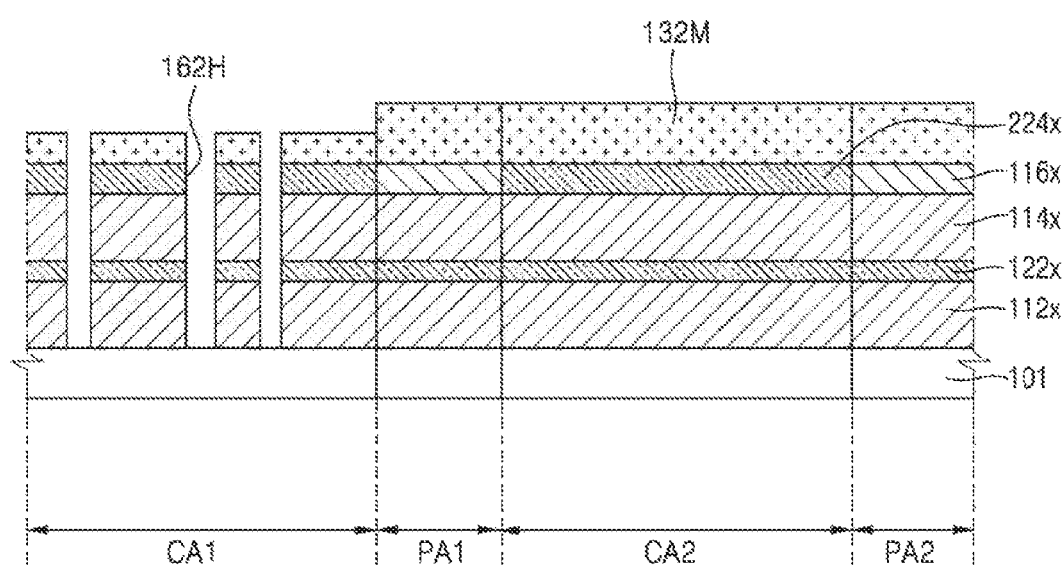
Figure 31G:
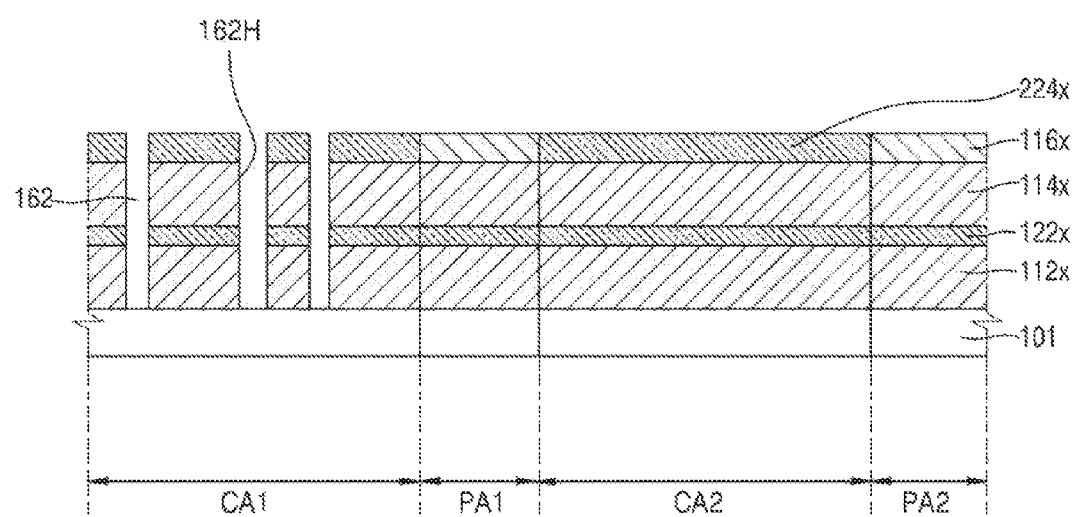
Figure 31H:
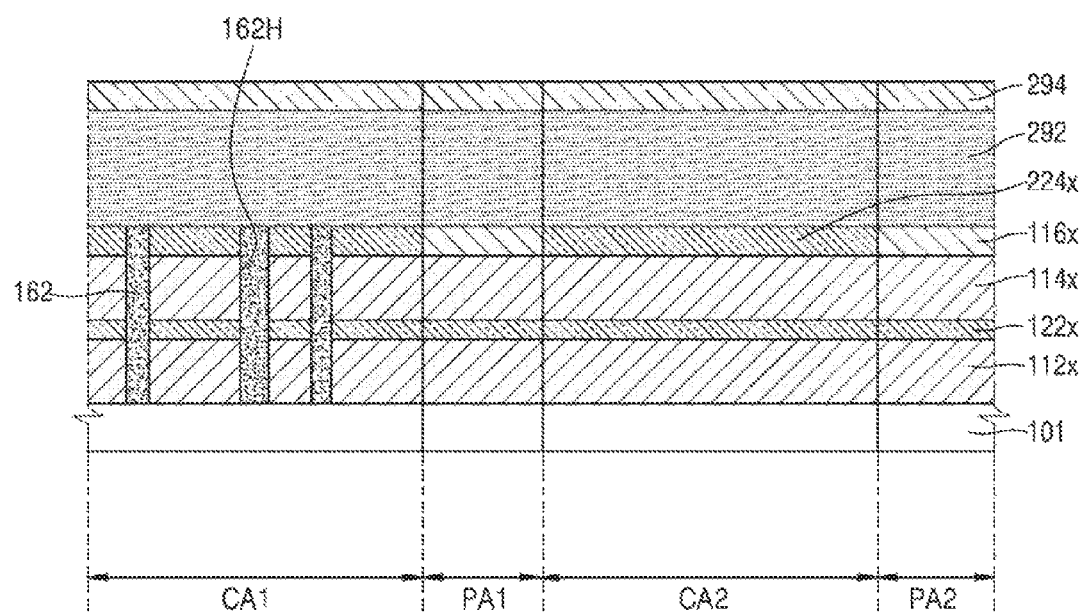
Figure 31I:
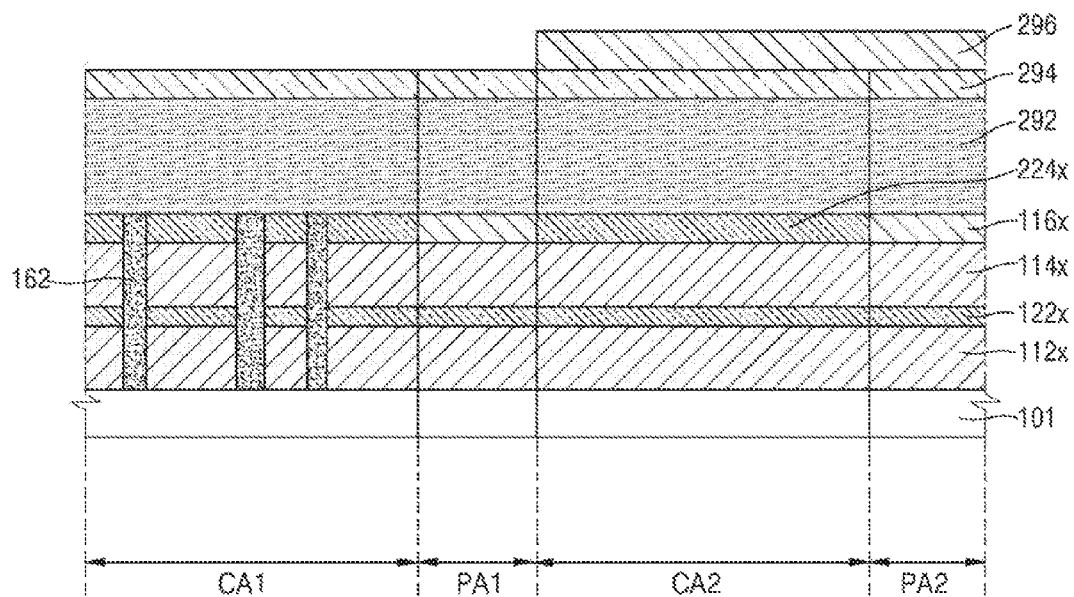
Figure 31J:
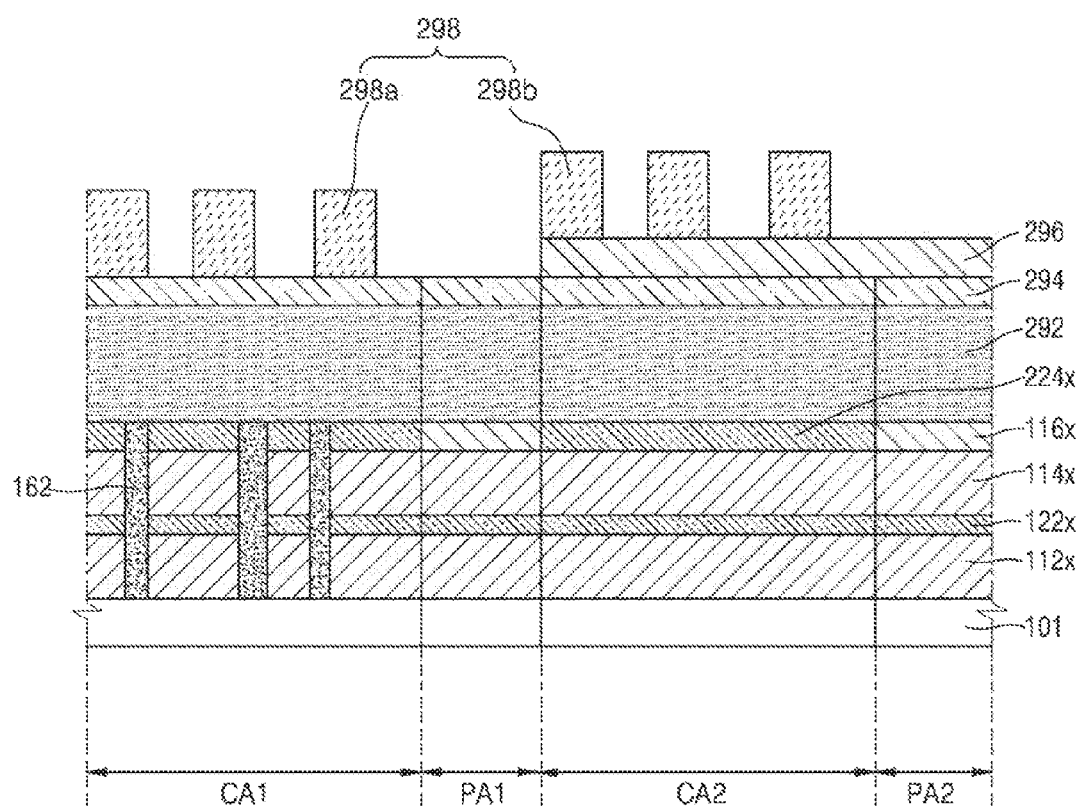
Figure 31K:
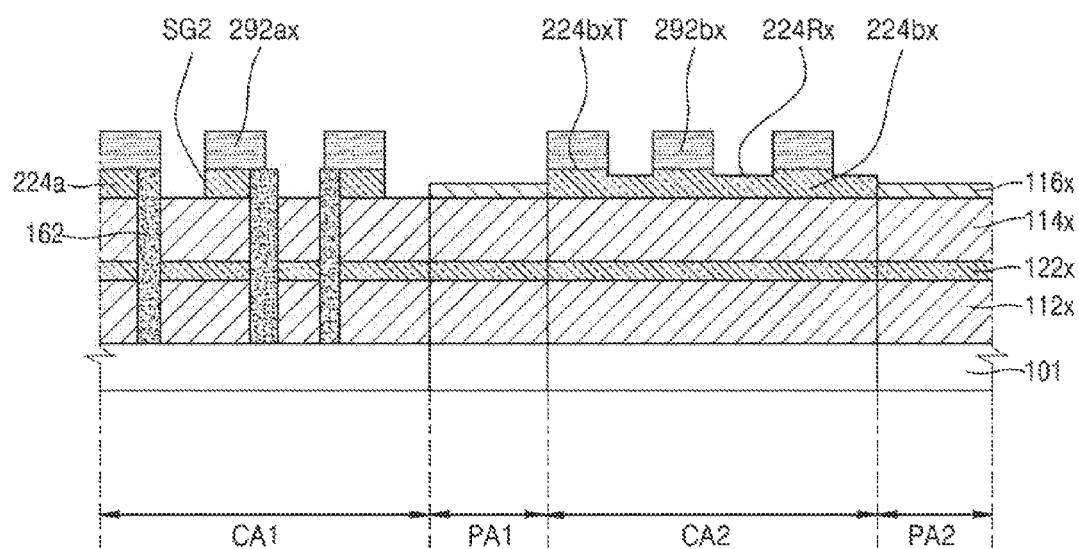
Figure 31L:
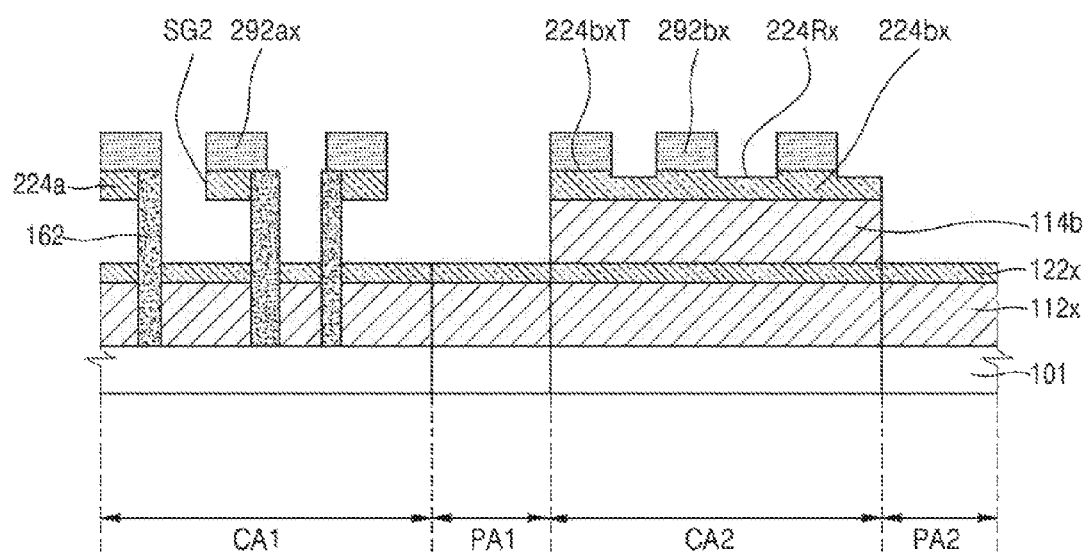
Figure 31M:
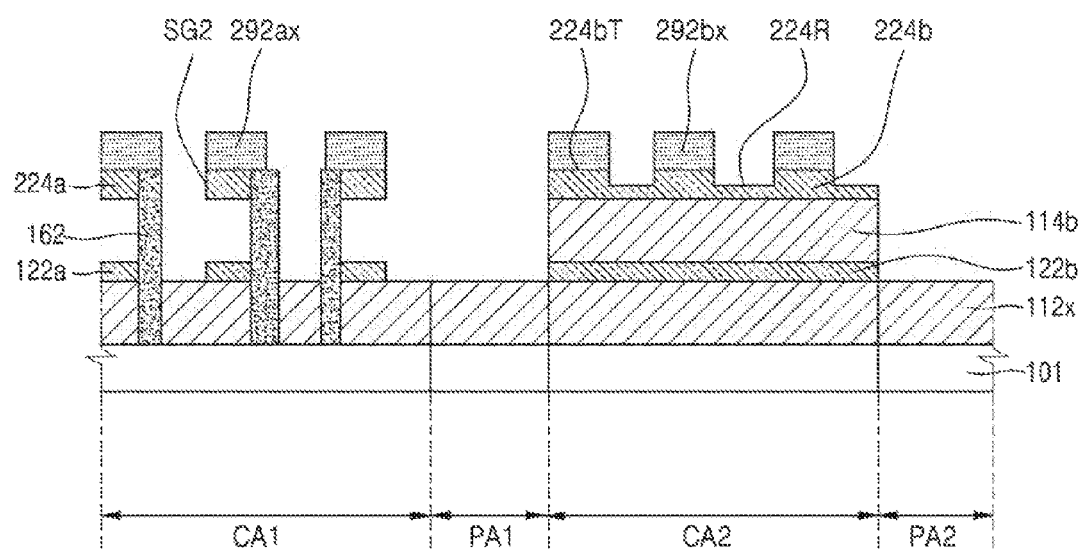
Figure 31N:
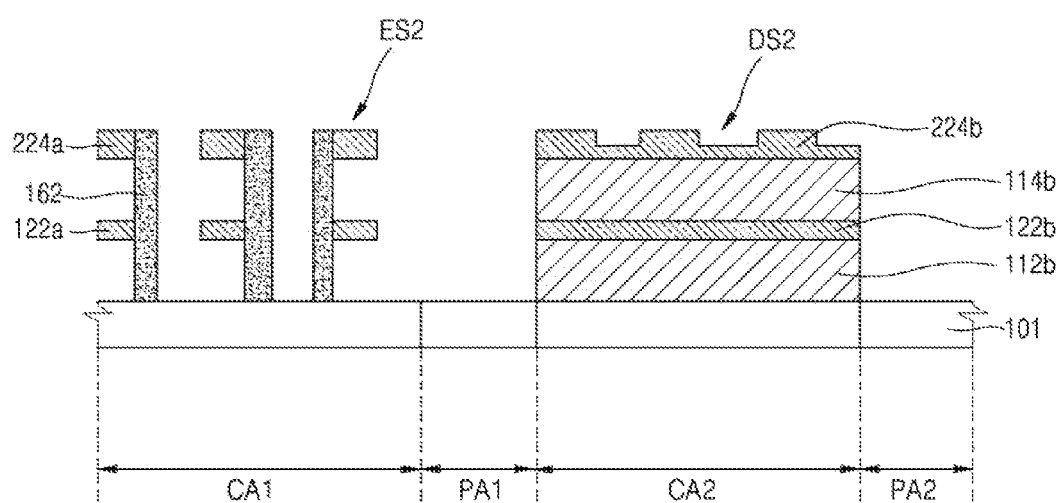

FIGS. 31A through 31N are cross-sectional views illustrating a method of manufacturing a semiconductor device according to a process order, according to another exemplary embodiment of the inventive concept. In FIGS. 31A through 31N, like reference numerals as those in FIGS. 1A through 30B denote like elements, and description of the elements will be omitted for simplification of description.

Referring to FIG. 31A, a first mold layer 112, a first supporter layer 122, a second mold layer 114, and a second supporter layer 224 may be sequentially formed on the bottom structure 101 in the first and second cell areas CA1 and CA2 and the first and second peripheral areas PA1 and PA2. Next, a cell close mask layer 220CM may be formed on the second supporter layer 124 located in the first and second cell areas CA1 and CA2. The second supporter layer 224 may have substantially the same or similar structure and material as the second supporter layer 224 described above with reference to FIGS. 3A and 3B.

The cell close mask layer 220CM may include a material having a different etching selectivity with respect to the second supporter layer 224. For example, when the second supporter layer 224 includes silicon nitride, the cell close mask layer 220CM may include at least one of silicon oxide, silicon oxynitride, a metal layer, a photoresist, a SOG, and a SOH.

Referring to FIG. 31B, a second supporter layer 224y may be formed by removing the second supporter layer 224 (see FIG. 31A) located in the first and second peripheral areas PA1 and PA2. The second supporter layer 224y may be formed by using an anisotropic etching process in which the cell close mask layer 220CM is used as an etching mask.

Referring to FIG. 31C, the cell close mask layer 220CM (see FIG. 31B) is removed, and a third mold layer 116 covering the second supporter layer 224y located in the first and second cell areas CA1 and CA2 and the second mold layer 114 located in the first and second peripheral areas PA1 and PA2 may be formed.

The third mold layer 116 may be formed of a material having a different etching selectivity with respect to the second supporter layer 224y. For example, when the second supporter layer 224y includes silicon nitride, the third mold layer 116 may include silicon oxide. In some exemplary embodiments, the third mold layer 116 may be formed of the same material as the second mold layer 114, but is not limited thereto.

In some exemplary embodiments, the third mold layer 116 may be formed using, for example, a PVD process, a CVD process, an ALD process, or a spin coating process.

Referring to FIG. 31D, a planarization process, such as a CMP process, may be performed on the third mold layer 116 until a top surface of the second supporter layer 224y is exposed, thereby forming a third mold layer 116x located in the first and second peripheral areas PA1 and PA2.

Referring to FIG. 31E, a first mask layer 132 covering the second supporter layer 224y located in the first and second cell areas CA1 and CA2 and the third mold layer 116x located in the first and second peripheral areas PA1 and PA2 may be formed, and the second hole pattern mask layer 134M and the first bottom material layer 142R may be sequentially formed on the first mask layer 132.

The first mask layer 132, the second hole pattern mask layer 134M, and the first bottom material layer 142R may be formed in a similar manner as the operations described with reference to FIGS. 3A through 15B, and description of operations of forming the first mask layer 132, the second hole pattern mask layer 134M, and the first bottom material layer 142R will be omitted.

Referring to FIG. 31F, the first hole pattern mask layer 132M may be formed by etching the first mask layer 132 (see FIG. 31E) by using the second hole pattern mask layer 134M (see FIG. 31E) as an etching mask. After forming the first hole pattern mask layer 132M, the first and second supporter layers 122 and 224y (see FIG. 31E) and the first and second mold layers 112 and 114 (see FIG. 31E) may be etched by using the first hole pattern mask layer 132M and a portion of the second hole pattern mask layer 134M (see FIG. 31 E) that may remain as an etching mask so as to form the first and second supporter layers 122x and 224x and the first and second mold layers 112x and 114x having a hole pattern 162H in the first cell area CA1.

The hole pattern 162H may be formed at a position corresponding to the contact area (not shown) included in the bottom structure 101.

Referring to FIG. 31G, an etch back process or the like may be performed to remove the first hole pattern mask layer 132M (see FIG. 31F).

Referring to FIG. 31H, a plurality of bottom electrodes 162 filling the hole pattern 162H may be formed, and the second supporter layer 224x, and a carbon containing layer 292 and a rework layer 294 sequentially covering top surfaces of the second supporter layer 224x, the bottom electrodes 162, and the third mold layer 116x may be formed in the first and second cell areas CA1 and CA2 and the first and second peripheral areas PA1 and PA2. In some exemplary embodiments, the carbon containing layer 292 may be, for example, an ACL, and the rework layer 294 may be, for example, a silicon oxynitride layer.

Referring to FIG. 31I, an etching stopper layer 296 covering the rework layer 294 located in the second cell area CA2 and the second peripheral area PA2 may be formed. The etching stopper layer 296 may be formed of a material having a different etching selectivity with respect to the carbon containing layer 292 and the rework layer 294. For example, the etching stopper layer 296 may include at least one of silicon oxide, silicon nitride, a metal layer, a photoresist, a SOG, and a SOH.

Referring to FIG. 31J, a supporter mask pattern 298 may be formed on the rework layer 294 located in the first cell area CA1 and the etching stopper layer 296 located in the second cell area CA2.

The supporter mask pattern 298 may include a first supporter mask pattern 294a located in the first cell area CA1 and a second supporter mask pattern 298b located in the second cell area CA2.

Referring to FIG. 31K, the rework layer 294 (see FIG. 31J), the carbon containing layer 292 (see FIG. 31J), and the second supporter layer 224x (see FIG. 31J) may be etched by using the etching stopper layer 296 (see FIG. 31J) and the supporter mask pattern 298 (see FIG. 31J) as an etching mask.

According to the etching process described above, a second supporter 124a and a third supporter mask pattern 292ax located in the first cell area CA1 and a second supporter film 224bx and a fourth supporter mask patter 292bx located in the second cell area CA2 may be formed.

According to the etching process described above, the rework layer 294 (see FIG. 31J) and the carbon containing layer 292 (see FIG. 31J) located in the first and second peripheral areas PA1 and PA2 may be removed.

In the first and second peripheral areas PA1 and PA2, at least a portion of the third mold layer 116x may remain, as illustrated in FIG. 31K, but is not limited thereto. That is, the third mold layer 116x may also be completely removed in the etching process described above.

According to the etching process described above, while the second supporter 224a located in the first cell area CA1 includes a plurality of supporter openings SG2 exposing a top surface of the second mold layer 114x, the second supporter film 224bx located in the second cell area CA2 may cover the entire second cell area CA2 without an opening exposing the top surface of the second mold layer 114x. However, as a result of the etching process, the second supporter film 224bx may have a top surface 224bxT having a concave-convex shape as illustrated in FIG. 31K. That is, the top surface 224bxT of the second supporter film 224bx may have a recess portion 224Rx.

Referring to FIG. 31L, the first supporter layer 122x may be exposed by removing the second mold layer 114x (see FIG. 31K) located in the first cell area CA1 and the first and second peripheral areas PA1 and PA2. The removing operation of the second mold layer 114x (see FIG. 31K) located in the first cell area CA1 and the first and second peripheral areas PA1 and PA2 may be performed by using, for example, a lift-off process using a LAL, a wet etching process, or an ashing and strip process.

Meanwhile, during the removing operation of the second mold layer 114x (see FIG. 31K) located in the first cell area CA1 and the first and second peripheral areas PA1 and PA2, the second mold film 114b located in the second cell area CA2 is covered by the second supporter film 224bx and, thus, is not removed.

Referring to FIG. 31M, the first supporter layer 122x (see FIG. 31L) is etched by using the third supporter mask pattern 292ax and the fourth supporter mask pattern 292bx as an etching mask, thereby forming the first supporter 122a located in the first cell area CA1 and the first supporter film 122b located in the second cell area CA2.

According to the etching process above, a recess portion 224R formed in the top surface 224bT of the second supporter film 224b may be at a deeper depth than the recess portion 224Rx illustrated in FIG. 31L. However, the second supporter film 224b may still cover the entire second cell area CA2 without an opening that exposes the top surface of the second mold layer 114x.

Referring to FIG. 31N, by removing the third and fourth supporter mask patterns 292ax and 292bx (see FIG. 31M) and the first mold layer 112x (see FIG. 31M) located in the first cell area CA1 and the first and second peripheral areas PA1 and PA2, a bottom electrode structure ES2 located in the first cell area CA1 and a dummy structure DS2 located in the second cell area CA2 may be formed.

The third and fourth supporter mask patterns 292ax and 292bx (see FIG. 31M) and the first mold layer 112x located in the first cell area CA1 and the first and second peripheral areas PA1 and PA2 (see FIG. 31M) may be removed by using, for example, a lift-off process using a LAL, a wet etching process, or an ashing and strip process.

In some exemplary embodiments, the third and fourth supporter mask patterns 292ax and 292bx (see FIG. 31M) and the first mold layer 112x located in the first cell area CA1 and the first and second peripheral areas PA1 and PA2 (see FIG. 31M) may be removed simultaneously, but are not limited thereto.

The bottom electrode structure ES2 and the dummy structure DS2 may have substantially the same structure as the bottom electrode structure ES1 and the dummy structure DS1, respectively, described with reference to FIGS. 26A and 26B.

After forming the bottom electrode structure ES2 and the dummy structure DS2 as described above with reference to FIGS. 27A through 30B, the dielectric layers 164a and 164b (see FIG. 30B) and the top electrodes 166a and 166b (see FIG. 30B), and the interlayer insulation layer 170 (see FIG. 30B) may be formed, and repeated description thereof will be omitted.

FIGS. 32A through 32L are cross-sectional views illustrating a method of manufacturing a semiconductor device according to a process order, according to another exemplary embodiment of the inventive concept. In FIGS. 32A through 32L, like reference numerals as those in FIGS. 1A through 31N denote like elements, and description of the elements will be omitted for simplification of description.

Figure 32A:
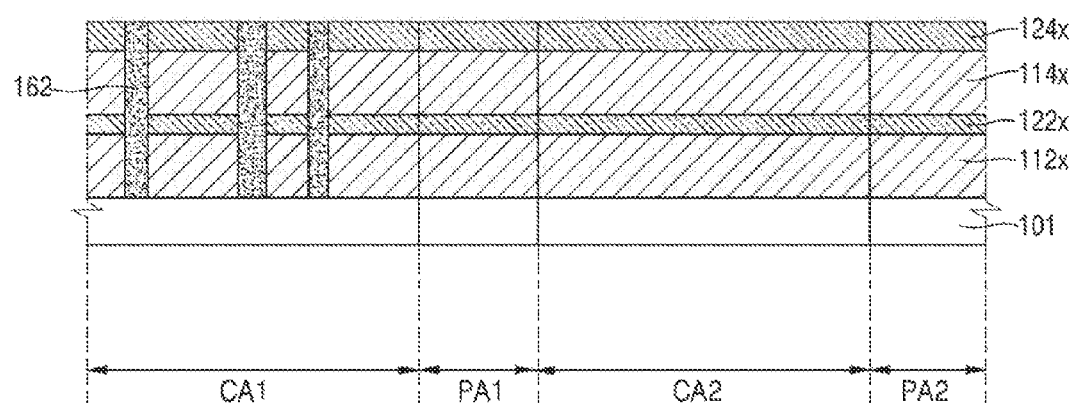
FIGS. 32A through 32L are cross-sectional views illustrating a method of manufacturing a semiconductor device according to a process order, according to another exemplary embodiment of the inventive concept.

Referring to FIG. 32A, the first mold layer 112x, the first supporter layer 122x, the second mold layer 114x, and the second supporter layer 124x that are sequentially stacked on the bottom structure 101 in the first and second cell areas CA1 and CA2 may be formed, and the plurality of bottom electrodes 162 passing through the first mold layer 112x, the first supporter layer 122x, the second mold layer 114x, and the second supporter layer 124x in the first cell area CA1 may be formed.

The operations of forming the first mold layer 112x, the first supporter layer 122x, the second mold layer 114x, the second supporter layer 124x, and the plurality of bottom electrodes 162 are described with reference to FIGS. 3A through 18B, and, thus, repeated description thereof will be omitted.

Figure 32B:
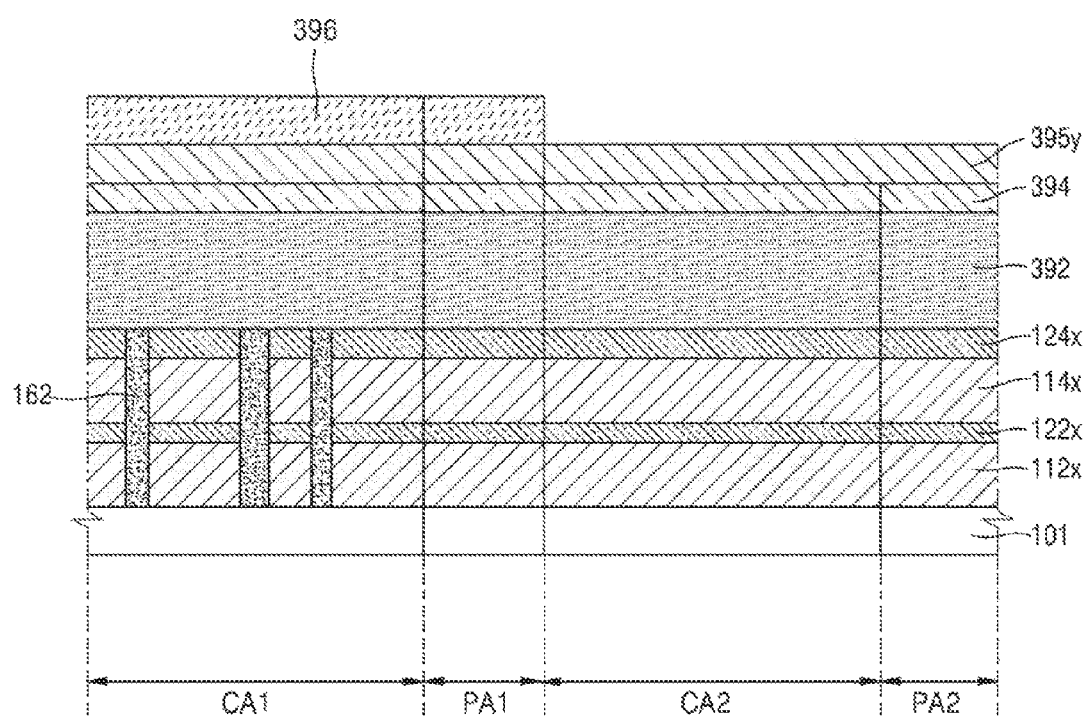

Referring to FIG. 32B, a carbon containing layer 392, a rework layer 394, and a supporter mask layer 395y that sequentially cover top surfaces of the second supporter layer 124x and the bottom electrodes 162 in the first and second cell areas CA1 and CA2 and the first and second peripheral areas PA1 and PA2 may be formed, and a blank mask layer 396 covering the supporter mask layer 395y located in the first cell area CA1 and the first peripheral area PA1 may be formed.

In some exemplary embodiments, the carbon containing layer 392 may be, for example, an ACL, and the rework layer 394 may be, for example, a silicon oxynitride layer.

The supporter mask layer 395y may be formed of a material having a different etching selectivity with respect to the carbon containing layer 392 and the rework layer 394. The supporter mask layer 395y may include, for example, a silicon oxide.

The blank mask layer 396 may be formed of a material having a different etching selectivity with respect to the supporter mask layer 395y. The blank mask layer 396 may include, for example, at least one of silicon nitride, silicon oxynitride, a metal layer, a photoresist, a SOG, and a SOH.

In some exemplary embodiments, the carbon containing layer 392, the rework layer 394, and the blank mask layer 396 may be each formed using a PVD process, a CVD process, an ALD process, or a spin coating process.

Figure 32C:
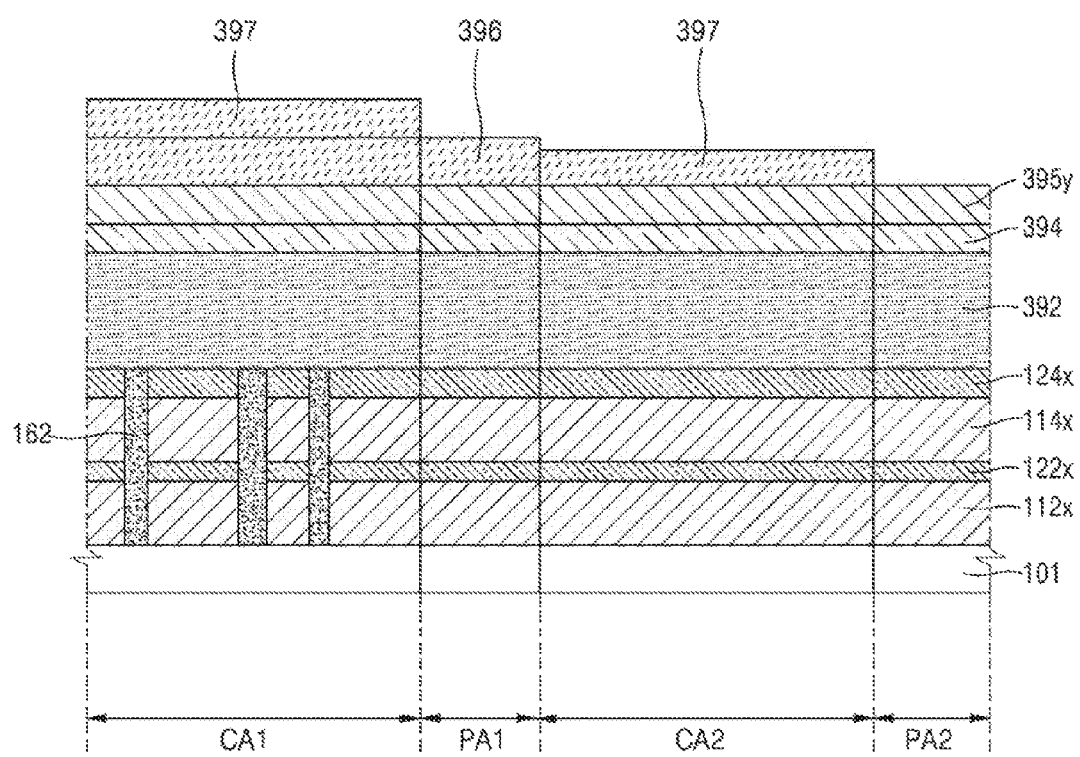

Referring to FIG. 32C, a cell close mask layer 297 covering the blank mask layer 396 located in the first cell area CA1 and the supporter mask layer 395y located in the second cell area CA2 may be formed. The cell close mask layer 297 may be formed of a material having a different etching selectivity with respect to the supporter mask layer 395y. The cell close mask layer 297 may include, for example, at least one of silicon nitride, silicon oxynitride, a metal layer, a photoresist, a SOG, and a SOH.

In some exemplary embodiments, the cell close mask layer 297 may be formed of the same material as the blank mask layer 396, but is not limited thereto.

Figure 32D:
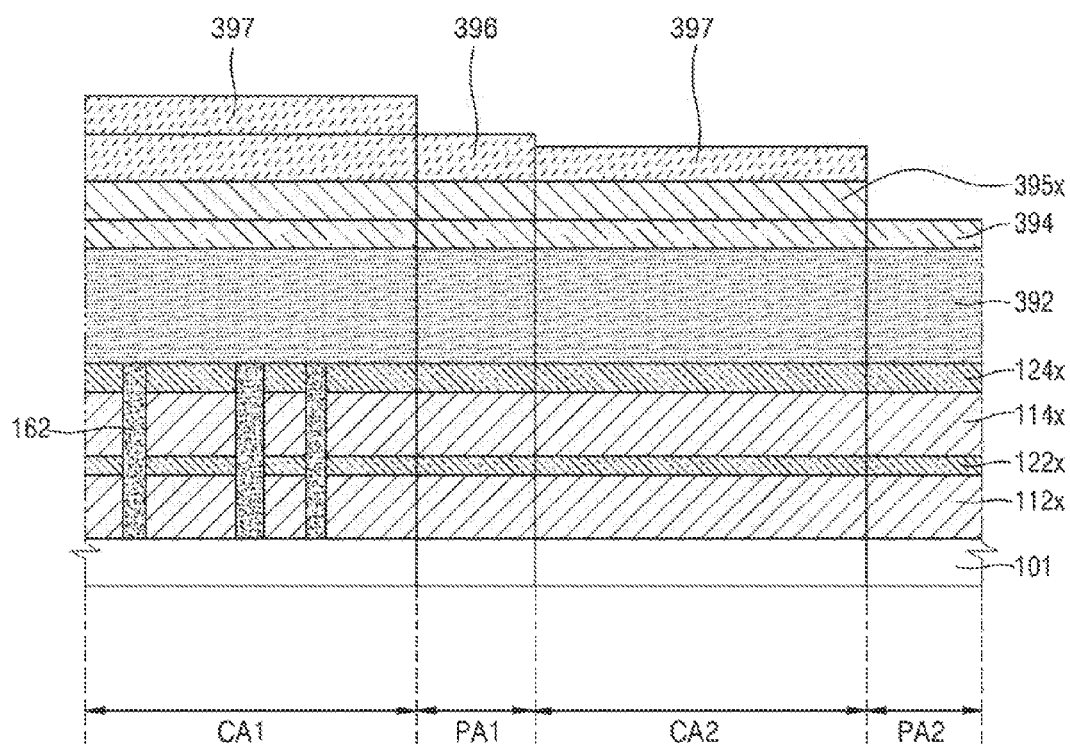

Referring to FIG. 32D, by anisotropically etching the supporter mask layer 395y (see FIG. 32C) using the blank mask layer 396 and the cell close mask layer 297 as an etching mask, a preliminary supporter mask pattern 395x not including the supporter mask layer 395y (see FIG. 32C) located in the second peripheral area PA2 may be formed.

Figure 32E:
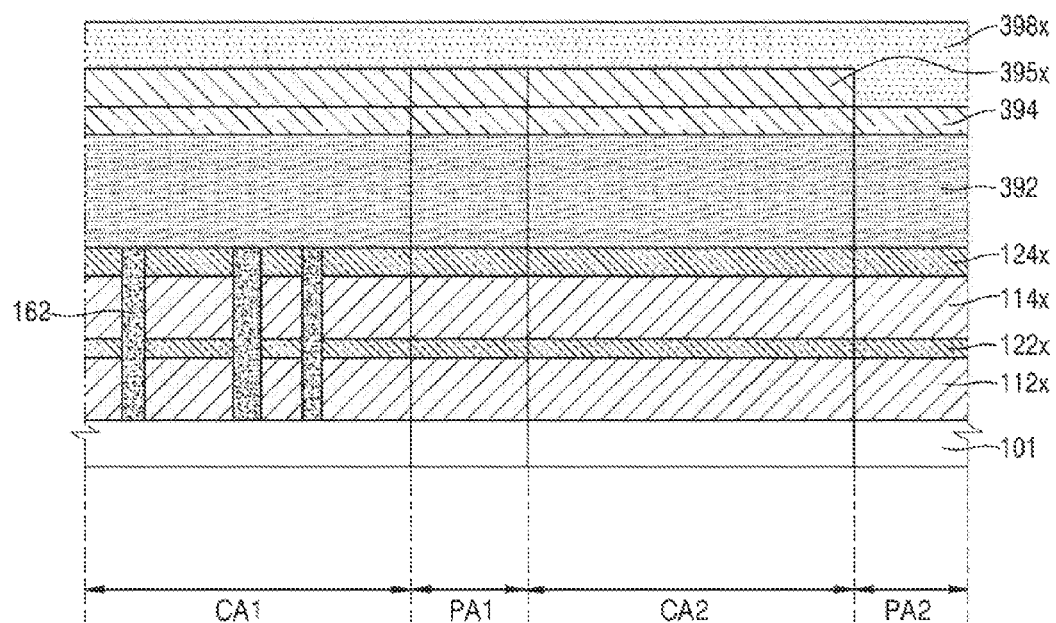

Referring to FIG. 32E, the blank mask layer 396 (see FIG. 32D) and the cell close mask layer 297 (see FIG. 32D) may be removed, and a negative tone development (NTD) resist 398x covering the preliminary supporter mask pattern 395x located in the cell area CA1, the first peripheral area PA1, and the second cell area CA2 and the rework layer 394 located in the second peripheral area PA2 may be formed.

Figure 32F:
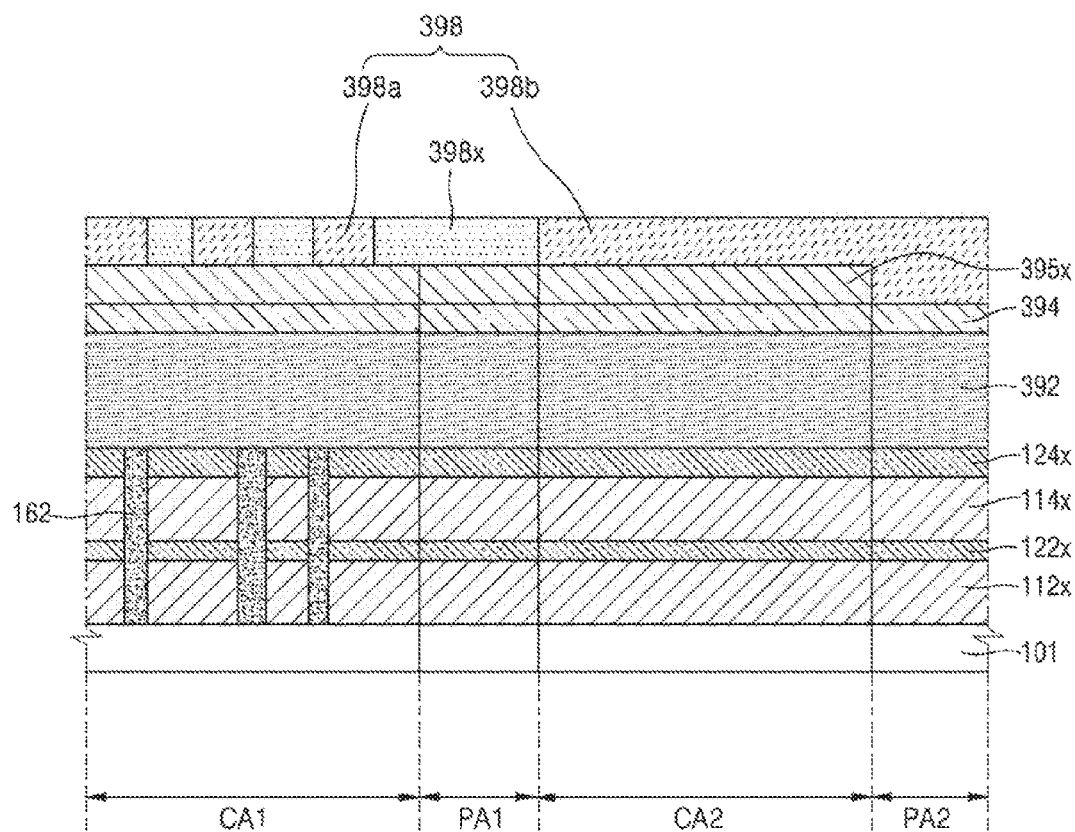

Referring to FIG. 32F, an exposure operation may be performed on the NTD resist 398x.

The exposure operation may include a first exposure operation in which a portion of the NTD resist 398x of the first cell area CA1, that is, an area where a first top mask pattern 398a is to be formed is exposed, and a second exposure operation in which the entire NTD resist 398x of the second cell area CA2 and the second peripheral area PA2, that is, an area where a second top mask pattern 398b is to be formed is exposed.

In some exemplary embodiments, the first exposure operation may also be performed on the NTD resist 398x of the second cell area CA2. However, in this case, also, the second top mask pattern 398b covering the second cell area CA2 and the second peripheral area PA2 without an opening may be formed by performing the second exposure operation in the second cell area CA2 after the first exposure operation.

Figure 32G:
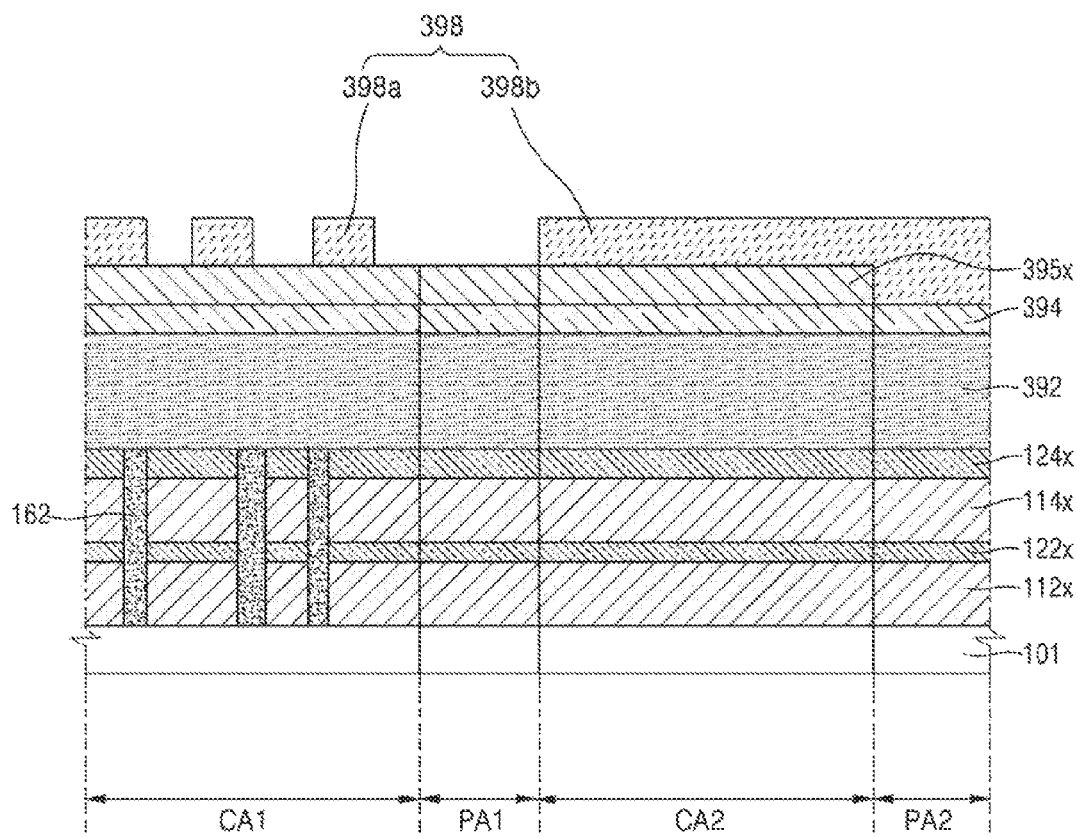

Referring to FIG. 32G, a top mask pattern 398 may be formed by developing the NTD resist 398x after the exposure operation is performed.

Figure 32H:
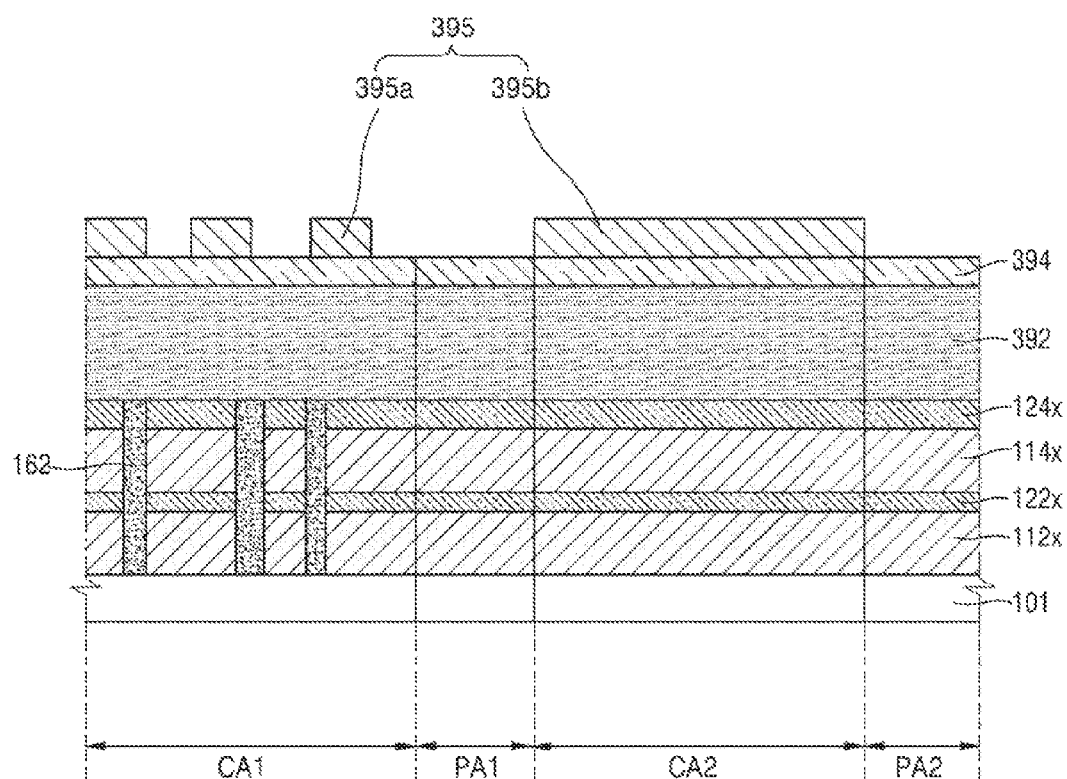

Referring to FIG. 32H, a supporter mask pattern 395 may be formed by etching the preliminary supporter mask pattern 395x (see FIG. 32G) by using the top mask pattern 398 (see FIG. 32G) as an etching mask. After forming the supporter mask pattern 395, the top mask pattern 398 (see FIG. 32G) may be removed by an ashing and strip process or the like.

The supporter mask pattern 395 may include a first supporter mask pattern 395a located in the first cell area CA1 and a second supporter mask pattern 395b located in the second cell area CA2.

Figure 32I:
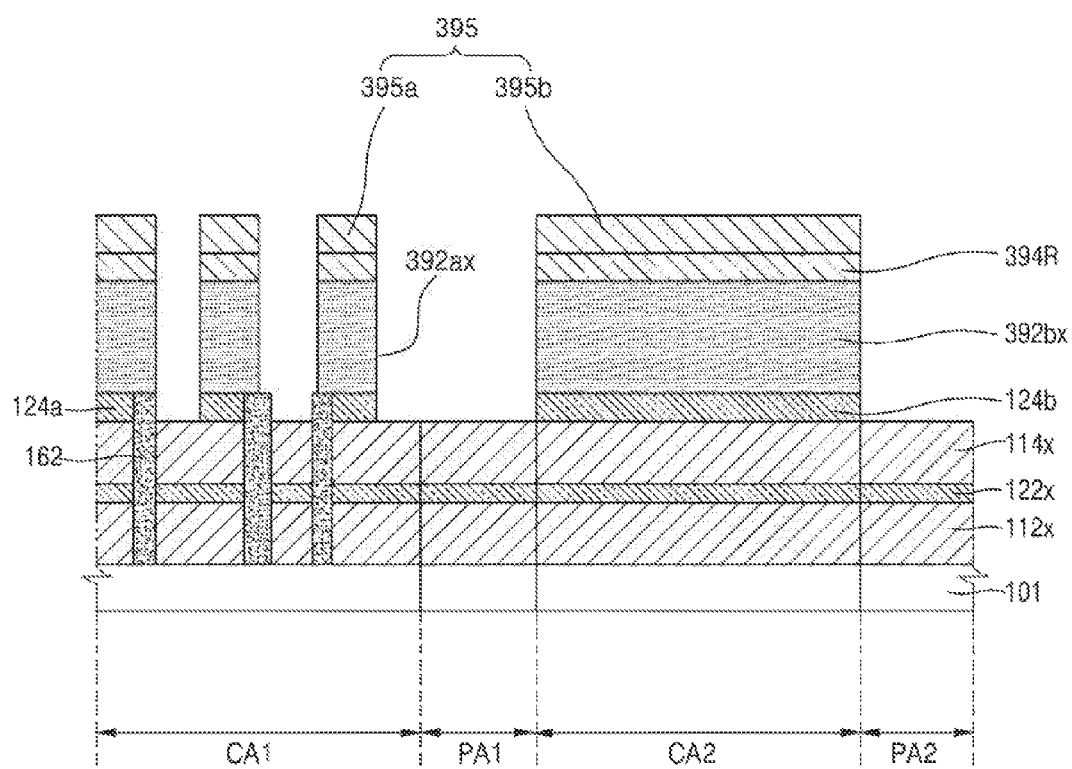

Referring to FIG. 32I, by using the supporter mask pattern 395 as an etching mask, the rework layer 394 (see FIG. 32H), the carbon containing layer 392 (see FIG. 32H), and the second supporter layer 124x (see FIG. 32H) may be etched.

According to the etching process described above, the second supporter 124a and the third supporter mask pattern 392ax located in the first cell area CA1 and the second supporter film 124b and the fourth supporter mask pattern 392bx located in the second cell area CA2 may be formed. A rework layer 394R may remain on the third supporter mask pattern 392ax and the fourth supporter mask pattern 392bx after the etching process.

According to the etching process described above, the rework layer 394 (see FIG. 32H), the carbon containing layer 392 (see FIG. 32H), and the second supporter layer 124x (see FIG. 32H) located in the first and second peripheral areas PA1 and PA2 may be removed.

Figure 32J:
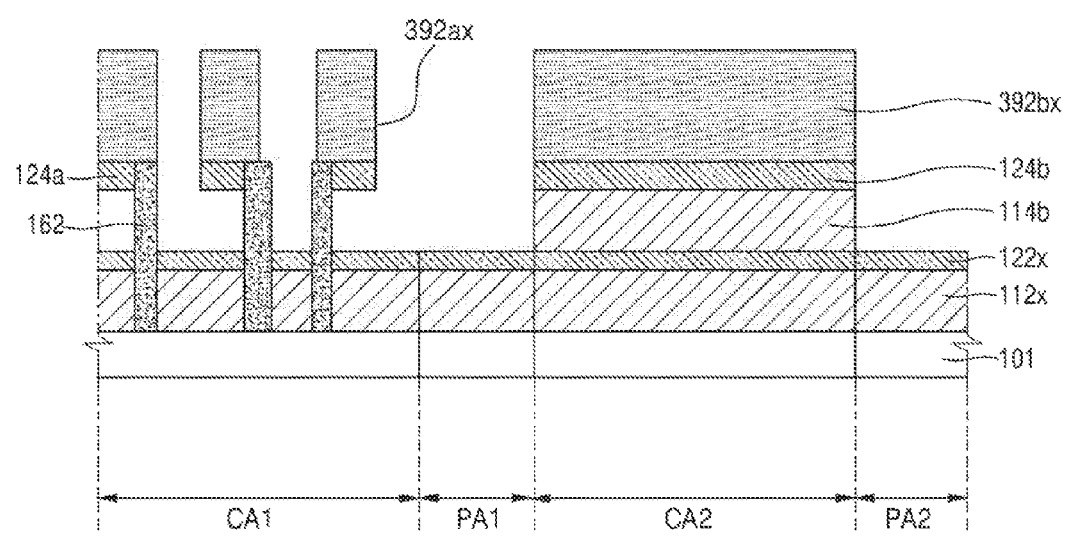

Referring to FIG. 32J, the second mold layer 114x (see FIG. 32I) located in the first cell area CA1 and the first and second peripheral areas PA1 and PA2 may be removed to expose the first supporter layer 122x. The second mold layer 114x located in the first cell area CA1 and the first and second peripheral areas PA1 and PA2 (see FIG. 32I) may be removed by using a list-off process using a LAL, a wet drying process or an ashing and strip process or the like.

In some exemplary embodiments, during the removing operation of the second mold layer 114x (see FIG. 32I) located in the first cell area CA1 and the first and second peripheral areas PA1 and PA2, the supporter mask pattern 395 (see FIG. 32I) and/or the rework layer 394R (see FIG. 32I) may also be removed.

Meanwhile, during the removing operation of the second mold layer 114x located in the first cell area CA1 and the first and second peripheral areas PA1 and PA2 (see FIG. 32I), the second mold film 114b located in the second cell area CA2 is covered by the second supporter film 124b and is, therefore, not removed.

Figure 32K:
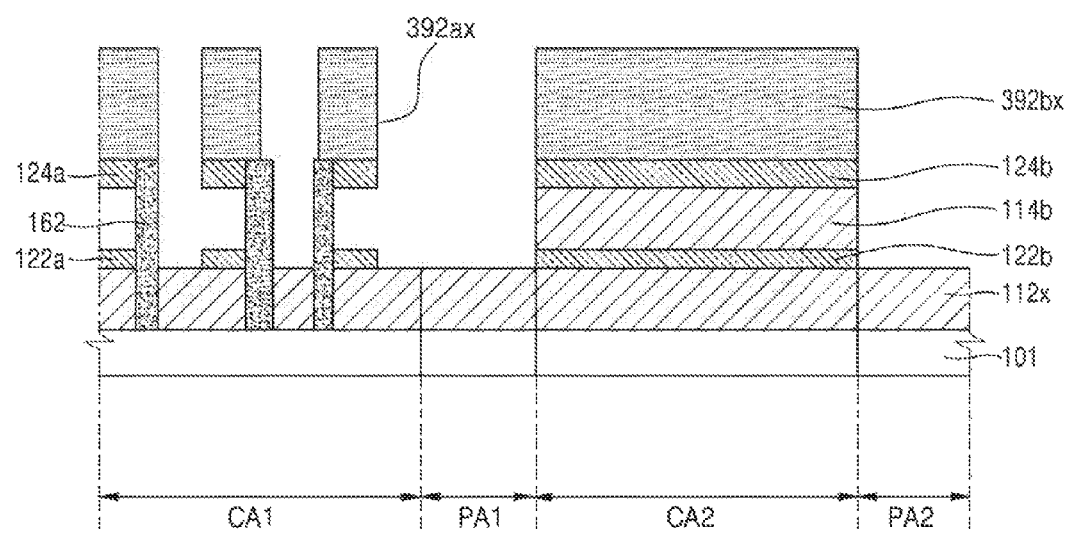

Referring to FIG. 32K, a first supporter 122a located in the first cell area CA1 and a first supporter film 122b located in the second cell area CA2 may be formed by etching the first supporter layer 122x (see FIG. 32J) by using the third supporter mask pattern 392ax and the fourth supporter mask pattern 392bx as an etching mask.

Figure 32L:
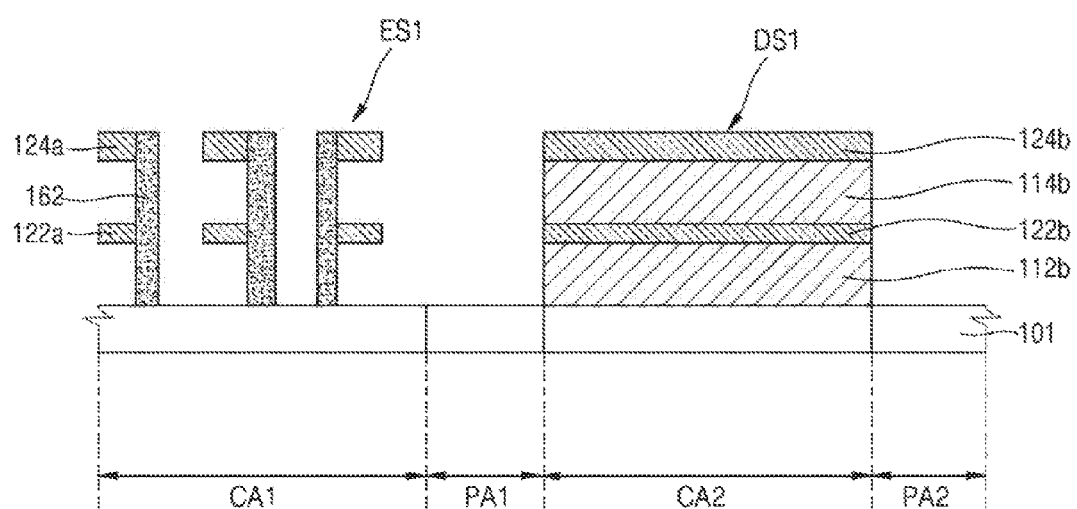

Referring to FIG. 32L, by removing the third and fourth supporter mask patterns 392ax and 392bx (see FIG. 32K) and the second mold layer 114x located in the first cell area CA1 and the first and second peripheral areas PA1 and PA2 (see FIG. 32K), a bottom electrode structure ES1 located in the first cell area CA1 and a dummy structure DS1 located in the second cell area CA2 may be formed.

After forming the bottom electrode structure ES1 and the dummy structure DS1, the dielectric layers 164a and 164b (see FIG. 30B) and the top electrodes 166a and 166b (see FIG. 30B) and the interlayer insulation layer 170 (see FIG. 30B) may be formed as described above with reference to FIGS. 27A through 30B, and repeated description thereof will be omitted.

FIGS. 33A through 33d are cross-sectional views illustrating a method of manufacturing a semiconductor device according to a process order, according to another exemplary embodiment of the inventive concept. In FIGS. 33A through 33D, like reference numerals as those in FIGS. 1A through 32L denote like elements, and description of the elements will be omitted for simplification of description.

Figure 33A:
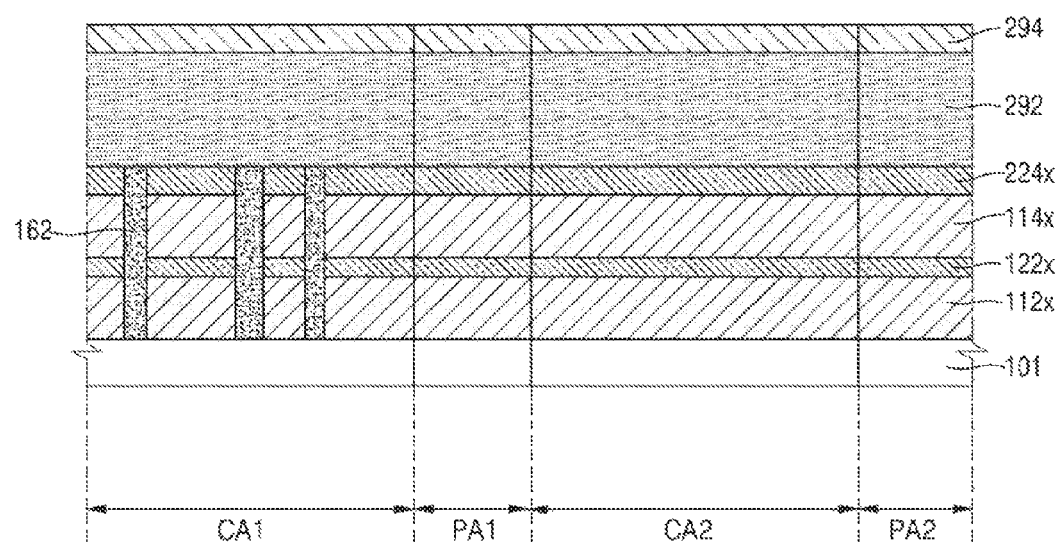
FIGS. 33A through 33D are cross-sectional views illustrating a method of manufacturing a semiconductor device according to a process order, according to another exemplary embodiment of the inventive concept.

Referring to FIG. 33A, the first mold layer 112x, the first supporter layer 122x, the second mold layer 114x, and the second supporter layer 224x that are sequentially stacked on the bottom structure 101 in the first and second cell areas CA1 and CA2 and the first and second peripheral areas PA1 and PA2 may be formed, and a plurality of bottom electrodes 162 passing through the first mold layer 112x, the first supporter layer 122x, the second mold layer 114x, and the second supporter layer 224x in the first cell area CA1 may be formed. The operations of forming the first mold layer 112x, the first supporter layer 122x, the second mold layer 114x, the second supporter layer 224x, and the plurality of bottom electrodes 162 are described with reference to FIGS. 3A through 18B, and, thus, repeated description thereof will be omitted.

Next, a carbon containing layer 292 and a rework layer 294 sequentially covering top surfaces of the second supporter layer 224x and the bottom electrodes 162 in the first and second cell areas CA1 and CA2 and the first and second peripheral areas PA1 and PA2 may be formed.

In some exemplary embodiments, the carbon containing layer 292 may be, for example, an ACL, and the rework layer 294 may be, for example, a silicon oxynitride layer.

Figure 33B:
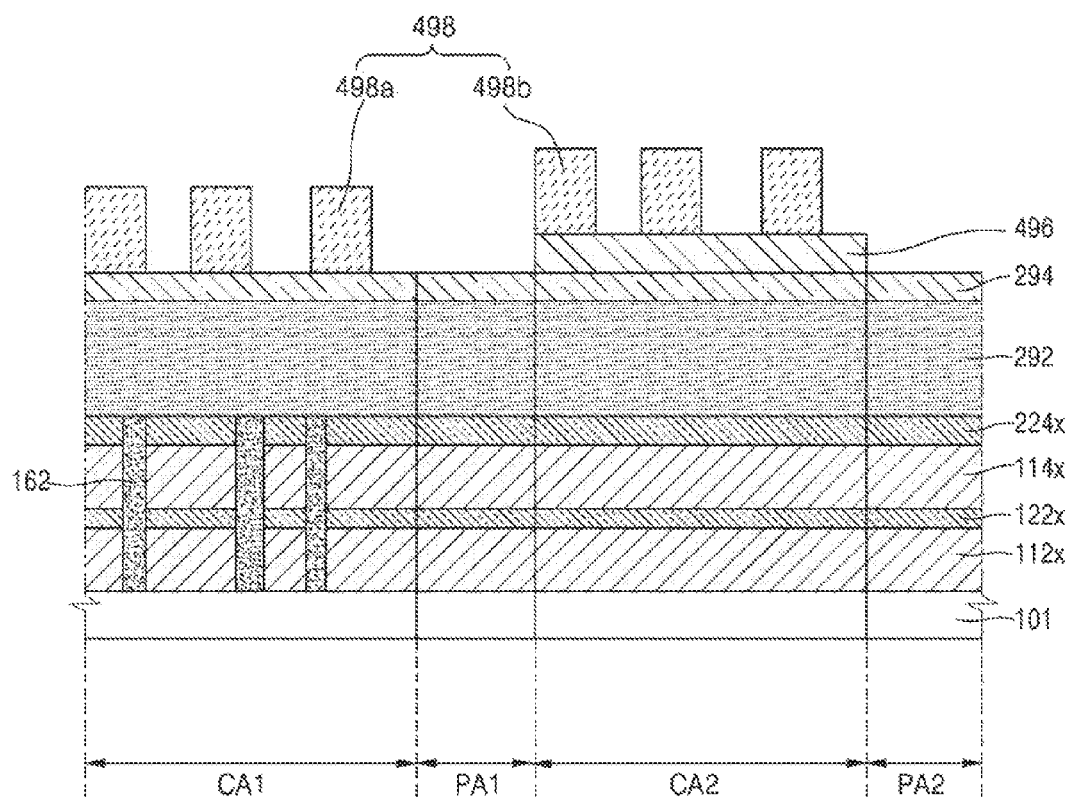

Referring to FIG. 33B, an etching stopper layer 496 covering the rework layer 294 located in the second cell area CA2 may be formed. The etching stopper layer 496 may be formed of a material having a different etching selectivity with respect to the carbon containing layer 292 and the rework layer 294. The etching stopper layer 496 may include at least one of, for example, silicon oxide, silicon nitride, a metal layer, a photoresist, a SOG, and a SOH.

After forming the etching stopper layer 496, a supporter mask pattern 498 may be formed on the rework layer 294 located in the first cell area CA1 and the etching stopper layer 496 located in the second cell area CA2.

The supporter mask pattern 498 may include a first supporter mask pattern 498a located in the first cell area CA1 and a second supporter mask pattern 498b located in the second cell area CA2.

The supporter mask pattern 498 may be formed of a material having a different etching selectivity with respect to the carbon containing layer 292 and the rework layer 294.

Figure 33C:
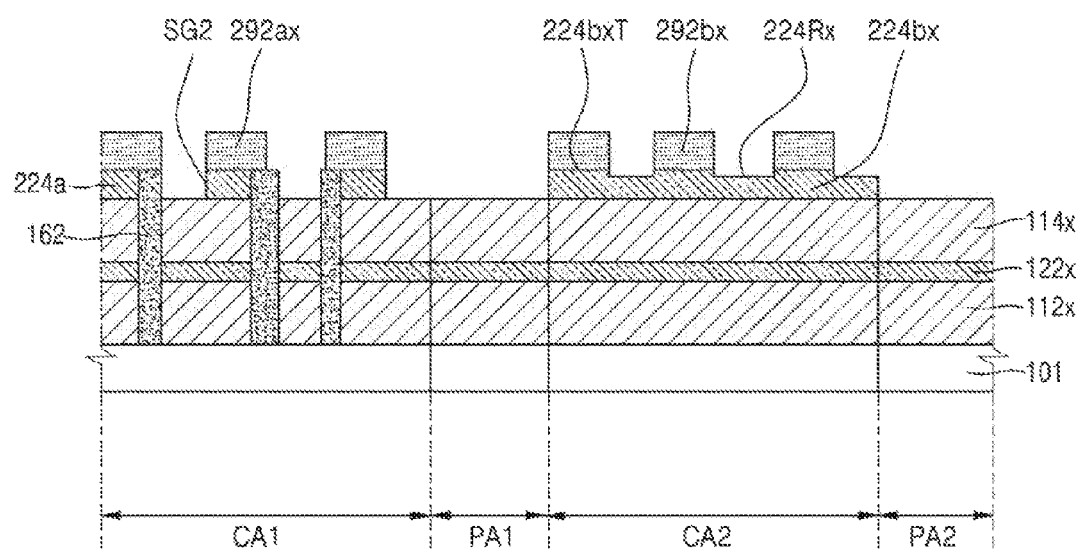

Referring to FIG. 33C, the rework layer 294 (see FIG. 33B), the carbon containing layer 292 (see FIG. 33B), and the second supporter layer 224x (see FIG. 33B) may be etched by using the etching stopper layer 496 (see FIG. 33B) and the supporter mask pattern 498 (see FIG. 33B).

According to the etching process described above, a second supporter 224a and a third supporter mask pattern 292ax located in the first cell area CA1 and a second supporter film 224bx and a fourth supporter mask pattern 292bx located in the second cell area CA2 may be formed.

According to the etching process, the rework layer 294 (see FIG. 31J), the carbon containing layer 292 (see FIG. 31J), and the second supporter layer 224x (see FIG. 31J) located in the first and second peripheral areas PA1 and PA2 may be removed.

According to the etching process described above, a structure that is substantially the same as the structure described with reference to FIG. 31K may be obtained, except that the third mold layer 116x (see FIG. 31K) is omitted.

That is, while the second supporter 224a located in the first cell area CA1 includes a plurality of supporter openings SG2 exposing the top surface of the second mold layer 114x, the second supporter film 224bx located in the second cell area CA2 may cover the entire second cell area CA2 without an opening exposing the top surface of the second mold layer 114x.

Figure 33D:
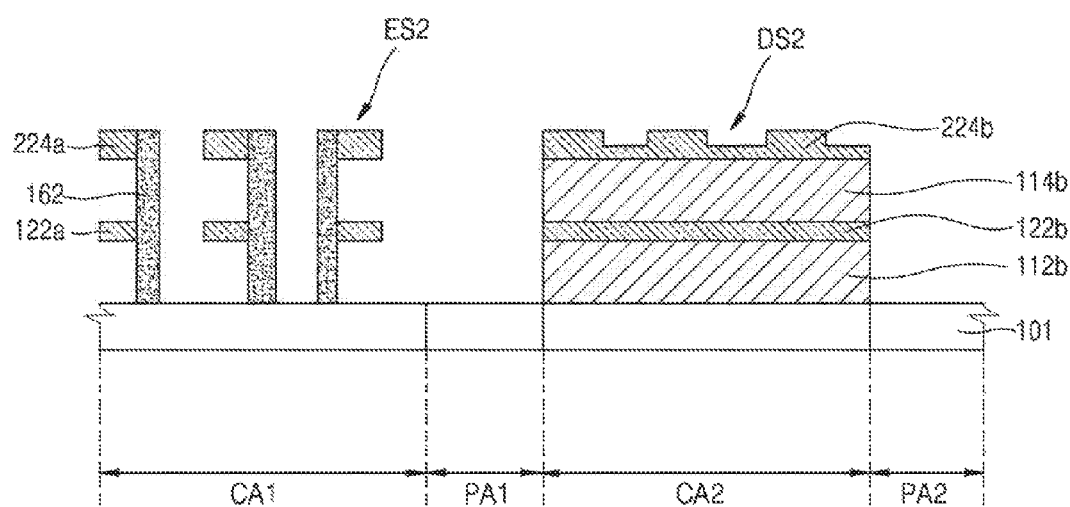

Referring to FIG. 33D, according to the operations described with reference to FIGS. 31L through 31N, a bottom electrode structure ES2 located in the first cell area CA1 and a dummy structure DS2 located in the second cell area CA2 may be formed.

After forming the bottom electrode structure ES2 and the dummy structure DS2, the dielectric layers 164a and 164b (see FIG. 30B) and the top electrodes 166a and 166b (see FIG. 30B), and the interlayer insulation layer 170 (see FIG. 30B) may be formed as described above with reference to FIGS. 27A through 30B, and repeated description thereof will be omitted.

While the inventive concept has been particularly shown and described with reference to exemplary embodiments thereof, it will be understood that various changes in form and details may be made therein without departing from the spirit and scope of the following claims.

What is claimed is:

1. A method of manufacturing a semiconductor device, comprising:
   preparing a wafer in which a chip area having a first cell area and a first peripheral area and an edge area having a second cell area and a second peripheral area are defined;
   forming a bottom electrode structure in the first cell area and a dummy structure in the second cell area; and
   sequentially forming a dielectric layer and a top electrode on the bottom electrode structure and the dummy structure,
   wherein the bottom electrode structure comprises a plurality of bottom electrodes extending in a first direction perpendicular to a top surface of the wafer in the first cell area of the wafer and first and second supporters extending in parallel with the top surface of the wafer to support the plurality of bottom electrodes,
   wherein the dummy structure comprises a first mold film, a first supporter film, a second mold film, and a second supporter film that are sequentially formed to cover the second cell area of the wafer, and
   the second supporter and the second supporter film are at a same level relative to the wafer.

2. The method of claim 1, wherein a length of the bottom electrode structure in the first direction is approximately the same as a length of the dummy structure in the first direction.

3. The method of claim 1, wherein the forming of the bottom electrode structure and the dummy structure comprises:
   sequentially forming a first mold layer, a first supporter layer, a second mold layer, and a second supporter layer on the chip area and the edge area;
   forming a hole pattern in the first cell area by etching the first mold layer, the first supporter layer, the second mold layer, and the second supporter layer; and
   forming a bottom electrode in the hole pattern.

4. The method of claim 3, wherein the forming of the hole pattern in the first cell area comprises:
   forming at least one mask layer on the second supporter layer in the chip area and the edge area;
   forming a first preliminary pattern layer on the at least one mask layer in the chip area and the edge area;

forming a first line pattern extending in a second direction in parallel with the top surface of the wafer by patterning the first preliminary pattern layer in the first and second cell areas;

forming a second preliminary pattern layer on the first line pattern in the chip area and the edge area;

forming an etching stopper layer covering the first peripheral area, the second cell area, and the second peripheral area;

forming a second line pattern extending in a third direction crossing the second direction by patterning the second preliminary pattern layer in the first cell area; and forming a hole pattern mask layer by etching the at least one mask layer in the first cell area by using the first and second line patterns in the first cell area and the etching stopper layer in the first peripheral area, the second cell area, and the second peripheral area as an etching mask.

5. The method of claim 4, wherein the second supporter in the first cell area and the second supporter film in the second cell area are formed by etching the second supporter layer using the hole pattern mask layer as an etching mask.

6. The method of claim 4, wherein the etching stopper layer comprises a first etching stopper layer covering the first peripheral area and a second etching stopper layer covering the second cell area and the second peripheral area.

7. A method of manufacturing a semiconductor device, comprising:
preparing a wafer in which a chip area having a first cell area and a first peripheral area and an edge area having a second cell area and a second peripheral area are defined;

sequentially forming a first mold layer, a first supporter layer, a second mold layer, and a second supporter layer on the chip area and the edge area;

forming a plurality of bottom electrodes passing through the first mold layer, the first supporter layer, the second mold layer, and the second supporter layer in the first cell area;

forming a second supporter in the first cell area and a second supporter film in the second cell area by patterning the second supporter layer;

removing the second mold layer from the first cell area, the first peripheral area, and the second peripheral area;

forming a first supporter in the first cell area and a first supporter film in the second cell area by patterning the first supporter layer; and removing the first mold layer from the first cell area, the first peripheral area, and the second peripheral area.

8. The method of claim 7, further comprising, between the forming of the plurality of bottom electrodes and the forming of the second supporter and the second supporter film:

exposing the second mold layer by removing the second supporter layer from the first and second peripheral areas;

forming a third mold layer covering the second mold layer in the first and second peripheral areas;

forming a carbon-containing layer and a rework layer sequentially on the second supporter layer in the first and second cell areas and the third mold layer in the first and second peripheral areas;

forming an etching stopper layer covering the rework layer in the edge area; and forming a supporter mask pattern on the rework layer in the first cell area, wherein the forming of the second supporter is performed by etching the rework layer, the carbon-containing layer, and the second supporter layer by using the supporter mask pattern and the etching stopper layer as an etching mask.

9. The method of claim 8, wherein a top surface of the second supporter film relative to the wafer comprises a recess portion.

10. The method of claim 7, further comprising, after the forming of the plurality of bottom electrodes:

forming a first carbon-containing layer and a first rework layer sequentially on the second supporter layer in the chip area and a second carbon-containing layer and a second rework layer sequentially on the second supporter layer in the edge area; and forming a supporter mask pattern on the first rework layer in the first cell area and the second rework layer in the second cell area, wherein a top surface of the first carbon-containing layer is at a higher level than a top surface of the second carbon-containing layer relative to the wafer, and the forming of the second supporter and the second supporter film is performed by etching the second supporter layer by using the supporter mask pattern as an etching mask.

11. The method of claim 10, wherein the forming of the first carbon-containing layer and the second carbon-containing layer comprises:

forming a carbon-containing layer on the second supporter layer in the chip area and the edge area; and removing a portion of an upper portion of the carbon-containing layer from the edge area.

12. The method of claim 10, wherein the supporter mask pattern of the first cell area comprises a plurality of opening portions, and the supporter mask pattern of the second cell area covers the second cell area in its entirety without an opening.

13. The method of claim 12, wherein the forming of the supporter mask pattern comprises:

forming a supporter mask layer on the first rework layer of the chip area and the second rework layer of the edge area;

forming a blank mask layer covering the supporter mask layer in the chip area;

forming a cell close mask layer covering each of the blank mask layer of the first cell area and the supporter mask layer of the second cell area;

forming a preliminary supporter mask pattern by removing the supporter mask layer of the second peripheral area by using the blank mask layer and the cell close mask layer as an etching mask; and forming the supporter mask pattern by patterning the preliminary supporter mask pattern.

14. The method of claim 13, wherein the forming of the supporter mask pattern comprises:

forming a negative tone development (NTD) resist covering the preliminary supporter mask pattern and the second rework layer in the second peripheral area;

exposing a portion of the NTD resist of the first cell area;

exposing the entire NTD resist of the edge area;

forming an NTD mask pattern by developing the NTD resist; and forming the supporter mask pattern by etching the preliminary supporter mask pattern by using the NTD mask pattern as an etching mask.

15. The method of claim 10, further comprising, before the forming of the supporter mask pattern, forming an etching stopper layer covering the second rework layer in the second cell area.

16. A method of manufacturing a semiconductor device, comprising:

forming a first cell area, a second cell area, and a peripheral area in a wafer, the peripheral area separating the first cell area from the second cell area;

forming a bottom electrode structure in the first cell area comprising forming a bottom electrode and forming a first supporter extending from the bottom electrode towards the peripheral area; and forming a dummy structure in the second cell area comprising forming a first mold film and forming a first supporter film on the first mold film.

17. The method of claim 16, wherein forming the bottom electrode structure further comprises:

forming a second supporter extending from the bottom electrode towards the peripheral area; and wherein forming the dummy structure comprises:

forming a second mold film on the first supporter film; and forming a second supporter film on the second mold film.

18. The method of claim 17, further comprising:

forming a dielectric layer to cover the bottom electrode structure in its entirety and the second supporter film; and forming a top electrode on the dielectric layer in the first cell area.

19. The method of claim 18, wherein a height of the bottom electrode structure relative to the wafer and a height of the dummy structure relative to the wafer are about the same.

20. The method of claim 17, wherein forming the first supporter and forming the first supporter film comprises:

forming a first supporter layer in both the first cell area and the second cell area; and patterning the first supporter layer in the first cell area to form the first supporter;

wherein forming the second supporter and forming the second supporter film comprises:

forming a second supporter layer in both the first cell area and the second cell area; and patterning the second supporter layer in the first cell area to form the second supporter.

* * * * *